United States Patent
Chen et al.

(10) Patent No.: US 11,968,842 B2
(45) Date of Patent: Apr. 23, 2024

(54) SPIN-ORBIT TORQUE DEVICE, METHOD FOR FABRICATING A SPIN-ORBIT TORQUE DEVICE AND METHOD FOR SWITCHING A SWITCHABLE MAGNETIZATION OF A SPIN-ORBIT TORQUE DEVICE

(71) Applicant: National University of Singapore, Singapore (SG)

(72) Inventors: Jingsheng Chen, Singapore (SG); Liang Liu, Singapore (SG); Chenghang Zhou, Singapore (SG)

(73) Assignee: National University of Singapore, Singapore (SG)

( * ) Notice: Subject to any disclaimer, the term of this patent is extended or adjusted under 35 U.S.C. 154(b) by 212 days.

(21) Appl. No.: 17/397,302

(22) Filed: Aug. 9, 2021

(65) Prior Publication Data
US 2022/0052109 A1    Feb. 17, 2022

(30) Foreign Application Priority Data
Aug. 11, 2020    (SG) ............................ 10202007649X

(51) Int. Cl.
*H10B 61/00* (2023.01)
*H01F 10/32* (2006.01)
(Continued)

(52) U.S. Cl.
CPC ......... *H10B 61/00* (2023.02); *H01F 10/3254* (2013.01); *H01F 10/3286* (2013.01); *H01F 10/329* (2013.01); *H01F 41/302* (2013.01); *H10N 50/01* (2023.02); *H10N 50/10* (2023.02); *H10N 50/80* (2023.02); *H10N 50/85* (2023.02);
(Continued)

(58) Field of Classification Search
None
See application file for complete search history.

(56) References Cited

U.S. PATENT DOCUMENTS

| | | |
|---|---|---|
| 8,941,196 B2 | 1/2015 | Bedau et al. |
| 9,343,658 B2 | 5/2016 | Wang et al. |

(Continued)

FOREIGN PATENT DOCUMENTS

| | | |
|---|---|---|
| WO | 2019195747 A2 | 10/2019 |
| WO | 2021066743 A1 | 4/2021 |

OTHER PUBLICATIONS

Hajghassem et al. (J. Mag. Mag. Mat., 321, 2009, 2733-2736) (Year: 2009).*

(Continued)

*Primary Examiner* — Kevin M Bernatz
(74) *Attorney, Agent, or Firm* — Botos Churchill IP Law LLP

(57) ABSTRACT

A spin-orbit torque device is described. The spin-orbit torque device comprising an interfacing layer and a magnetic layer having a switchable magnetization direction. An interface is formed between the interfacing layer and the magnetic layer, the interface having a 3m1 crystallographic point group symmetry adapted to interact with an electric current to generate a spin torque for switching the magnetization direction of the magnetic layer. A method for fabricating the spin-orbit device and a method for switching the switchable magnetization of a spin-orbit torque device are also described.

16 Claims, 28 Drawing Sheets

(51) Int. Cl.
| | |
|---|---|
| H01F 41/30 | (2006.01) |
| H10N 50/01 | (2023.01) |
| H10N 50/10 | (2023.01) |
| H10N 50/80 | (2023.01) |
| H10N 50/85 | (2023.01) |
| H10N 52/00 | (2023.01) |
| H10N 52/01 | (2023.01) |

(52) U.S. Cl.
CPC ............. *H10N 52/00* (2023.02); *H10N 52/01* (2023.02); *H10N 52/101* (2023.02)

(56) References Cited

U.S. PATENT DOCUMENTS

| | | | |
|---|---|---|---|
| 9,608,039 | B1 | 3/2017 | Apalkov et al. |
| 2005/0189574 | A1* | 9/2005 | Nguyen .............. G11C 11/1675 257/295 |
| 2008/0075980 | A1* | 3/2008 | Ambrose ............ G11B 5/73911 |
| 2011/0140217 | A1* | 6/2011 | Nguyen .................. G11C 11/16 257/E29.323 |
| 2014/0063648 | A1* | 3/2014 | Shiroishi .............. G11B 5/3967 428/815 |
| 2017/0279038 | A1 | 9/2017 | Wu et al. |
| 2020/0098410 | A1* | 3/2020 | Gosavi ................ G11C 11/1675 |
| 2020/0118725 | A1 | 4/2020 | Kazemi et al. |
| 2020/0388752 | A1* | 12/2020 | Bai ...................... H10N 70/021 |

OTHER PUBLICATIONS

Wikipedia entry for Hermann-Mauguin notation (Year: 2023).*
Akyol, et al., "Current-induced Spin-orbit Torque Switching of Perpendicularly Magnetized Hf/CoFeB/MgO and Hf/CoFeB/TaOx Structures", Applied Physics Letters, 2015, vol. 106, pp. 162409-1-162409-5.
Amin, et al., "Spin Transport at Interfaces with Spin-orbit Coupling: Phenomenology", Physical Review B, 2016, vol. 94, pp. 104420-1-104420-16.
Amin, et al., Spin Transport at Interfaces With Spin-orbit Coupling: Formalism, Physical Review B, 2016, vol. 94, pp. 104419-1-104419-18.
Avci, et al., "Current-induced Switching in a Magnetic Insulator", Nature Materials, 2016, vol. 16, pp. 309-314.
Avci, et al., "Fieldlike and Antidamping Spin-orbit Torques in As-grown and Annealed Ta/CoFeB/MgO Layers", Physical Review B, 2014, vol. 89, pp. 214419-1-214419-40.
Baek, et al., "Spin Currents and Spin-orbit Torques in Ferromagnetic Trilayers", Nature Materials, 2018, vol. 17, pp. 509-513.
Berrocal, et al., "Current-induced Spin Torques on Single GdFeCo Magnetic Layers", Advanced Materials, 2021, vol. 33, pp. 2007047-1-2007047-31.
Bodnar, et al., "Writing and Reading Antiferromagnetic Mn2Au by Neel Spin-orbit Torques and Large Anisotropic Magnetoresistance", Nature Communications, 2018, vol. 9, pp. 348-1-348-6.
Carva, et al., "Out-of-plane Spin-transfer Torques: First-principles Study. Journal of Magnetism and Magnetic Material", 2010, vol. 322, pp. 1085-1087.
Chernyshov, et al., "Evidence for Reversible Control of Magnetization in a Ferromagnetic Material by Means of Spin-orbit Magnetic Field", Nature Physics, 2009, vol. 5, pp. 656-659.
Dannenberg, et al., "Surface Energies of Stoichiometric FePt and CoPt Alloys and Their Implications for Nanoparticle Morphologies", Physical Review B, 2009, vol. 80, pp. 245438-1-245438-16.
Freimuth, et al., "Anisotropic Spin Hall Effect from First Principles", Physics Review Letters, 2010, vol. 105, pp. 246602-1-246602-5.
Freimuth, et al., "Spin-orbit Torques in Co/Pt(111) and Mn/W(001) Magnetic Bilayers From First Principles", Phys. Rev. B 2014, 90, pp. 174423-1-174423-10.
Fukami, et al., "Magnetization Switching by Spin-orbit Torque in an Antiferromagnet-ferromagnet Bilayer System", Nature Materials, 2016, vol. 15, pp. 535-541.
Garello, et al., "Symmetry and Magnitude of Spin-Orbit Torques in Ferromagnetic Heterostructures", Nature Nanotechnoly, 2013, vol. 8, pp. 587-1-587-27.
Guillemard, et al., "Charge-spin Current Conversion in High Quality Epitaxial Fe/Pt systems: Isotropic Spin Hall Angle Along Different In-plane Crystalline Directions", Applied Physics Letter, 2018, vol. 113, pp. 262404-1-262404-11.
Hals, et al., Phenomenology of Current-induced Spin-orbit Torques. Physical Review B, 2013, vol. 88, pp. 085423-1-085423-10.
Hayashi, et al., Quantitative Characterization of the Spin-orbit Torque Using Harmonic Hall Voltage Measurements. Physical Review B, 2014, vol. 89, pp. 144425-1-144425-46.
Iwata, et al., Perpendicular Magnetic Anisotropy and Magnetooptical Kerr Spectra of MBE-Grown PtCo Alloy Films. IEEE Transactions on Magnetics, 1997, vol. 33, pp. 3670-3672.
Johansen, et al., "Current Control of Magnetism in Two-Dimensional Fe3GeTe2", Physical Review Letters, 2019, vol. 122, pp. 217203-1 217203-4.
Kim, et al., "Layer Thickness Dependence of the Current-induced Effective Field Vector in Ta|CoFeB|MgO", Nature Materials, 2013, vol. 12, pp. 240-245.
Kim, et al., "Spin-Orbit Torque Driven Magnetization Switching and Precession by Manipulating Thickness of CoFeB/W Heterostructures", Advanced Electronics Materials, 2020, vol. 6, pp. 1901004-1-1901004-7.
Kong, et al., "Spin-orbit Torque Switching in a T-type Magnetic Configuration with Current Orthogonal to Easy Axes", Nature Communications, 2019, vol. 10, pp. 233-1-233-7.
Lau, et al., "Spin-orbit Torque Switching Without an External Field Using Interlayer Exchange Coupling", Nature Nanotechnology, 2016, vol. 11, pp. 758-762.
Liu, et al., "Current-induced Magnetization Switching in All-oxide Heterostructures", Nature Nanotechnology, 2019, vol. 14, pp. 939-944.
Liu, et al., Current-induced Switching of Perpendicularly Magnetized Magnetic Layers Using Spin Torque From the Spin Hall Effect. Physical Review Letters, 2012, vol. 109, pp. 096602-1-096602-5.
Liu, et al., "Electrical Switching of Perpendicular Magnetization in a Single Ferromagnetic Layer", Physical Review B, 2020, vol. 101, pp. 220402-1-220402-7.
Liu, et al., "Spin-Torque Switching with the Giant Spin Hall Effect of Tantalum", Science, 2012, 336, pp. 555-558.
Liu, et al., "Symmetry-dependent field-free switching of perpendicular magnetization", Nature Nanotechnology, 2021, vol. 16, pp. 277-282.
Liu, et al., "Two-Dimensional Materials for Energy-Efficient Spin-Orbit Torque Devices", ACS Nano Publications, 2020, vol. 14, pp. 9389-9407.
MacNeil, et al., "Control of Spin-orbit Torques Through Crystal Symmetry in WTe2/ferromagnet Bilayers", Natural Physics, 2017, vol. 13, pp. 300-305.
Manchon, et al., "Current-induced Spin-orbit Torques in Ferromagnetic and Antiferromagnetic Systems", Rev. Mod. Phys., 2019, vol. 91, 035004, pp. 1-90.
Manchon, et al., "Theory of Nonequilibrium Intrinsic Spin Torque in a Single Nanomagnet", Physical Review B, 2008, vol. 78, pp. 212405-1-212405-4.
Manchon, et al., "Theory of Spin Torque Due to Spin-orbit Coupling", Physical Review B, 2009, vol. 79, pp. 094422-1-094422-9.
Miron, et al., "Perpendicular Switching of a Single Ferromagnetic Layer Induced by In-plane Current Injection", Nature, 2011, vol. 476, pp. 189-193.
Oh, et al., "Field-free Switching of Perpendicular Magnetization Through Spin-orbit Torque in Antiferromagnet/ferromagnet/oxide Structures", Nature Nanotechnology, 2016, vol. 11, pp. 878-884.
Pai, et al., "Determination of Spin Torque Efficiencies in Heterostructures With Perpendicular Magnetic Anisotropy", Physical Review B, 2016, vol. 93, pp. 144409-1-144409-7.

(56) References Cited

OTHER PUBLICATIONS

Pai, et al., "Spin Transfer Torque Devices Utilizing the Giant Spin Hall Effect of Tungsten", Applied Physics Letters, 2012, vol. 101, pp. 122404-1-122404-18.

Pi, et al., "Tilting of the Spin Orientation Induced by Rashba Effect in Ferromagnetic Metal Layer", Applied Physics Letter, 2010, vol. 97, pp. 162507-1-162507-3.

Ramaswamy, et al., "Recent Advances in Spin-orbit Torques: Moving Towards Device Applications", Applied Physics Review, 2018, vol. 5, pp. 031107-1-031107-50.

Razavi, et al., "Joule Heating Effect on Field-Free Magnetization Switching by Spin-Orbit Torque in Exchange-Biased Systems", Physical Review Applied, 2017, vol. 7, pp. 024023-1-024023-31.

Safeer, et al., "Spin-orbit Torque Magnetization Switching Controlled by Geometry", Nature Nanotechnology, 2016, vol. 11, pp. 143-146.

Suzuki, et al., "Preparation of CoPt-Alloy Thin Films With Perpendicular Magnetic Anisotropy on MgO(111), SrTiO3(111), and Al2O3(0001) Single-Crystal Substrates", IEEE Transactions on Magnetics, 2012, vol. 48, pp. 3195-3198.

Van Den Brink, et al., "Field-free Magnetization Reversal by Spin-Hall Effect and Exchange Bias", Nature Communications, 2016, vol. 7, Article No. 10854, pp. 1-14.

Wadley, et al., "Electrical Switching of an Antiferromagnet", Science, 2016, vol. 351, p. 587.

Wang, et al., Diffusive Spin Dynamics in Ferromagnetic Thin Films with a Rashba Interaction, Physical Review Letters, 2012, vol. 108, pp. 117201-1-177201-5.

Yoshimi, et al., "Current-driven Magnetization Switching in Ferromagnetic Bulk Rashba Semiconductor (Ge,Mn)Te", Science Advances, 2018, vol. 4, pp. 1-6.

You, et al., "Switching of Perpendicularly Polarized Nanomagnets with Spin Orbit Torque without an External Magnetic Field by Engineering a Tilted Anisotropy", Proceedings of the National Academies of Science, 2015, US, vol. 112, pp. 10310-10315.

Yu, et al., "Switching of Perpendicular Magnetization by Spin-orbit Torques in the Absence of External Magnetic Fields", Nature Nanotechnology, 2014, vol. 9, pp. 548-554.

Železný, et al., Spin-orbit Torques in Locally and Globally Noncentrosymmetric Crystals: Antiferromagnets and Ferromagnets. Physical Review B, 2017, vol. 95, pp. 014403-1-014403-17.

The Written Opinion of the International Preliminary Examining Authority for PCT/SG2020/050534, dated Jul. 2, 2021.

The International Search Report and The Written Opinion of the International Searching Authority for PCT/SG2020/050534, dated Dec. 21, 2020.

Kim, et al., "Bulk Dzyaloshinskii-Moriya Interaction in Amorphous Ferrimagnetic Alloys", Nature Materials, 2019, vol. 18, pp. 685-691.

Liu, et al., "Electrical Switching of Perpendicular Magnetization in L10 FePt Single Layer", 2018, pp. 1-17.

Peng, et al., "Magnetic Tunnel Junctions for Spintronics: Principles and Applications", Wiley Encyclopedia of Electrical and Electronics Engineering, 2014, pp. 1-16.

Zhang, et al., "Current-induced Magnetization Switching in a CoTb Amorphous Single Layer", Physical Review B, 2020, vol. 101, pp. 220402-1 220402-17.

Zhao, et al., "External-Field-Free Spin Hall Switching of Perpendicular Magnetic Nanopillar with a Dipole-Coupled Composite Structure", Advanced Electronic Materials, 2020, vol. 7, pp. 10854-1-10854-21.

\* cited by examiner

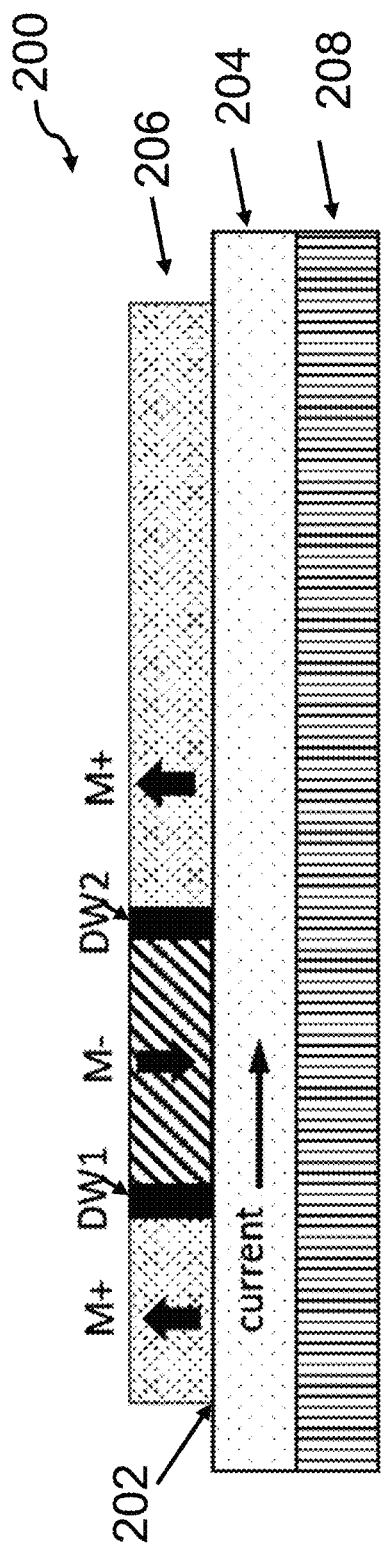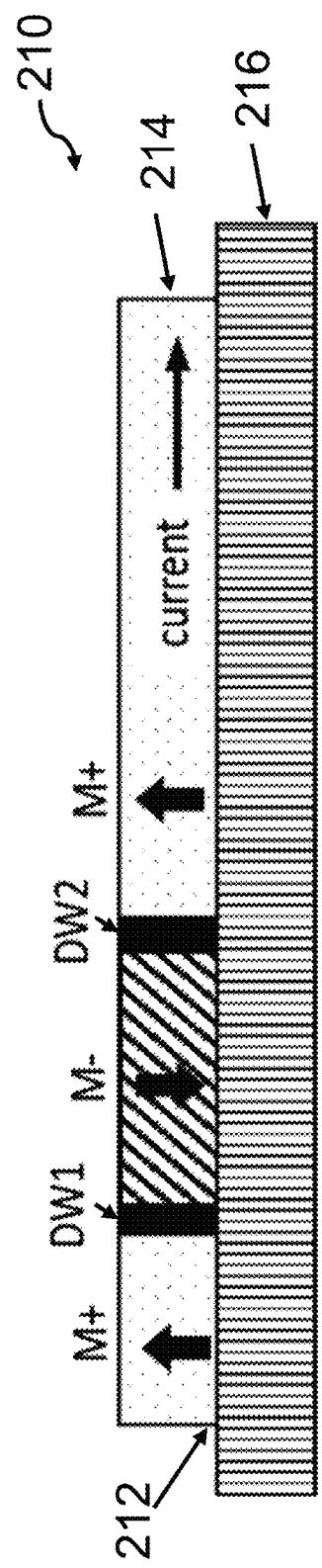
Figure 2A
Figure 2B

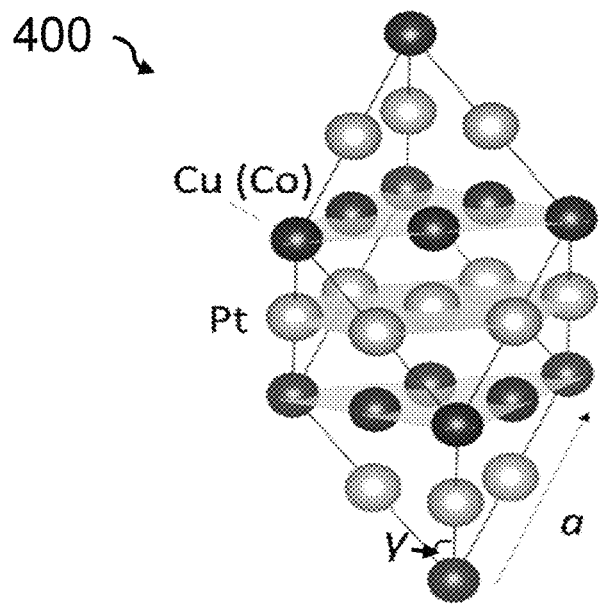
Figure 4
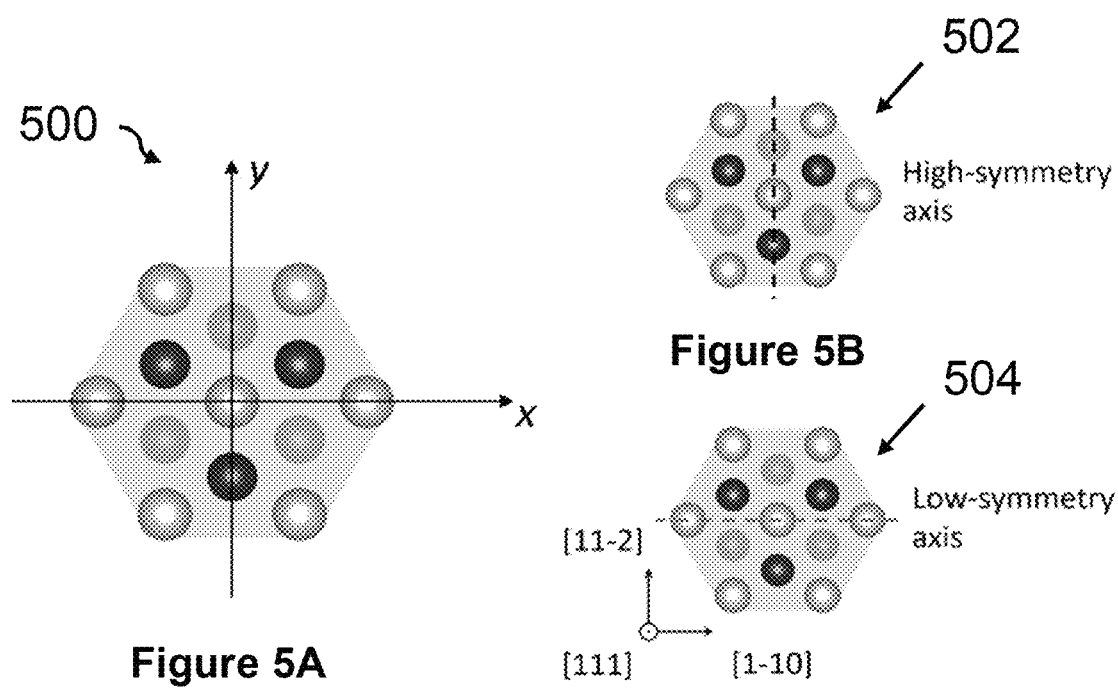
Figure 5A
Figure 5B
Figure 5C

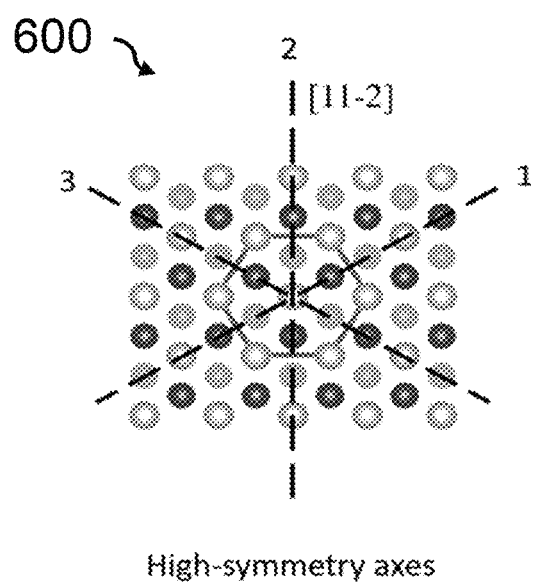
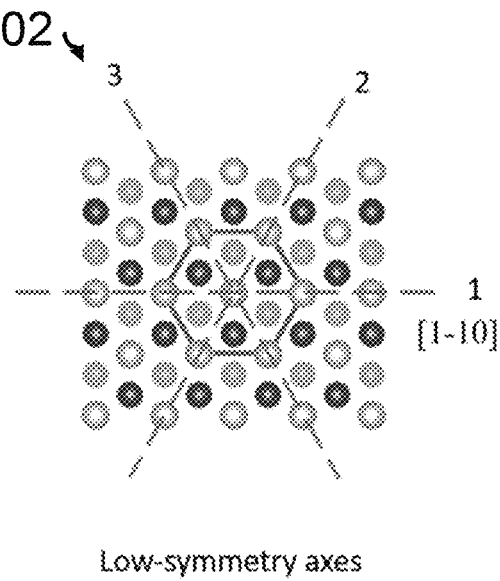
Figure 6A    Figure 6B
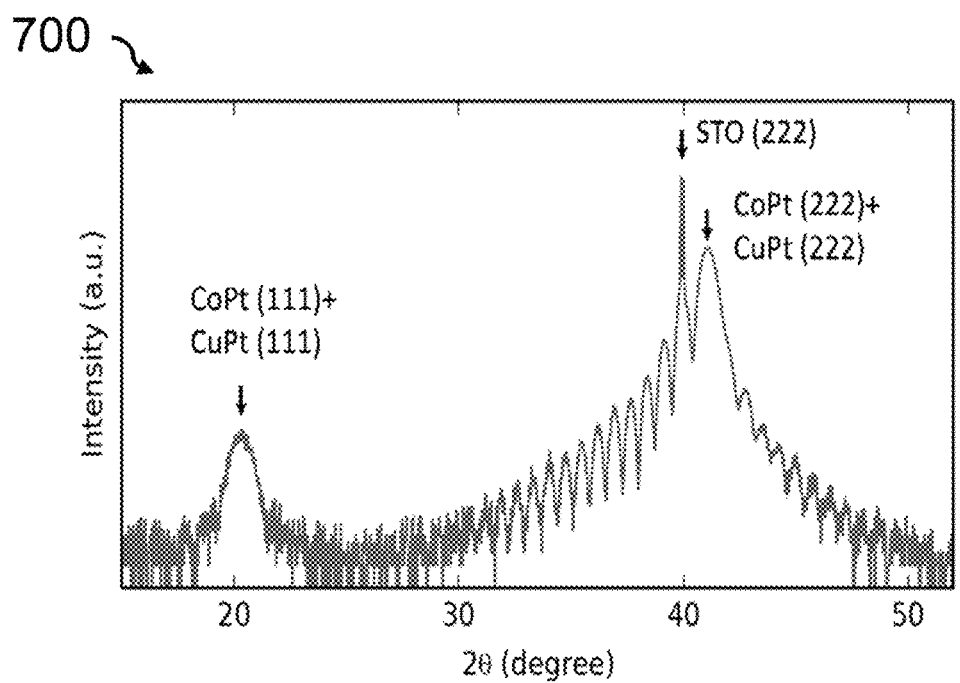
Figure 7

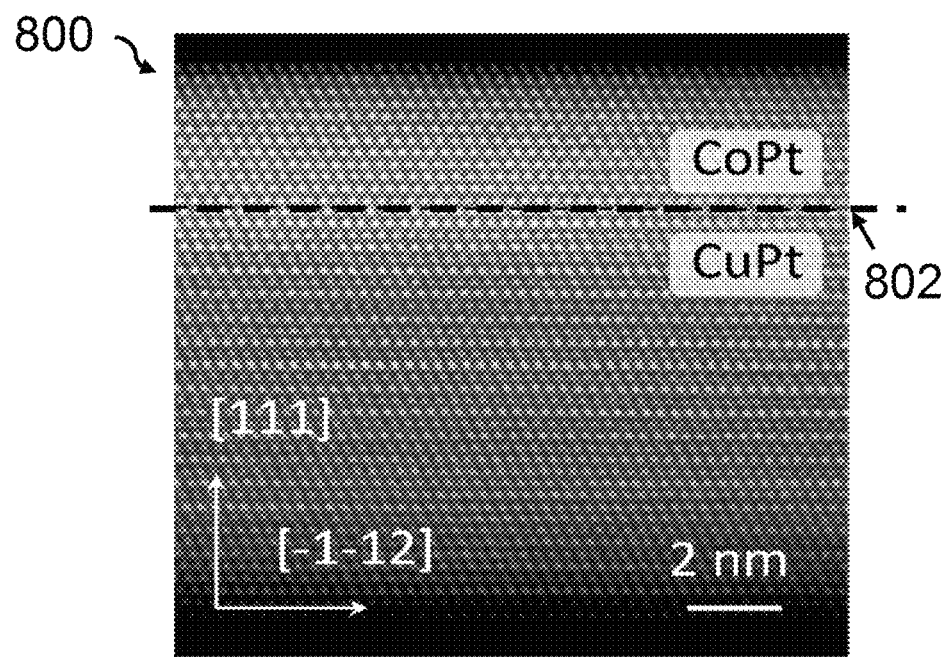
Figure 8
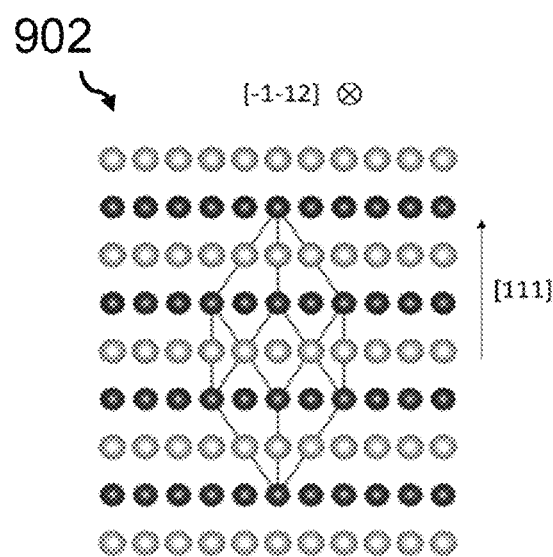 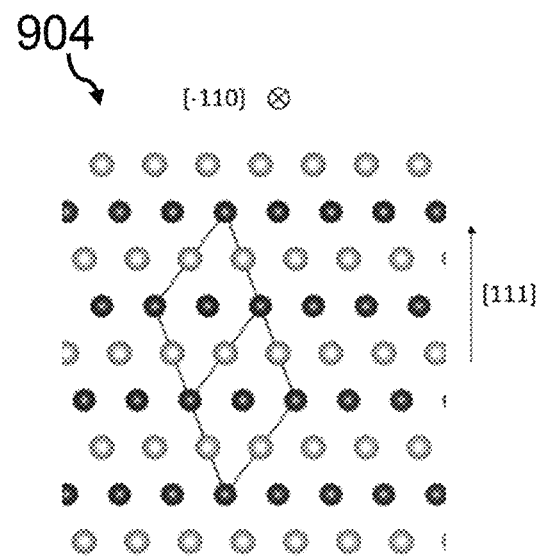
Figure 9A  Figure 9B

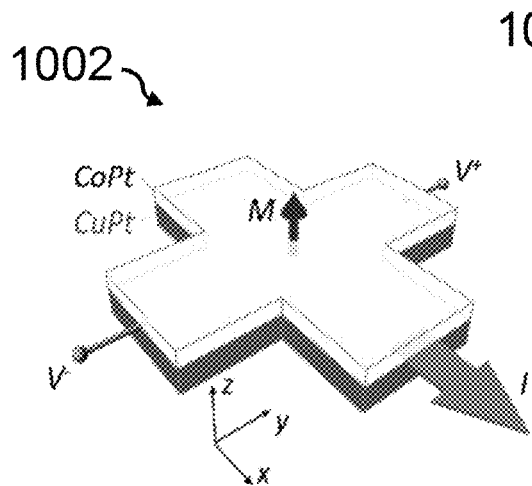
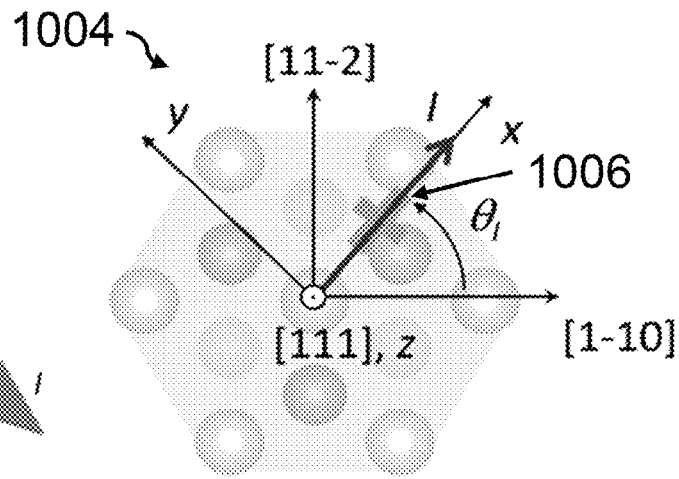
Figure 10A  Figure 10B
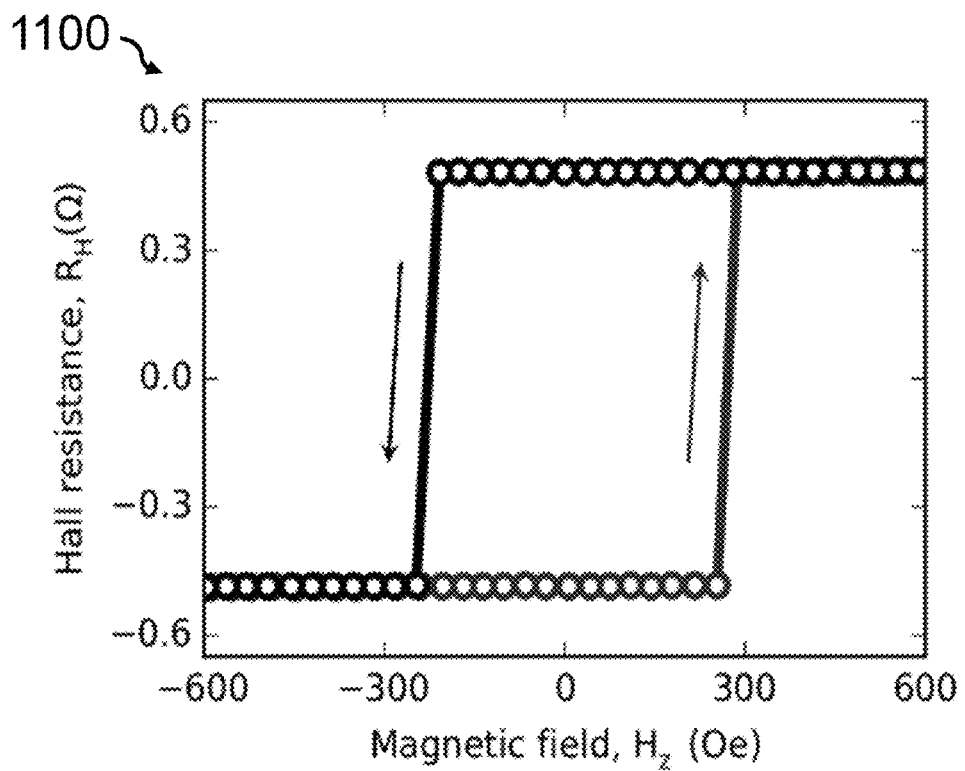
Figure 11

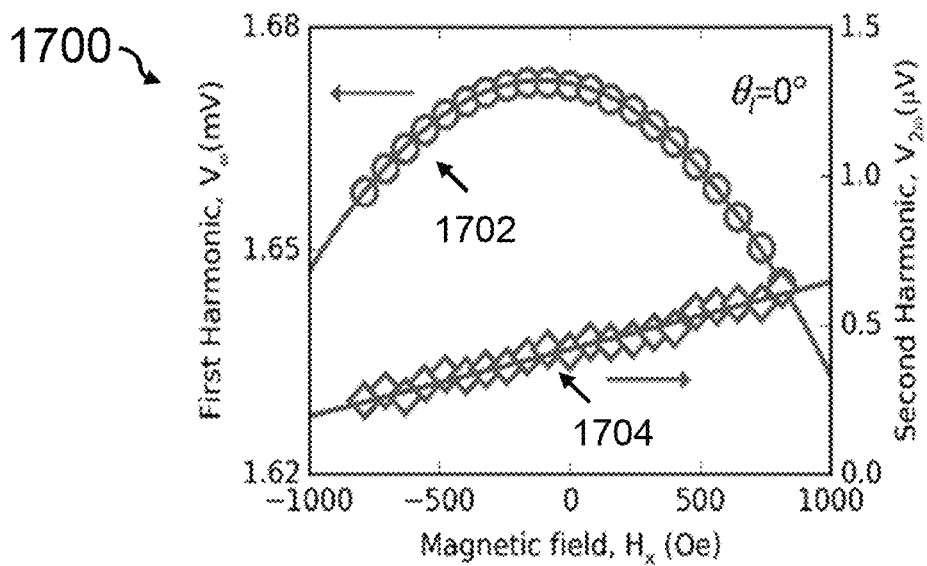
Figure 17A
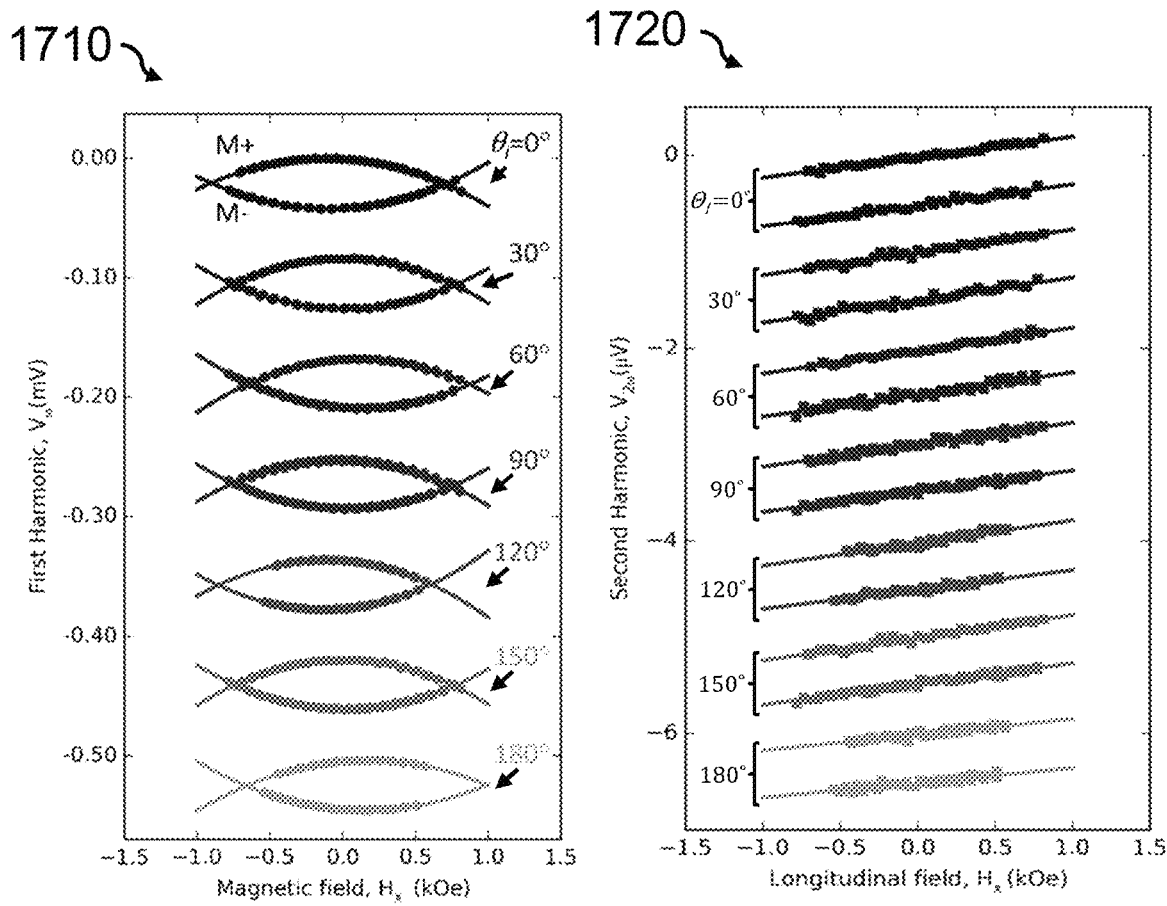
Figure 17B
Figure 17C

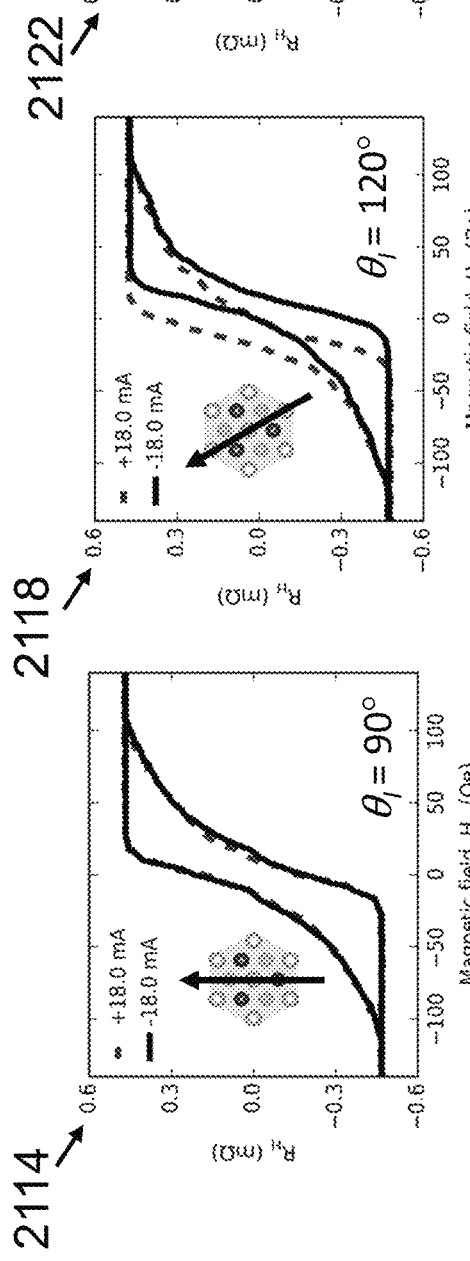
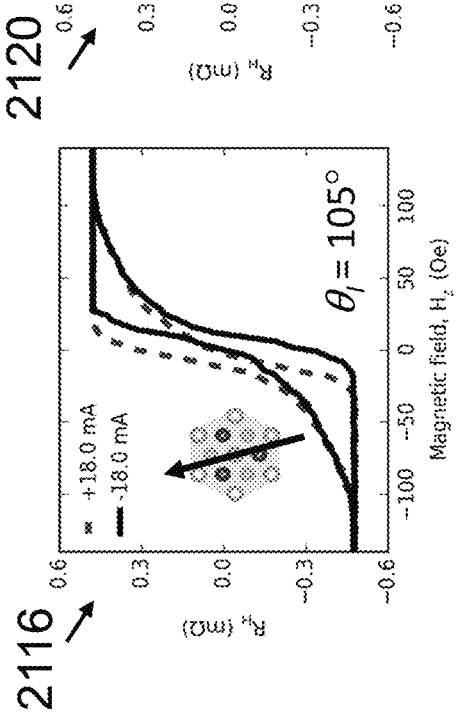
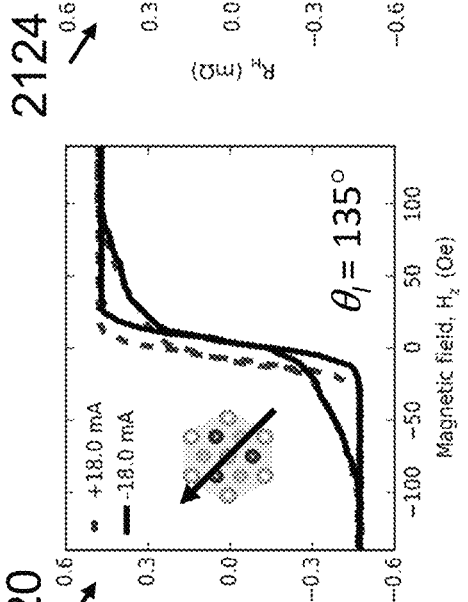
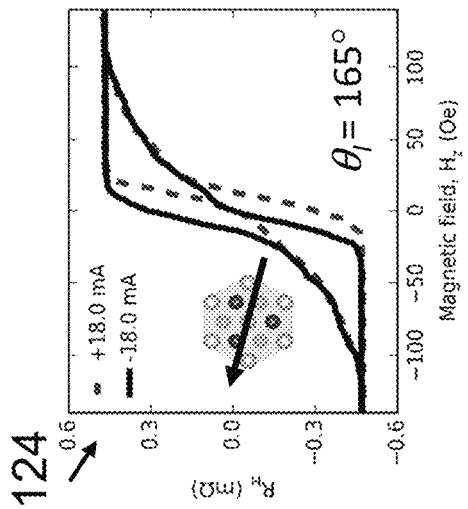
Figure 21G, Figure 21H, Figure 21I, Figure 21J, Figure 21K, Figure 21L

SPIN-ORBIT TORQUE DEVICE, METHOD FOR FABRICATING A SPIN-ORBIT TORQUE DEVICE AND METHOD FOR SWITCHING A SWITCHABLE MAGNETIZATION OF A SPIN-ORBIT TORQUE DEVICE

CROSS REFERENCE TO RELATED APPLICATIONS

The present application claims priority from Singapore Patent Application No. 10202007649X, filed Aug. 11, 2020, the disclosure of which is incorporated herein by reference.

TECHNICAL FIELD

The present disclosure relates to a spin-orbit torque device, a method for fabricating a spin-orbit torque device, and a method for switching a switchable magnetization of a spin-orbit torque device.

BACKGROUND

As an energy-efficient tool, the spin-orbit torque (SOT) has been utilized to electrically manipulate the magnetization of magnetic materials. For example, in a scenario utilizing the spin Hall effect in a heavy metal/ferromagnet (HM/FM) heterostructure, a charge current flowing in the HM layer with an in-plane direction (x) generates a spin current in the out-of-plane direction (z) with a spin polarization along the y-direction. When flowing into the FM layer, the spin current generates a damping-like torque whose direction is set by the spin-polarization direction (y). However, because the current induced damping-like torque that is responsible for the switching is symmetric with respect to the magnetization directions (up or down), it cannot induce deterministic magnetization switching. To break this symmetry, an in-plane magnetic field parallel to the electric current direction can be introduced. However, the requirement of an external magnetic field is an obstacle for practical application such as magnetic random access memory (MRAM). An all-electrical control of magnetization is a prerequisite for modern magnetic memory technologies such as MRAM.

To solve the above problem, researchers have proposed two main approaches. One is by using an in-plane damping-like torque (e.g. in the y-direction) but includes a method to break the torque-symmetry. A method to break the torque-symmetry in this first approach includes engineering an internal bias field by an exchange interaction/interlayer coupling (e.g. along the x-direction) and tilting the magnetization (e.g. along the y-direction). The other approach is by using an extra ferromagnetic layer to generate an out-of-plane spin torque (e.g. along z-direction). However, these approaches involve additional structural and/or asymmetric designs which complicate the device structure and may introduce extrinsic effects (such as training effect). It is therefore desirable to provide a spin-orbit torque device and a method for fabricating the spin-orbit torque device which address the aforementioned problems and/or provides a useful alternative. A method for switching a switchable magnetization of the spin-orbit torque device is also described.

Furthermore, other desirable features and characteristics will become apparent from the subsequent detailed description and the appended statements of invention, taken in conjunction with the accompanying drawings and this background of the disclosure.

SUMMARY

Aspects of the present application relate to a spin-orbit torque device, a method for fabricating a spin-orbit torque device and a method for switching a switchable magnetization direction of a spin-orbit torque device. In particular, aspects of the present application relate to a spin-orbit torque device with an interface having a symmetry adapted to interact with an electric current for generating a spin torque.

In accordance with a first aspect, there is provided a spin-orbit torque device comprising: an interfacing layer; and a magnetic layer having a switchable magnetization direction, wherein an interface is formed between the interfacing layer and the magnetic layer, the interface having a 3m1 crystallographic point group symmetry adapted to interact with an electric current to generate a spin torque for switching the magnetization direction of the magnetic layer.

By incorporating the interface having a 3m1 crystallographic point group symmetry, a spin torque for deterministically switching the magnetization direction of the magnetic layer can be generated from an electric current. For example, an out-of-plane (OOP) spin torque can be generated under the application of an in-plane electric current in a heavy metal (HM)/ferromagnetic (FM) bilayer (or a FM single-layer) structure having this interface with the 3m1 crystallographic point group symmetry. This embodiment is discussed in detail below in relation to the CuPt/CoPt bilayer structure. This OOP spin torque can deterministically switch the perpendicular magnetization of the HM/FM bilayer (or the FM single-layer as illustrated in the embodiment of a single layer of $Co_xPt_{100-x}$ discussed below) without the application of an external magnetic field. Moreover, a polarity and an amplitude of the OOP spin torque, generated as a result of an interaction with the 3m1 symmetry interface, can be precisely controlled by a flow direction of the electric current with respect to a symmetry of the crystal structure of the HM/FM bilayer or the FM single-layer, or with respect to a symmetry of the interface. The spin-torque efficiency can therefore be continuously tuned by controlling a flow direction of the electric current. Further, the spin torque generated in this way exhibits excellent thermal stability and endurance, since the spin torque is generated by an interaction with the interface symmetry which is a material property of the heterostructure. Still further, since the spin-torque is generated by an interaction between the 3m1 crystallographic point group symmetry at the interface and the electric current, either a bilayer or a single-layer structure can be used to achieve the functionality of this field-free spin-orbit torque (SOT) switching as long as an interface with the 3m1 crystallographic point group symmetry is present. In an embodiment where a single-layer structure is used in the SOT device, it can greatly simplify the device design and its fabrication process.

The spin-orbit torque device may comprise: an insulating tunneling layer formed on the magnetic layer; and a magnetic pinned layer formed on the insulating tunneling layer, the magnetic pinned layer having a fixed magnetization direction, wherein the magnetization direction of the magnetic layer is switched by the spin torque to provide two different resistance states of the spin-orbit torque device.

In accordance with a second aspect, there is provided a method for fabricating a spin-orbit torque device, the method comprising: providing an interfacing layer; and forming a magnetic layer having a switchable magnetization direction on the interfacing layer, wherein an interface is formed between the interfacing layer and the magnetic layer, the interface having a 3m1 crystallographic point group symmetry adapted to interact with an electric current to generate a spin torque for switching the magnetization direction of the magnetic layer.

The magnetization direction of the magnetic layer may be perpendicular to a planar surface of the magnetic layer.

The magnetic layer may comprise a ferromagnetic layer.

The interfacing layer may comprise a spin source layer arranged to receive the electric current for generating the spin torque.

The spin-source layer may comprise copper-platinum (CuPt) and the magnetic layer comprises cobalt-platinum (CoPt). In an embodiment, the spin-source layer includes a heavy metal layer.

The interfacing layer may comprise a substrate layer, and the magnetic layer is arranged to receive the electric current for generating the spin torque. In this case, a single layer structure comprising the magnetic layer can be formed which advantageously reduces a number of process steps as well as a complexity for fabricating the spin-orbit torque device.

The substrate layer may comprise (111)-oriented strontium titanate ($SrTiO_3$) and the magnetic layer may comprise cobalt-platinum (CoPt).

The magnetic layer may comprise a functionally graded magnetic layer having a composition gradient adapted to create a broken inversion symmetry to interact with the electric current to generate a damping-like torque in the magnetic layer. In this embodiment, a single magnetic layer can be deposited on the substrate layer for forming the spin-orbit torque device which greatly simplifies the device design and its fabrication process.

The magnetic layer may comprise cobalt-platinum $Co_xPt_{100-x}$, where x is between 20 and 50.

The magnetic layer may comprise cobalt-platinum with a composition of $Co_{30}Pt_{70}$. In this embodiment, this composition of CoPt provides better switching properties (e.g. a larger damping-like effective field) as compared to CoPt of other compositions.

A polarity and an amplitude of the spin torque may be associated with a flow direction of the electric current with respect to a crystalline/crystal structure of the magnetic layer. The flow direction of the electric current can therefore be manipulated to tune properties such as the polarity and the amplitude of the spin torque to modulate an efficiency of the spin torque.

The electric current may be adapted to flow in a direction along a low-symmetry axis of the magnetic layer, the low-symmetry axis being an axis which resides in a crystal plane of the magnetic layer, wherein the crystal plane is not a mirror symmetry plane with respect to a crystalline/crystal structure of the magnetic layer.

The spin-orbit torque device may be arranged to provide a plurality of resistance states associated with a magnitude of the electric current. The plurality of resistance states can act as storage bits for memory applications using the spin-orbit torque device.

The magnetic layer may comprise a magnetization region sandwiched between two domain walls, and the interface may be arranged to interact with the electric current to generate the spin torque for propagating the two domain walls in opposite directions along the magnetic layer to shrink or expand the magnetization region.

The method may comprise: forming an insulating tunneling layer on the magnetic layer; and forming a magnetic pinned layer on the insulating tunneling layer, the magnetic pinned layer having a fixed magnetization direction, wherein the magnetization direction of the magnetic layer is switched by the spin torque to provide two different resistance states of the spin-orbit torque device.

In accordance with a third aspect, there is provided a method for switching a switchable magnetization direction of a spin-orbit torque device, the spin-orbit torque device comprising an interfacing layer and a magnetic layer having the switchable magnetization direction, wherein an interface is formed between the interfacing layer and the magnetic layer, and wherein the interface includes a 3m1 crystallographic point group symmetry, the method comprising: providing an electric current in the interfacing layer or the magnetic layer in an absence of a magnetic field, wherein the electric current is adapted to flow in a direction along a low-symmetry axis of the magnetic layer to generate a spin torque for switching the magnetization direction of the magnetic layer, the low-symmetry axis being an axis which resides in a crystal plane of the magnetic layer, wherein the crystal plane is not a mirror symmetry plane with respect to a crystalline structure of the magnetic layer.

It should be appreciated that features relating to one aspect may be applicable to the other aspects. Embodiments therefore provide a spin-orbit torque (SOT) device comprising an interface having a 3m1 crystallographic point group symmetry adapted to interact with an electric current to generate a spin torque for switching the magnetization direction of the magnetic layer. By incorporating this interface having a 3m1 crystallographic point group symmetry, a spin torque for deterministically switching the magnetization direction of the magnetic layer can be generated from an electric current. Moreover, a polarity and an amplitude of the OOP spin torque can be precisely controlled by a flow direction of the electric current with respect to a symmetry of a crystal structure of the magnetic layer or a symmetry of the interface. This provides a means for continuously tuning a spin-torque efficiency in the SOT device by manipulating a flow direction of the electric current in the device. Further, the spin torque generated in this way exhibits excellent thermal stability and endurance, since the spin torque is generated by an interaction with a crystal symmetry of the interface which is a material property of the heterostructure. Still further, since the spin-torque is generated by an interaction between the 3m1 crystallographic point group symmetry at the interface and the electric current, either a bilayer or a single-layer structure can be used to achieve the functionality of this field-free spin-orbit torque (SOT) switching as long as an interface with the 3m1 crystallographic point group symmetry is present. This provides an ability to greatly simplify the device design and its fabrication process.

BRIEF DESCRIPTION OF THE DRAWINGS

Embodiments will now be described, by way of example only, with reference to the following drawings, in which:

FIG. 1A shows a schematic of the MTJ element utilizing the current induced out-of-plane SOT at a spin source layer/magnetic layer interface in accordance with an embodiment, and FIG. 1B shows a schematic of the MTJ element utilizing the current induced out-of-plane SOT at a magnetic layer/substrate layer interface in accordance with an embodiment;

FIGS. 2A and 2B show schematics of a domain wall motion device, where FIG. 2A shows a schematic of the domain wall motion device having a bilayer structure with a spin source layer/magnetic layer interface having the "3m1" point group symmetry in accordance with an embodiment, and FIG. 2B shows a schematic of the domain wall motion device having a single layer structure with a magnetic layer/substrate layer interface having the "3m1" point group symmetry in accordance with an embodiment;

FIG. 4 shows a schematic of a crystal structure of $L1_1$ CuPt or CoPt in accordance with an embodiment;

FIGS. 5A, 5B and 5C show plane views of the $L1_1$ hexagon projected along the [111] direction in accordance with an embodiment, where FIG. 5A shows the Pt atomic layer (grey color) was sandwiched by two Cu (Co) atomic layers (black on top and light gray on bottom), where FIG. 5B shows the typical high-symmetry axis in the (111) plane and FIG. 5C shows the typical low-symmetry axis in the (111) plane;

FIGS. 6A and 6B show illustrations of symmetry axes in the (111) plane of $L1_1$ CuPt in accordance with an embodiment, where FIG. 6A shows an illustration of the high-symmetry axes in the (111) plane of $L1_1$ CuPt and FIG. 6B shows an illustration of the low-symmetry axes in the (111) plane of $L1_1$ CuPt;

FIG. 7 shows a plot of X-ray diffraction patterns of CuPt (10 nm)/CoPt (4 nm) bilayer deposited on SrTiO3 (111) substrate in accordance with an embodiment;

FIG. 8 shows a high-angle annular dark-field (HAADF)-scanning transmission electron microscopy (STEM) image of the CuPt (10 nm)/CoPt (4 nm) bilayer of FIG. 7 in accordance with an embodiment;

FIGS. 9A and 9B show side views of the $L1_1$ crystal structure of FIG. 4 in accordance with an embodiment, where FIG. 9A shows a side view of CuPt (CoPt) projected from the [−1-12] direction and FIG. 9B shows a side view of CuPt (CoPt) projected from the [−110] direction;

FIGS. 10A and 10B show schematics of the CuPt/CoPt Hall bar for electrical transport measurement in accordance with an embodiment, where FIG. 10A shows a schematic of the CuPt/CoPt Hall bar having the same x and y-axes as that in FIG. 10B, and FIG. 10B shows the CuPt/CoPt Hall bar in relation to crystalline directions where an electric current applied along the Hall bar has an azimuth angle of $\theta_I$ with respect to the [1-10] direction;

FIG. 11 shows a graph of the anomalous Hall effect of the CuPt/CoPt bilayer of the Hall bar when the azimuth angle, $\theta_I$ is 0° in accordance with an embodiment;

FIGS. 17A, 17B and 17C show plots of harmonic Hall signals of the CuPt (10 nm)/CoPt (4 nm) bilayer in accordance with an embodiment, where FIG. 17A shows plots of the first and second harmonic Hall signals as a function of the in-plane magnetic field ($H_x$) under 5 mA (amplitude) a.c. excitation current, FIG. 17B shows plots of first harmonic signals as a function of the longitudinal magnetic field for different $\theta_I$, and FIG. 17C shows plots of second harmonic Hall signal as a function of the longitudinal magnetic field for different $\theta_I$ where the linear lines are linear fits to the data;

FIG. 18A shows plots of the first harmonic signal as a function of the longitudinal magnetic field for different a.c. currents, FIG. 18B shows plots of the second harmonic Hall signal as a function of the longitudinal magnetic field for different a.c. currents, FIG. 18C shows plots of the second harmonic signal as a function of $1/(\mu H_x - \mu H_K)$ where the dashed line are fits to the data, and FIG. 18D shows a plot of magnetic field dependence of calculated thermal contribution $V_{ther}$;

FIG. 19A shows plots of damping-like effective field versus a.c. excitation current $I_{AC}$ (mA) for $\theta_I=0°$ (circle), $\theta_I=30°$ (square), $\theta_I=60°$ (triangle) and $\theta_I=90°$ (diamond) and FIG. 19B shows a plot of damping-like effective fields obtained for varying current flowing angle $\theta_I$ with a solid guiding line;

FIG. 20A shows a plot of anomalous Hall loops under +18 mA and −18 mA pulsed d.c. current for $\theta_I=0°$, FIG. 20B shows a plot of anomalous Hall loops under +18 mA and −18 mA pulsed d.c. current for $\theta_I=30°$, FIG. 20C shows a plot of anomalous Hall loops under +18 mA and −18 mA pulsed d.c. current for $\theta_I=60°$, FIG. 20D shows a plot of anomalous Hall loops under +18 mA and −18 mA pulsed d.c. current for $\theta_I=90°$, FIG. 20E shows a plot of out-of-plane effective field $\Delta H_{OOP}$ versus pulsed current for $\theta_I=0°$ (circle), $\theta_I=30°$ (square), $\theta_I=60°$ (triangle) and $\theta_I=90°$ (diamond), and FIG. 20F shows a plot of out-of-plane effective field $\Delta H_{OOP}/J_{pulse}$ as a function of $\theta_I$ where the solid line is a cosine fit to the data;

FIGS. 21A to 21L shows plots of anomalous Hall loops under +18 mA and −18 mA pulsed d.c. current for varying $\theta_I$ ($\theta_I$ varies from 0° to 165° for every 15°) in accordance with an embodiment;

FIG. 23A shows plots of Hall resistance $R_H$ (Ω) versus pulsed current for 2259 repeated measurements and FIG. 23B shows a plot of switched resistance ΔR (Ω) versus a number of switching cycles, N;

FIG. 37A shows a Co Kα EDS mapping and FIG. 37B shows a Pt Lα edge EDS mapping;

FIG. 38A shows a plot of composition of Co and Pt as a function of a position for the 12 nm-thick $Co_{30}Pt_{70}$ of FIG. 36, and FIG. 38B shows a plot of composition of Co and Pt as a function of a position for a 6 nm-thick $Co_{30}Pt_{70}$ layer;

FIG. 39A shows a plot of damping-like effective field as a function of J for a 6 nm thick $Co_{30}Pt_{70}$ layer, FIG. 39B shows a plot of damping-like effective field as a function of J for a 8 nm thick $Co_{30}Pt_{70}$ layer, FIG. 39C shows a plot of damping-like effective field as a function of J for a 10 nm thick $Co_{30}Pt_{70}$ layer and FIG. 39D shows a plot of damping-like effective field as a function of J for a 12 nm thick $Co_{30}Pt_{70}$ layer.

DETAILED DESCRIPTION

Figure 1A:
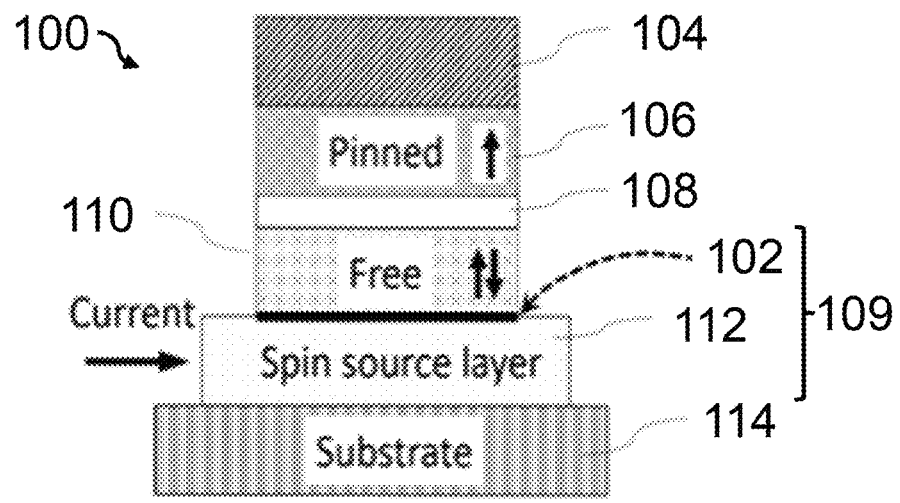
FIGS. 1A and 1B show schematics of a magnetic tunnel junction (MTJ) element by utilizing a current induced out-of-plane SOT, where

Exemplary embodiments relate to a spin-orbit torque (SOT) device, in particular, a spin-orbit torque device with an interface symmetry induced spin torque. A method of fabricating the SOT device and a method for switching the switchable magnetization direction of the SOT device are also described.

In the present disclosure, SOT devices of several different structures are first described in relation to FIGS. 1A to 3. This is followed by experimental results which demonstrate the interface symmetry induced spin torque generated as a result of the 3m1 crystallographic point group symmetry interface in the SOT device, and illustrate deterministic switching of a magnetization direction of a magnetic layer in a SOT device using this interface symmetry induced spin torque. For simplicity and clarity, the interface symmetry induced spin torque generated as a result of the 3m1 crystallographic point group symmetry interface in the SOT device is hereinafter called the "3m" torque. There are two sets of experimental results discussed below: a first set is in relation to an exemplary HM/FM bilayer ($L1_1$-ordered CuPt/CoPt) and a second set is in relation to a $Co_xPt_{100-x}$ single magnetic layer having a composition gradient along a film normal direction (i.e. perpendicular to a plane of the $Co_xPt_{100-x}$ layer). The first and second set of experimental results are discussed in relation to FIGS. 4 to 23B and FIGS. 24 to 40, respectively.

Although an HM/FM bilayer ($L1_1$-ordered CuPt/CoPt) and a single $Co_xPt_{100-x}$ layer are used as embodiments in the following experimental results to illustrate the "3m" torque generated as a result of the 3m1 crystallographic point group symmetry interface in the SOT device, it should be understood that, other bilayer or other single layer structures may be used as long as an interface having the 3m1 crystallographic point group symmetry is present in the SOT device. Examples of the different materials which can be used are discussed below.

Further, as discussed below, the $L1_1$-ordered CuPt/CoPt bilayer structure or the single $Co_xPt_{100-x}$ layer exhibits a large perpendicular magnetocrystalline anisotropy and it will be shown that in turn, an out-of-plane (OOP) spin torque (i.e. the "3m" torque) is generated from an interaction of an electric current with the interface having the 3m1 crystallographic point group symmetry. To be clear, by out-of-plane, it means that the spin torque (or the "3m" torque) is in a direction (e.g. along the z-axis) perpendicular to a planar surface (e.g. the x-y plane) of the magnetic layer. In other words, the "3m" torque generated is in a direction perpendicular to a longitudinal axis of the magnetic layer, where the longitudinal axis is in a direction parallel to the planar surface of the magnetic layer. It can be further understood that this "3m" torque generated is perpendicular to a surface plane of the interface having the 3m1 crystallographic point group symmetry.

Further, it should be appreciated that where it is described that the magnetization of the magnetic layer is switched, the magnetization direction of the magnetic layer is also switched in those instances.

Embodiments of SOT Devices

The present disclosure describes a spin-orbit torque device comprising an interfacing layer and a magnetic layer having a switchable magnetization direction. In particular, an interface is formed between the interfacing layer and the magnetic layer where the interface has a 3m1 crystallographic point group symmetry adapted to interact with an electric current to generate a spin torque for switching the magnetization direction of the magnetic layer. As it is clear from the description below, the presence of the 3m1 crystallographic point group symmetry at the interface interacts with the electric current to provide a spin torque (known as "3m" torque in the description below) for deterministically switching the magnetization direction of the magnetic layer (e.g. a ferromagnetic layer). In the embodiments described below, the magnetic layer also has a perpendicular magnetic anisotropy, which means that the magnetization direction of the magnetic layer is perpendicular to a planar surface of the magnetic layer (i.e. out-of-plane to the magnetic layer). In other words, the magnetization direction of the magnetic layer is in a direction perpendicular to a longitudinal axis of the magnetic layer, where the longitudinal axis is in a direction parallel to the planar surface of the magnetic layer. An example is described below in relation to the magnetic tunnel junction devices of FIGS. 1A and 1B, and/or the domain wall motion devices as shown in FIGS. 2A and 2B. Further, although a ferromagnetic layer is used in the following embodiments, it should be expected for example that a ferrimagnetic layer can also be used. Still further, it should be appreciated that a magnetic layer (e.g. a ferromagnetic or a ferrimagnetic layer) having a perpendicular magnetic anisotropy or an in-plane magnetic anisotropy may be used for this SOT device. An example of a ferrimagnetic layer with a 3m1 symmetry at the interface includes $Mn_3Ge$.

Different embodiments for a SOT device comprising an interface having a 3m1 crystallographic point group symmetry are described below.

Example 1. SOT Memories Based on Interface Symmetry-Induced Field-Free Magnetization Switching In a first example, the "3m" torque can be used in a magnetic tunnel junction (MTJ) element for the application of spin-orbit torque magnetic random access memory (SOT-MRAM). In this embodiment, the SOT device can be deployed as a MTJ element and includes a magnetic layer, an insulating tunneling layer, and a magnetic pinned layer. The magnetization direction of the magnetic pinned layer is fixed, while the magnetization direction of the magnetic layer (can also be considered as a "magnetic free layer") can be switched from up to down (or in the opposite way) by using the "3m" torque.

Figure 1B:
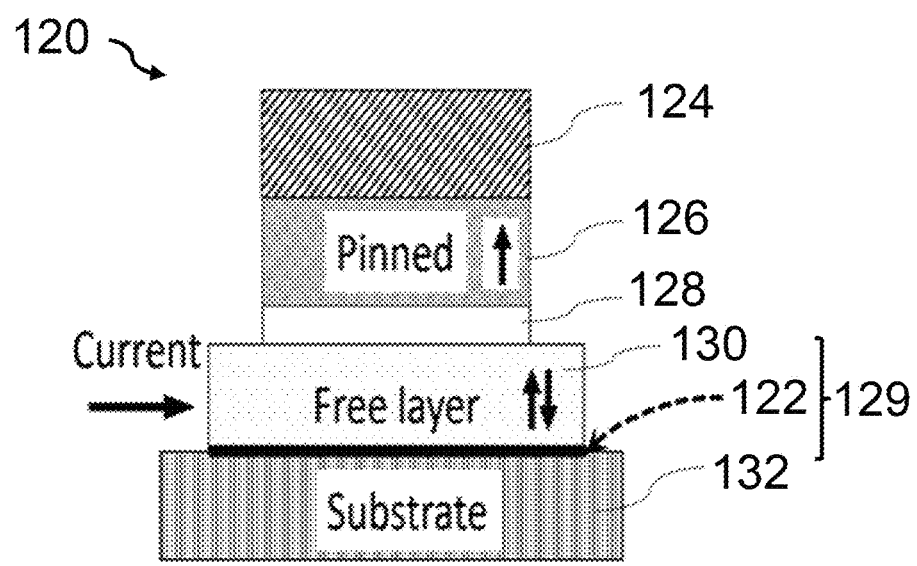

Two types of structures which may be used to realize the SOT-induced magnetization switching of the magnetic layer are shown in FIGS. 1A and 1B. FIG. 1A shows a schematic 100 of a magnetic tunnel junction (MTJ) element by utilizing the current induced out-of-plane SOT (i.e. the "3m" torque) at the heavy metal/ferromagnet (i.e. spin source layer/magnetic layer) interface 102, while FIG. 1B shows a schematic 120 of the MTJ element utilizing the current induced out-of-plane SOT at the ferromagnet/substrate (i.e. magnetic layer/substrate layer) interface 122. The interfaces 102 and 122 as shown in FIGS. 1A and 1B have been exaggerated for clarity. They are not to be interpreted as requiring a separate material layer as such.

As shown in FIG. 1A, the MTJ element comprises a top terminal 104 (e.g. an electrically conductive terminal) deposited on a magnetic pinned layer 106 formed on an insulating tunneling layer 108. On the other side of the insulating tunneling layer 108 is a SOT unit 109 comprising a magnetic free layer 110 and a spin source layer 112. The magnetic free layer 110 is termed as a "free" layer because it has a switchable (or "free") magnetization direction. Similarly, the magnetic pinned layer 106 is termed as a "pinned" layer because it has a fixed or pinned magnetization direction. The SOT unit 109 is in turn formed on a substrate 114. As shown in FIG. 1A, an interface 102 is formed between the magnetic free layer 110 and the spin source layer 112, where the interface 102 has a "3m1" symmetry. Therefore, in this embodiment of FIG. 1A, an interfacing layer comprises the spin source layer 112, where the interface 102 having the 3m1 crystallographic point group symmetry is formed between the spin source layer 112 and the magnetic layer 110. The spin source layer 112 serves to provide a spin current source for generating the "3m" torque in this embodiment. The spin source layer 112 may be any layer formed with the "3m1" symmetry at the interface, and may include CuPt, Pt, Pd, Ir, Bi, Au, Cr, Ru, Co, Fe, Ni, or CoPt. The magnetic free layer 110 may be any materials with a perpendicular magnetic anisotropy, and may include CoPt, Co, $[Co/Ni]_N$ (N is the periodic number of the multilayer), CoTb, CoFe, CoFeB or NiFe. The substrate 114 may be an (111)-oriented substrate including $SrTiO_3$, MgO or $LaAlO_3$ substrate. In an embodiment, the substrate 114 may include a (0001)-oriented substrate including $Al_2O_3$, or a silicon substrate with a Ta/Ru or Ta/Ti buffer layer. Although only several combinations of spin source layer/free layer have been listed here, it should be appreciated that a vast number of variations exist for the spin source layer/free layer combination as long as the requirement of the "3m1" symmetry is satisfied at the interface 102 between the spin source layer 112 and the magnetic free layer 110. As discussed above, the 3m1 symmetry at the spin source layer/free layer interface 102 allows for the out-of-plane type "3m" torque, which can induce field-free (i.e. in an absence of a magnetic field or without assistance from a magnetic field) magnetization direction switching of the magnetic free layer 110 under the application of an electric current.

FIG. 1B is similar to FIG. 1A except for the absence of the spin source layer 112. As shown in FIG. 1B, the MTJ element comprises a top terminal 124 deposited on a magnetic pinned layer 126 formed on an insulating tunneling layer 128. On the other side of the insulating tunneling layer 128 is a SOT unit 129 comprising a magnetic free layer 130 and a top surface of a substrate 132. As shown in FIG. 1B, an interface 122 is formed between the magnetic free layer 130 and the substrate 132, where the interface has a 3m1 symmetry. Therefore, in this embodiment of FIG. 1B, the interfacing layer which forms the interface 122 with the magnetic free layer 130 is the substrate layer 132. The magnetic free layer 130 may have a perpendicular magnetic anisotropy and may include CoPt, Co, $[Co/Ni]_N$ (N is the periodic number of the multilayer), CoTb, CoFe, CoFeB, NiFe or $Co_\alpha Cu_\beta Pt_{(1-\alpha-\beta)}$. The substrate 132 may include (111)-oriented $SrTiO_3$, MgO or $LaAlO_3$. In an embodiment, the substrate 132 may include a (0001)-oriented $Al_2O_3$ substrate or a buffer layer on silicon substrate. The "3m1" symmetry at the interface 122 of the free layer 130 and the substrate 132 allows for the out-of-plane type "3m" torque, which can induce the field-free magnetization direction switching of the magnetic free layer 130 under the application of an in-plane electric current through the magnetic free layer 130.

As shown in FIG. 1A, where the spin source layer 112 is provided in the MTJ element, the electric current flows through the spin source layer 112. In comparison, for the embodiment of FIG. 1B, the interfacing layer comprises the substrate layer 132 and the interface 122 having the 3m1 crystallographic point group symmetry is formed between the magnetic layer 130 and the substrate layer 132. In an embodiment of FIG. 1B, the electric current flows through the substrate layer 132 (not shown) or the magnetic layer 130. Further, in each of these embodiments, the substrate layer 114, 132 serves to support the rest of the SOT device or the MTJ element. The readout signal for these MTJ device structures as shown in FIGS. 1A and 1B is the tunneling magnetoresistance (TMR). For these MTJ structures, switching of the magnetization direction of the magnetic layer 110, 130 by the "3m" torque provides at least two different resistance states which can be used for memory applications. The two resistance states are parallel (P) state and anti-parallel (AP) state. For P state, the magnetization directions of the magnetic free layer (i.e. "free" or "free layer" 110, 130 as shown in FIGS. 1A and 1B) and the magnetic pinned layer (i.e. "pinned" layer 106, 126 as shown in FIGS. 1A and 1B) are parallel and the tunnel resistance of the MTJ is low (R_low). For AP state, the magnetization directions of the magnetic free layer and the magnetic pinned layer are anti-parallel and the tunnel resistance of the MTJ is high (R_high). The tunnel magnetoresistance (TMR) ratio was defined as Ratio=(R_high−R_low)/R_low.

Example 2. Domain Wall Spintronics Devices Based on Interface Symmetry-Induced SOT In a second example, a SOT device can be deployed as a domain wall motion device, where the "3m" torque can be used to drive domain wall motion. This is shown in FIGS. 2A and 2B. FIG. 2A shows a schematic 200 of the domain wall motion device having a bilayer structure with a spin source layer/magnetic layer interface 202 having the "3m1" point group symmetry, while FIG. 2B shows a schematic 210 of the domain wall motion device having a single layer structure with a magnetic layer/substrate layer interface 212 having the "3m1" point group symmetry. M+ and M− in each of FIGS. 2A and 2B correspond to magnetization pointing up and down, respectively. DW1 and DW2 as shown in each of the FIGS. 2A and 2B denote a first and second domain walls respectively. A magnetization region (e.g. one or more magnetic domains) exists between two domain walls DW1 and DW2.

The magnetizations in DW1 (e.g. left domain wall) and DW2 (e.g. right domain wall) are in-plane and are typically of opposite directions. Under the application of an in-plane current in the spin source layer 204 for FIG. 2A, the out-of-plane "3m" torque acting on the magnetization at the left side of DW1 has an opposite direction compared to that which acts on the magnetization at the right side of DW2. Therefore, DW1 and DW2 move in opposite directions, which results in shrinkage or expansion of the magnetization region (e.g. a "M−" region) between DW1 and DW2. Thus, the application of an in-plane electric current drives the domain wall motion (both for DW1 and DW2) and can be used in specific domain wall motion devices.

Regarding the materials for the structure of FIG. 2A, the spin source layer 204 may include any layer with a "3m1" symmetry at the interface, such as CuPt, Pt, Pd, Ir, Bi, Au, Cr, Ru, Co, Fe, Ni, or CoPt. The magnetic layer 206 (e.g. a ferromagnetic layer) may include any materials with a perpendicular magnetic anisotropy, such as CoPt, Co, [Co/Ni]N (N is the periodic number of the multilayer), CoTb, CoFe, CoFeB, or NiFe. The substrate 208 may include a (111)-oriented $SrTiO_3$, MgO or $LaAlO_3$ substrate. In an embodiment, the substrate 208 may include a (0001)-oriented $Al_2O_3$ or a silicon substrate with Ta/Ru(0001), Ta/Ti (0001), or Ta buffer layer. Referring to FIG. 2B, a "3m1" symmetry is required at the magnetic layer/substrate layer interface 212. The magnetic layer 214 (e.g. a ferromagnetic layer) may also have a perpendicular magnetic anisotropy, and may include CoPt, Co, $[Co/Ni]_N$ (N is the periodic number of the multilayer), CoTb, CoFe, CoFeB, NiFe, or $Co_\alpha Cu_\beta Pt_{(1-\alpha-\beta)}$. The substrate 216 may include (111)-oriented $SrTiO_3$, MgO or $LaAlO_3$, or the substrate 216 may include (0001)-oriented $Al_2O_3$.

Example 3. Spin Memristor Based on Interface Symmetry-Induced SOT

In a third example, the 3m1 interface symmetry can be used to achieve "spin memristor" like behavior. A spin memristor is a memristor which utilizes an electron spin in a magnetic system to write or read information. A basic requirement for a spin memristor is its "multi-state" switching, where the memristor device can exhibit multiple resistance states with the application of an electric current or voltage.

Figure 3:
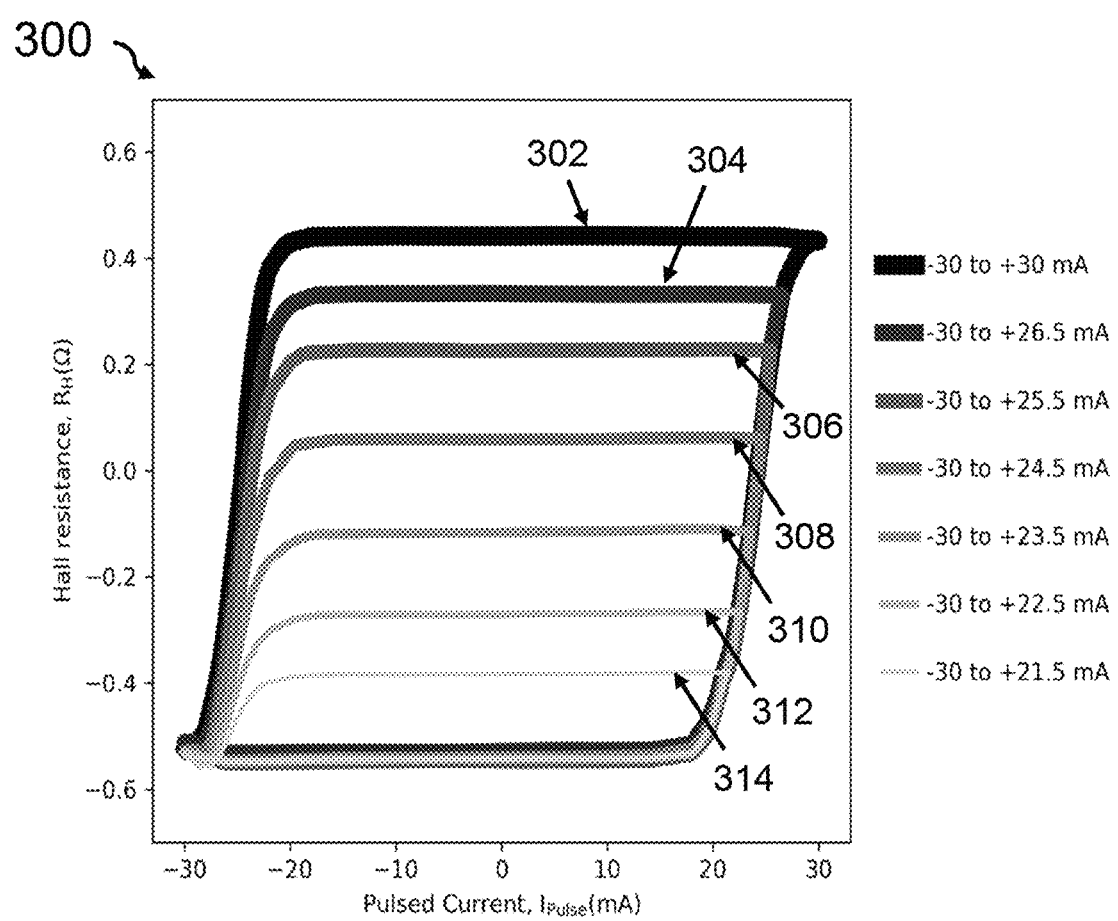
FIG. 3 shows plots of Hall resistance $R_H$ versus channel current $I_{pulse}$ in a 10 nm thick $Co_{40}Cu_{10}Pt_{50}$ thin film where loops of different thicknesses corresponds to different positive current amplitudes (30 mA (thickest loop), 26.5 mA, 25.5 mA, 24.5 mA, 22.5 mA, 21.5 mA (thinnest loop)) in accordance with an embodiment.

FIG. 3 shows the "spin-memristive" behavior observed in a $Co_{40}Cu_{10}Pt_{50}$ (10 nm)/MgO (111) device in accordance with an embodiment. In this embodiment, the spin-memristor has a similar device structure as FIG. 2B where a single magnetic layer (e.g. $Co_{40}Cu_{10}Pt_{50}$) is formed on a substrate layer (e.g. MgO (111) substrate). As shown in FIG. 3, plots 300 of Hall resistance $R_H$ versus channel current $I_{pulse}$ in a 10 nm thick $Co_{40}Cu_{10}Pt_{50}$ thin film are shown, where loops of different thicknesses correspond to different positive current amplitudes (30 mA (thickest loop 302), 26.5 mA (304), 25.5 mA (306), 24.5 mA (308), 23.5 mA (310), 22.5 mA (312), 21.5 mA (thinnest loop 314)). In other words, the thicker the line in FIG. 3, the larger the positive current amplitude used. In this example, no external magnetic field is applied. As shown in FIG. 3, a plurality of resistance states (or multiple Hall resistances) may be achieved by controlling an amplitude or magnitude of the electric current. Compare to traditional memristor designs that employ an AFM/FM (e.g., PtMn/$[CoNi]_N$ bilayer), realization of the spin-memristor of the present embodiment is achieved using a single layer structure (as long as a 3m1 symmetry interface is present between the magnetic layer and the substrate). This advantageously simplifies the device design and fabrication steps required.

Similar to the MTJ element and domain wall motion devices as shown above, two types of structures (a bilayer structure or a single layer structure) can be used for forming a spin memristor. For the bilayer structure of the spin memristor (not shown), the SOT unit consists of a spin source layer/ferromagnetic layer heterostructure. The spin source layer can be any layer with a "3m1" symmetry at the interface, and may include CuPt, Pt, Pd, Ir, Bi, Au, Cr, Ru, Co, Fe, Ni, or CoPt. The ferromagnetic layer may be any materials with a perpendicular magnetic anisotropy (PMA) such as CoPt, Co, [Co/Ni]$_N$ (N is the periodic number of the multilayer), CoTb, CoFe, CoFeB, or NiFe. The substrate may include a (111)-oriented SrTiO$_3$, MgO or LaAlO$_3$ substrate, or the substrate may include (0001)-oriented Al$_2$O$_3$ substrate. For the single layer structure of the spin memristor (not shown), a "3m1" symmetry exists at the ferromagnetic layer/substrate interface. The ferromagnetic layer may also have a perpendicular magnetic anisotropy (PMA) and may include CoPt, Co, [Co/Ni]$_N$ (N is the periodic number of the multilayer), CoTb, CoFe, CoFeB, NiFe, or Co$_\alpha$Cu$_\beta$Pt$_{(1-\alpha-\beta)}$. The substrate may include (111)-oriented SrTiO$_3$, MgO and LaAlO$_3$ substrate, or the substrate may include (0001)-oriented Al$_2$O$_3$. The "3m1" symmetry at the magnetic layer/substrate layer allows for the out-of-plane type "3m" torque, which can induce the field-free magnetization switching of the magnetic layer under the application of an in-plane electric current.

As described above, the SOT devices of these examples share a similar structure. To fabricate one of these devices, first, various layers, including at least the aforementioned magnetic layer, are grown using one or more deposition methods (such as sputtering, molecular beam epitaxy (MBE) and/or e-beam evaporation) on a substrate. For embodiments where the interfacing layer is a substrate layer, the magnetic layer is deposited adjacent to the substrate layer to form the 3m1 symmetry interface between the magnetic layer and the substrate layer. For embodiments where the interfacing layer is a spin source layer, the 3m1 symmetry interface is formed between the magnetic layer and the spin source layer. In these cases, the magnetic layer/spin source layer heterostructure is deposited on the substrate. Details for forming an exemplary magnetic layer/spin source layer heterostructure such as a L1$_1$-ordered CuPt/CoPt bilayer structure are provided below. Once a suitable layered structure is deposited on the substrate, the layered structure is fabricated into a nano sized device (such as a three-terminal magnetic tunnel junction, a two-terminal domain wall device or a two-terminal spin memristor described above) using lithography techniques. For a typical lithography process, the layered structure is coated with a photoresist. Then a mask aligner is used to focus, align, and expose the photoresist for forming a device pattern on the layered structure. The exposed regions of the photoresist are washed away by a developer solution and the device pattern is transferred to the layered structure. The regions without the photoresist are then exposed to an etching process, where one or more layers of the layered structure can be etched away to create the desired device structure. The remaining photoresist is then removed. It will be appreciated by the skilled person in the art that the lithography process as described can be performed one or more times during a fabrication of the SOT device to create the desired device structure.

Experimental results demonstrating the interface symmetry induced spin torque generated as a result of the 3m1 crystallographic point group symmetry interface in the SOT device are now discussed. In the following descriptions, an embodiment comprising a L1 CuPt/CoPt bilayer structure is used as an example of a bilayer structure (in relation to FIGS. 4 to 23B), while an embodiment comprising a Co$_x$Pt$_{100-x}$ single material layer having a composition gradient is used as an example of a single layer structure (in relation to FIGS. 24 to 40). However, as discussed above, it should be appreciated that any combination of bilayer and/or single layer structures may be used as long as a 3m1 symmetry interface is present in the device structure.

Method for Fabricating a SOT Device Having an Interface with a 3m1 Crystallographic Point Symmetry As described above, the spin-orbit torque (SOT) device comprises an interfacing layer and a magnetic layer having a switchable magnetization direction, where an interface between the interfacing layer and the magnetic layer has a 3m1 crystallographic point group symmetry adapted to interact with an electric current to generate a spin torque for switching the magnetization direction of the magnetic layer.

Accordingly, a method for fabricating the SOT device comprises: (i) providing an interfacing layer and (ii) forming a magnetic layer having a switchable magnetization direction on the interfacing layer, where an interface is formed between the interfacing layer and the magnetic layer, the interface having a 3m1 crystallographic point group symmetry adapted to interact with an electric current to generate a spin torque for switching the magnetization direction of the magnetic layer. As it is clear from FIGS. 1A, 1B, 2A and 2B, the interfacing layer can either be a spin source layer or a substrate layer. Therefore, providing an interfacing layer in one embodiment may include providing an appropriate substrate layer (e.g. a single-crystal SrTiO$_3$ (111) substrate), or in another embodiment may include depositing an appropriate spin source layer (e.g. a heavy metal or CuPt). Forming the magnetic layer having a switchable magnetization may include depositing a magnetic layer (e.g. CoPt) on the interfacing layer (e.g. the substrate layer or the spin source layer). The interface is formed once the magnetic layer is formed/deposited on the interfacing layer (e.g. the substrate layer or the spin source layer).

Method for Fabricating the L1$_1$-Ordered CuPt/CoPt Bilayer Structure for a SOT Device For the present embodiment, a L1$_1$-ordered Cu$_{50}$Pt$_{50}$ (10 nm)/Co$_{50}$Pt$_{50}$ (4 nm) bilayer is deposited on a single-crystal SrTiO$_3$ (111) substrate, where CuPt is used as a spin-source material and CoPt is the ferromagnetic (FM) layer to probe the spin-torque. L1$_1$ CoPt is chosen because it has a large perpendicular magnetocrystalline anisotropy (~10$^7$ erg/cc). Compared with the interfacial magnetic anisotropy in conventional HM/FM bilayers, the bulk magnetic anisotropy in L1$_1$ CoPt enables higher memory density with an excellent thermal stability.

The L1$_1$-ordered Cu$_{50}$Pt$_{50}$ (10 nm)/Co$_{50}$Pt$_{50}$ (4 nm) bilayer was epitaxially deposited on SrTiO$_3$ (111) single-crystal substrate by d.c. magnetron sputtering (AJA). For the deposition of CuPt, the Ar pressure was 5 mTorr and the temperature was 500° C. The sputtering powers for Cu target and Pt target were both 50 W. The deposition rates of Cu and Pt were 0.07 nm/s and 0.071 nm/s, respectively. For the deposition of CoPt, the Ar pressure was 6 mTorr and the temperature was 300° C. The sputtering powers for Co target and Pt target were 32 W and 21 W, respectively. The deposition rates of Co and Pt were 0.02 nm/s and 0.03 nm/s. Then the bilayer was left to cool down to room temperature and a 2 nm SiO$_2$ protection layer was deposited. After deposition, the films were patterned into 5 µm Hall bars with different in-plane orientations by using laser writer and Ar ion milling. Then the contact electrode pattern was defined by laser writer and followed by the deposition of Ti (5 nm)/Cu (100 nm) and the lift-off process.

The L1$_1$-Ordered CuPt/CoPt Bilayer Structure

FIG. 4 shows a schematic 400 of a crystal structure of L1$_1$ CuPt (or L1$_1$ CoPt), where Cu (Co) and Pt atomic layers alternatively stack along the [111] direction in a rhombohedral structure with the lattice parameter a=5.340 Å and the lattice angle γ=61.5 degree. All crystallographic directions used in the present disclosure are denoted with the rhombohedral lattices. For example, [111] refers to [111]$_r$. The subscript r (rhombohedral) herein after has been omitted for simplicity. The L1$_1$ CuPt and L1$_1$ CoPt have a same rhombohedral structure as shown in FIG. 4.

FIGS. 5A, 5B and 5C show plane views 500, 502, 504 of the L1$_1$ CuPt crystal structure projected along the [111] direction. For simplicity, only the atoms within the hexagon region (grey colored) are shown. As shown in FIG. 5B, this structure possesses mirror symmetry with respect to the (1-10) plane (the plane that is perpendicular to the [1-10] axis). As shown in FIG. 5C, there is no mirror symmetry in the (11-2) plane (the plane that is perpendicular to the [11-2] axis). Therefore, for the (111) plane in this crystal structure, [11-2] can be defined as the high-symmetry axis while [1-10] can be defined as the low-symmetry axis. These high-symmetry and low-symmetry axes are indicated by the dashed lines in FIG. 5B and FIG. 5C respectively. Under this definition, there are three identical high-symmetry axes and three identical low-symmetry axes in the (111) plane. In other words, a low-symmetry axis resides in a crystal plane which has no mirror symmetry. These are shown in FIGS. 6A and 6B respectively.

FIGS. 6A and 6B show illustrations of symmetry axes in the (111) plane of L1$_1$ CuPt, where FIG. 6A shows an illustration 600 of the high-symmetry axes in the (111) plane of L1$_1$ CuPt and FIG. 6B shows an illustration 602 of the low-symmetry axes in the (111) plane of L1$_1$ CuPt. As shown in each of FIGS. 6A and 6B, the Pt atomic layer (white color at center) was sandwiched by two Cu atomic layers (one with black color and the other with light grey color). The symmetry as shown in FIGS. 5B and 5C is quite similar to that of the surface crystal structure of WTe$_2$.

FIG. 7 shows a plot 700 of the θ-2θ X-ray diffraction spectra of a CuPt (10 nm)/CoPt (4 nm) bilayer deposited on the SrTiO$_3$ (111) substrate in accordance with an embodiment, where the (111) peak indicates the L1$_1$ phase of the CuPt (10 nm)/CoPt (4 nm) bilayer. As shown in the plot 700, the (111) peaks for CuPt and CoPt coincide because of their closed lattice parameters. The epitaxial growth of the bilayer was confirmed by the cross-sectional scanning transmission electron microscopy (STEM), as shown in FIG. 8.

FIG. 8 shows a high-angle annular dark-field (HAADF)-STEM image 800 of the CuPt (10 nm)/CoPt (4 nm) bilayer in accordance with an embodiment. The STEM samples of the CuPt/CoPt bilayer were fabricated by a focused ion beam machine (FEI Versa 3D system). The sample was thinned down using a Ga ion beam first with an accelerating voltage of 30 kV and then 8 kV. After that, the sample was polished by a 2 kV ion beam. The structure characterization was conducted with a JEOL ARM200 STEM which is equipped with an ASCOR probe corrector operating at an accelerating voltage of 200 kV. The HAADF image was acquired with a probe forming angle of 30 mrad and a collection angle of 68-280 mrad.

As shown in FIG. 8, a sharp CuPt/CoPt interface (see e.g. the dashed line 802) is observed. The 10 nm CuPt layer on the bottom has a well-arranged atomically layered structure where the brighter atoms are Pt and the lighter ones are Cu. In contrast, for the 4 nm CoPt layer on the top, the intensity contrast of the elements is not sufficient for clearly distinguishing the Co and Pt atoms, which indicates a lower chemical ordering parameter in the CoPt, compared with that in CuPt.

FIGS. 9A and 9B show side views 902, 904 of the L1$_1$ crystal structure of FIG. 4 in accordance with an embodiment. FIG. 9A shows a side view 902 of CuPt (or CoPt) projected from the [-1-12] direction, and FIG. 9B shows a side view 904 of CuPt (or CoPt) projected from the [-110] direction. The well-arranged atomically layer structure as shown in FIG. 8 can be compared with the crystal structure as shown in FIG. 9B.

Electrical Transport Measurements of L1$_1$ CuPt/CoPt Bilayer Hall Bar Devices

FIGS. 10A and 10B show schematics 1002, 1004 of the CuPt/CoPt Hall bar for electrical transport measurement in accordance with the present embodiment. FIG. 10A shows a schematic 1002 of the CuPt/CoPt Hall bar having the same x and y-axes as that in FIG. 10B. FIG. 10B shows a schematic 1004 of the CuPt/CoPt Hall bar 1006 in relation to crystalline directions where the electric current applied along the Hall bar has an azimuth angle of θ$_I$ defined with respect to the [1-10] direction.

In the present embodiment, the L1$_1$ CuPt/CoPt bilayer was fabricated into Hall bar devices for electrical transport measurements. The Hall bars have varying azimuth angles with respect to the [1-10] direction so that the electric current (I) can be applied along different in-plane directions (θ$_I$) as depicted in FIG. 10B.

FIG. 11 shows a graph 1100 of the anomalous Hall effect of the L11 CuPt/CoPt bilayer of the Hall bar of FIG. 10B when the azimuth angle, θ$_I$ is at 0 degree, in accordance with an embodiment. The squared loop indicates a good perpendicular magnetic anisotropy of the CuPt/CoPt bilayer.

Figure 12:
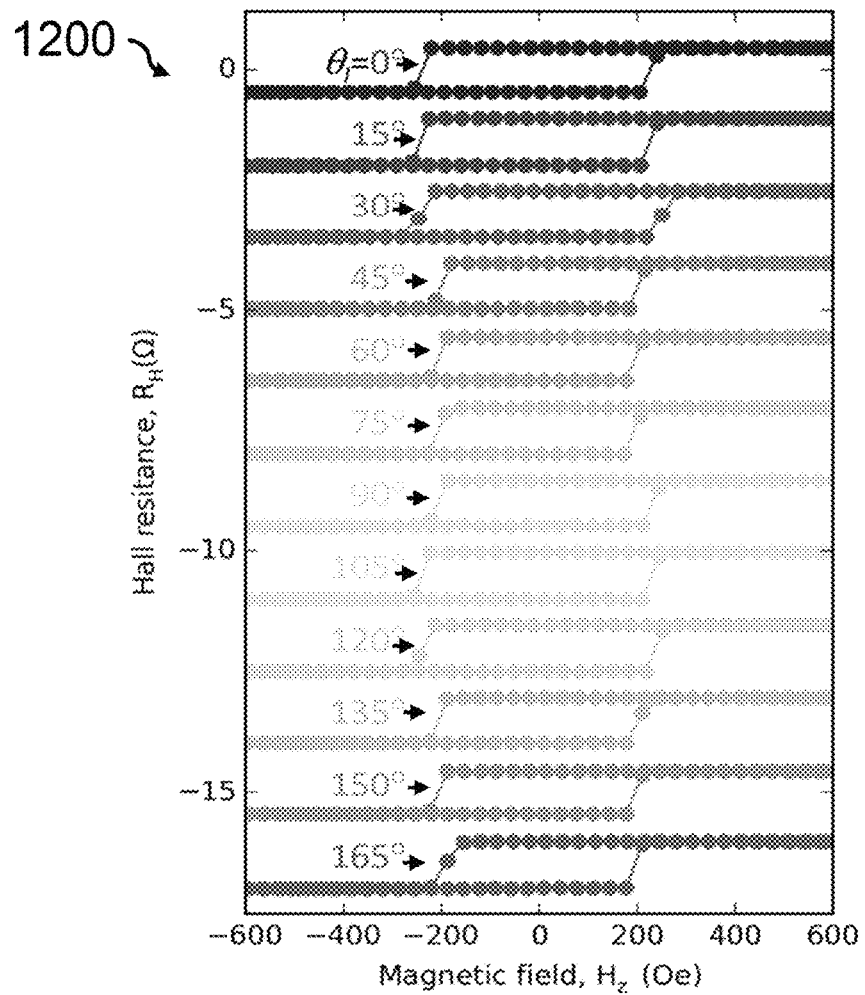
FIG. 12 shows plots of anomalous Hall loops for CuPt/CoPt Hall bars with different current flowing angles, $\theta_I$ (from 0° to 165°) in accordance with an embodiment.

FIG. 12 shows plots 1200 of the anomalous Hall resistance loops of the CuPt (10 nm)/CoPt (4 nm) bilayer for other azimuth angles from 0 degree to 165 degrees in accordance with an embodiment. As shown in FIG. 12, the coercive field is between 150 Oe to 250 Oe, and the Hall resistance keeps a constant of about 0.45Ω. The squared loops obtained for all angles again indicate a good perpendicular magnetic anisotropy of the CuPt/CoPt bilayer.

Figure 13:
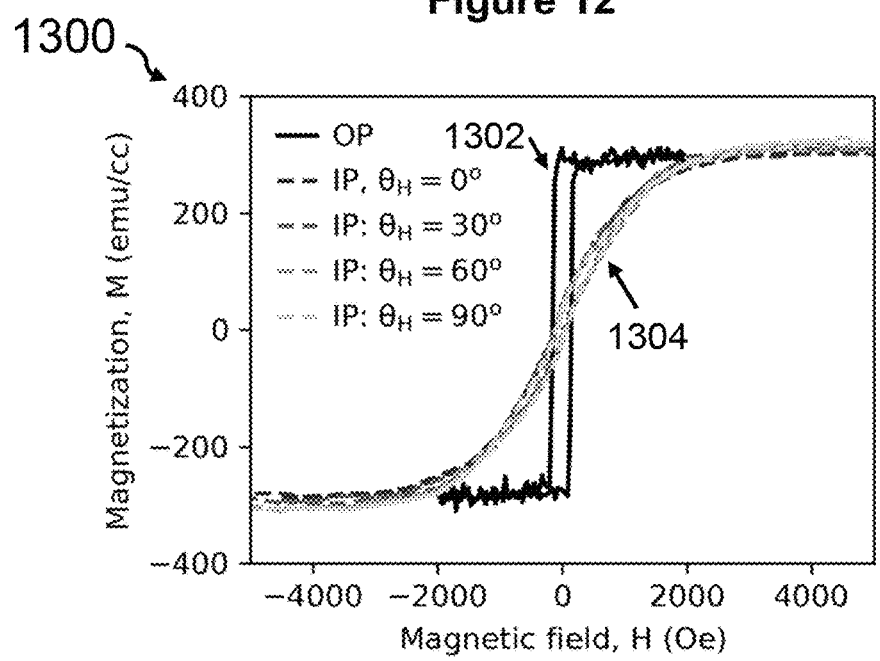
FIG. 13 shows plots of out-of-plane (OP) and in-plane (IP) magnetic hysteresis loops for the CuPt (10 nm)/CoPt (4 nm) bilayer of FIG. 7 to demonstrate its magnetic anisotropy in accordance with an embodiment, where OP refers to the film normal direction ([111]) and IP is in relation to the azimuth angle, $\theta_H$, between [1-10] direction and the magnetic field direction.

FIG. 13 shows plots 1300 of the out-of-plane (OP) 1302 and in-plane (IP) 1304 magnetic hysteresis loops (M-H) for the CuPt/CoPt bilayer before patterning. OP refers to the film normal direction ([111]). For in-plane configuration, eH is the azimuth angle between the [1-10] direction and the magnetic field direction. The square shape of the out-of-plane hysteresis curve 1302 and the small remanence in the in-plane hysteresis curves 1304 as shown in FIG. 13 further confirm the good perpendicular magnetic anisotropy in the CuPt/CoPt bilayer.

Current-Induced Magnetization Switching

FIGS. 14 to 23A-23B relate to experimental results for current-induced magnetization switching in the CuPt/CoPt bilayer Hall bars. In current-induced magnetization switching measurement, for each data point, a pulsed d.c. electric current with a duration of 30 μs was applied. After 8 seconds, the Hall resistance was recorded by using a small a.c. excitation current (50 μA).

Figure 14:
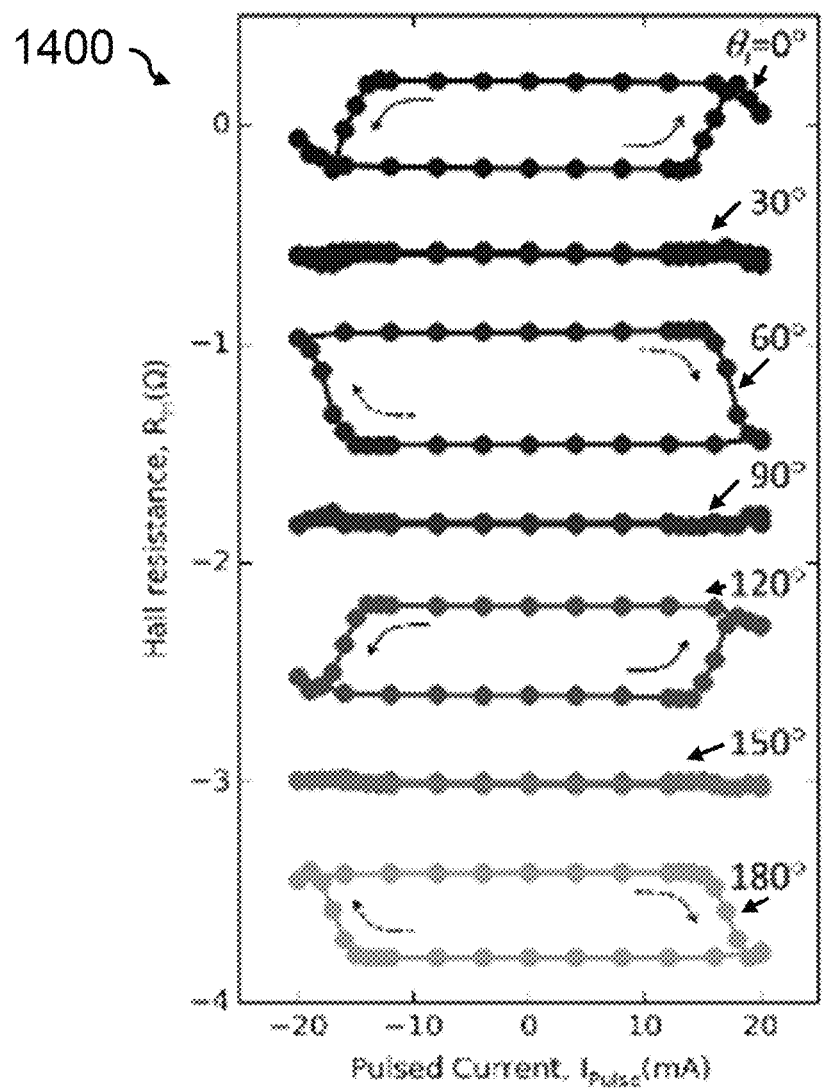
FIG. 14 shows plots of current-induced magnetization switching for CuPt/CoPt Hall bars with different $\theta_I$ in accordance with an embodiment, where the dashed curved arrows indicate clockwise switching polarity and the solid curved arrows indicate anti-clockwise switching polarity.

FIG. 14 shows plots 1400 of current-induced magnetization switching for CuPt/CoPt Hall bars with different θ$_I$ in accordance with an embodiment. As shown in FIG. 14, a pulsed d.c. current (with a duration of 30 μs) was swept, and the Hall resistance for Hall bars with different azimuth angles θ$_I$ was measured. The dashed arrows indicate clockwise switching polarity while the solid arrows indicate anti-clockwise switching polarity. No external magnetic field was applied for these measurements. As shown in FIG. 14, the switching behavior varies dramatically with θ$_I$. With a current density of about 2.4×10$^7$ A/cm$^2$, the magnetization can be reversibly switched at certain angles (θ$_I$=0°, 60°, 120°, and 180°). The switching polarity for 9=0° and 120' is anti-clockwise while that for θ$_I$=60° and 180° is clockwise. For 9=30°, 90°, and 150°, the switching loops disappear, which means the magnetization cannot be switched by the electric current. Using the plots 1400 as shown in FIG. 14, a switched resistance ΔR can be defined as the difference between the Hall resistance when the current pulse is swept from 20 mA to 0 mA and that when the current pulse is swept from −20 mA to 0 mA.

Figure 15:
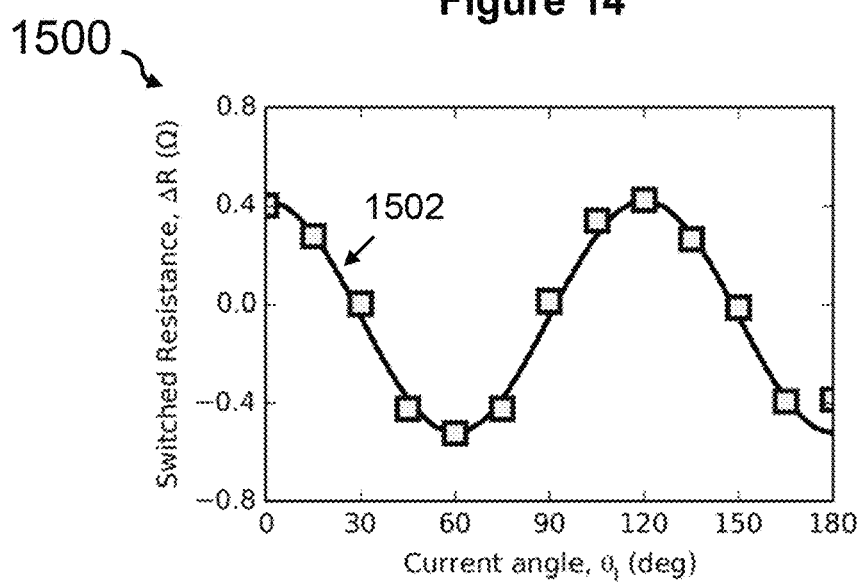
FIG. 15 shows a plot of switched resistance $\Delta R$ (Ω) versus current angle, $\theta_I$ to demonstrate current angle dependence of the SOT induced magnetization switching in accordance with an embodiment.
Figure 16:
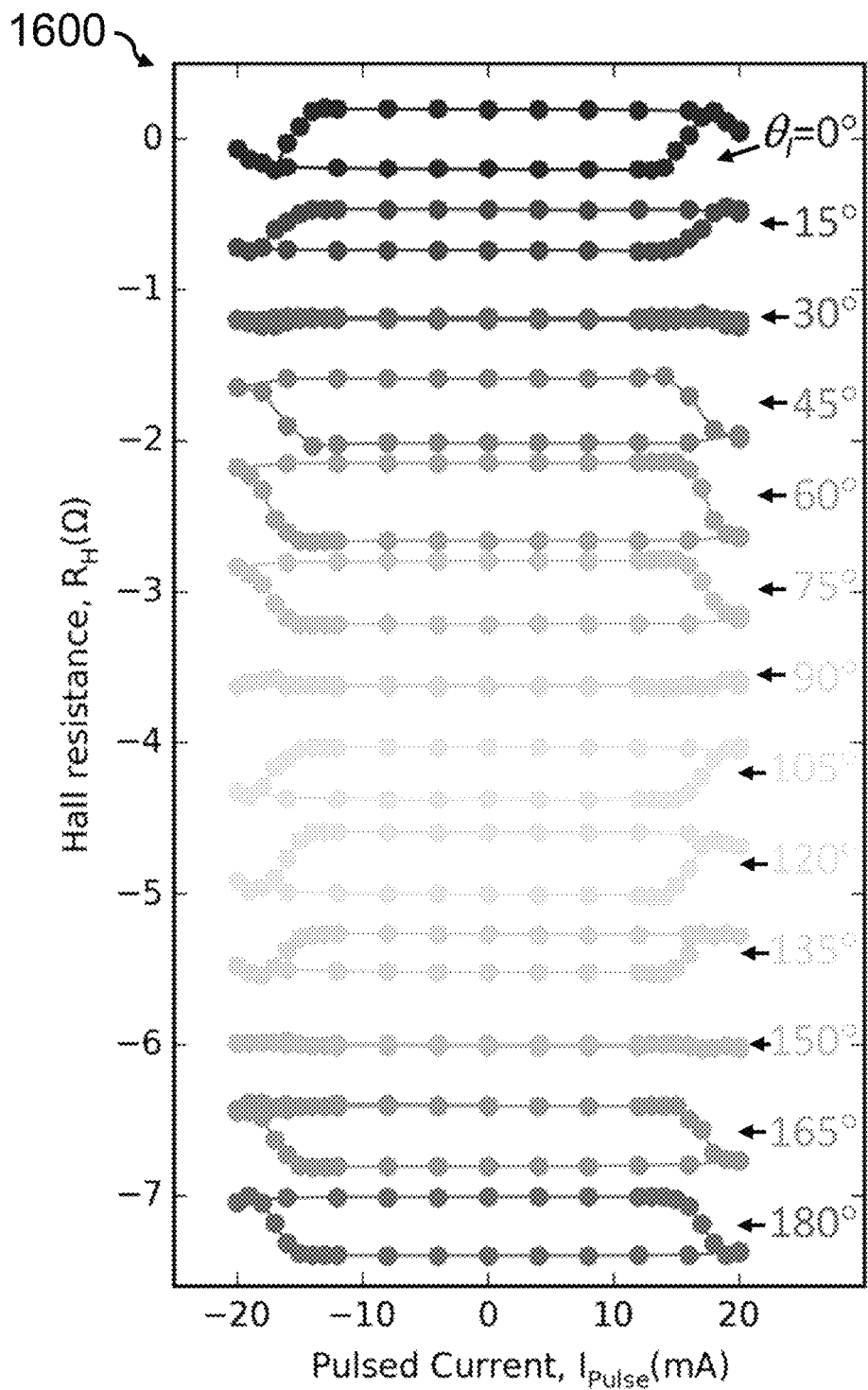
FIG. 16 shows plots of Hall resistance, $R_H$ (Ω) versus pulsed current, $I_{Pulse}$ (mA) to demonstrate current induced magnetization switching of the CuPt (10 nm)/CoPt (4 nm) bilayer for different $\theta_I$ in accordance with an embodiment.

FIG. 15 shows a plot 1500 of switched resistance ΔR (Ω) versus current angle, $\theta_I$ to demonstrate current angle dependence of the SOT induced magnetization switching in accordance with an embodiment. FIG. 15 is plotted using the data from FIG. 14 and additional data for other current angles, $\theta_I$ (e.g. 45 degree) not shown in FIG. 14. A cosine function 1502 (the solid line in FIG. 15 as shown) is used to fit the $\theta_I$ dependence of ΔR with a period of 120 degree, demonstrating a 3-fold angular dependence of the switched resistance ΔR. According to the symmetry argument as discussed above in relation to FIGS. 5B and 5C, the field-free switching occurred when the current was applied along the low-symmetry axes, whereas it is prohibited when the current was applied along the high-symmetry axes. It is worth noting that the field-free switching (with smaller ΔR) also exists at some other values of θ (15 degree, 45 degree, 75 degree, 105 degree, 135 degree, 165 degree) that are neither along the high-symmetry axes nor along the low-symmetry axes. The raw data which demonstrate these is shown in FIG. 16 which includes plots 1600 of Hall resistance, $R_H$ (Ω) versus pulsed current, $I_{Pulse}$ (mA) to demonstrate current induced magnetization switching of the CuPt (10 nm)/CoPt (4 nm) Hall bars for different $\theta_I$.

To understand this symmetry-dependent field-free perpendicular magnetization switching, the current-induced effective fields were measured. Current-induced effective fields are commonly used to characterize the SOT in HM/FM heterostructures. The damping-like effective fields of the CuPt/CoPt bilayer can be estimated by using harmonic Hall voltage analysis.

FIG. 17A shows plots 1700 of the first ($V_\omega$) 1702 and second ($V_{2\omega}$) harmonic Hall signals 1704 for the Hall bar with $\theta_I$=0 degree when the in-plane magnetic field ($H_x$) was swept in a small field range, in accordance with an embodiment. The a.c. excitation current used has an amplitude of 5 mA. FIGS. 17B and 17C show the first harmonic signals 1710 as a function of the longitudinal magnetic field and the second harmonic signals 1720 as a function of the longitudinal magnetic field respectively at other $\theta_I$ from 0 degree to 180 degree. For each angle of $\theta_I$, the upper (lower) data set is for M+ (M−). The solid lines are parabolic fits and linear fits to the data in FIGS. 17B and 17C, respectively.

Thermal electrical effects (anomalous Nernst effect and spin Seebeck effect) can contribute to the second harmonic signal. The contribution can be estimated from a large-field measurement in relation to FIGS. 18A to 18D. The magnetization lies in the in-plane direction when the external magnetic field $H_x$ is larger than the magnetic anisotropy $H_K$. Then the second harmonic Hall signal (or the second harmonic Hall resistance) can be expressed as:

$$R_{xy}^{2\omega} = \frac{R_{AHE}}{2}\frac{H_{DL}}{H_x - H_K} + \frac{R_{PHE}}{2}\frac{H_{FL}}{H_K} + R_{ANE+SSE},$$

where $R_{AHE}$ and $R_{PHE}$ are the anomalous Hall signal (or anomalous Hall resistance) and planar Hall signal (or planar Hall resistance), respectively. $R_{ANE+SSE}$ is the thermoelectric contribution which is a constant where $H_x$ is larger than $H_K$.

Figure 18A:
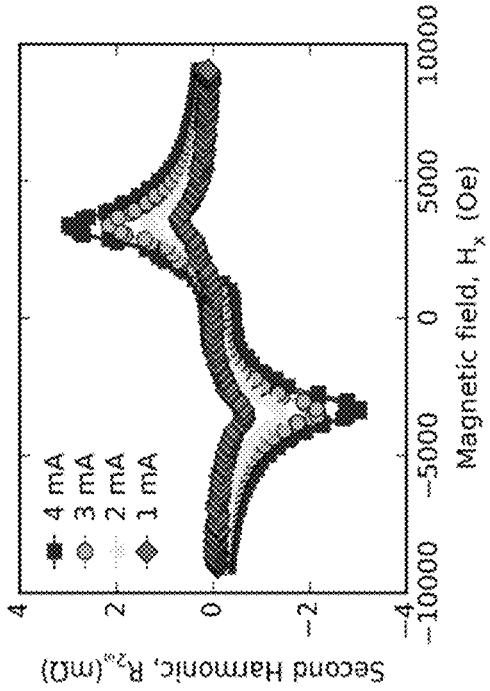
FIGS. 18A, 18B, 18C and 18D show plots for estimating thermoelectric effect in harmonic Hall signals for the Hall bar device with $\theta_I=0°$ in accordance with an embodiment, where
Figure 18B:
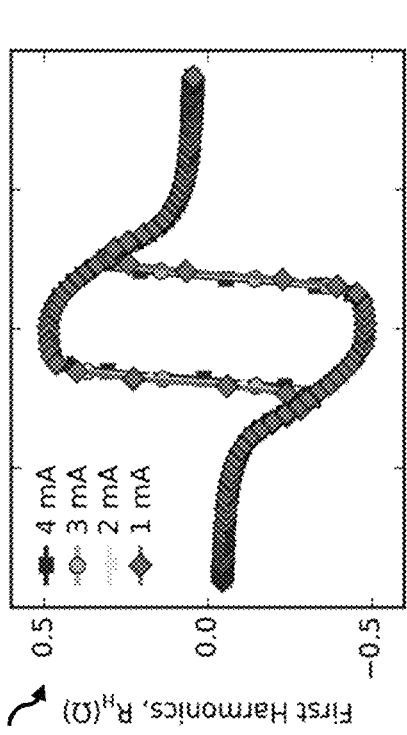
Figure 18C:
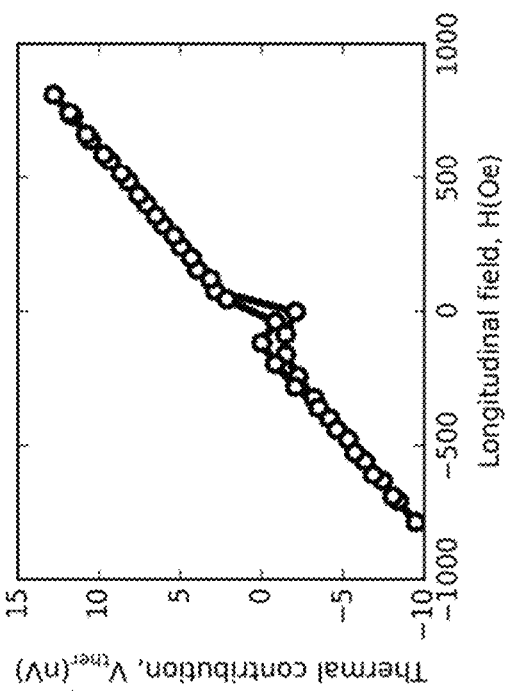
Figure 18D:
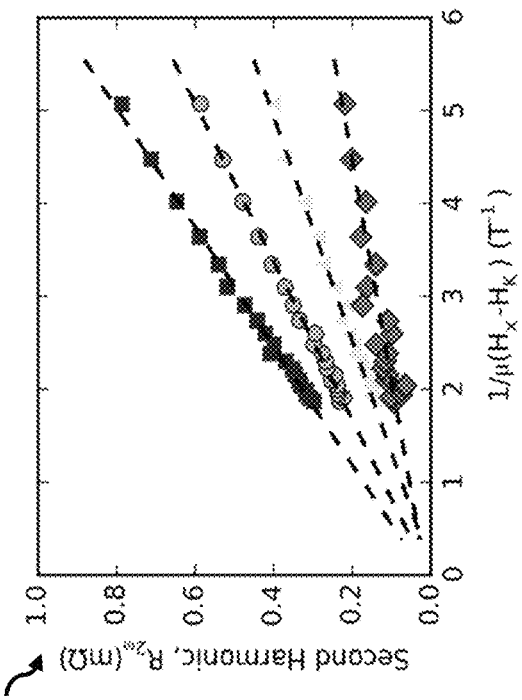

FIGS. 18A and 18B show plots 1802, 1804 of the $H_x$ dependence of the first and second harmonic Hall signal, respectively, for different applied a.c. currents (1 mA, 2 mA, 3 mA, 4 mA). The different applied a.c. currents are represented by different shapes of the data points—where data points for 1 mA are represented by diamonds, data points for 2 mA are represented by triangles, data points for 3 mA are represented by circles and data points for 4 mA are represented by squares. Since $R_{PHE}$ (~0.03Ω) is much lower than $R_{AHE}$ (~0.45Ω), the second term in the above expression can be neglected. FIG. 18C shows plots 1806 of the second harmonic signal as a function of $1/(\mu H_x - \mu H_K)$ for the different applied a.c. currents (data points for 1 mA are represented by diamonds, data points for 2 mA are represented by triangles, data points for 3 mA are represented by circles and data points for 4 mA are represented by squares), which are well fitted to the dashed lines as shown. The fitting parameter $R_{ANE+SSE}$ is around 0.02 mΩ. Its contribution in the small field range can be calculated as $R_{ANE+SSE}\sin(\theta_M)$, where $\theta_M$ is the polar angle of the magnetization and can be calculated from the first harmonic signal. FIG. 18D shows a plot 1808 of the field dependence of the calculated thermal contribution for an a.c. current of 5 mA, which gives a 25 nV change in the range from −1000 Oe to 1000 Oe. In comparison, the total second harmonic Hall signal change is 500 nV as shown in FIG. 17A. Accordingly, the thermal contribution is less than 5% and has been deducted to obtain the final damping-like effective field. The thermal contribution for other $\theta_I$ has also been measured and it is confirmed that thermal contribution only gives a small correction to the final result of the SOT effective field.

Accordingly, after excluding the thermoelectric contribution as shown in FIGS. 18A to 18D, the damping-like effective field ($\Delta H_{DL}$) can be obtained using the formula:

$$\Delta H_{DL} = -2\frac{B_L + 2\xi B_T}{1 - 4\xi^2},$$

where $B_{L(T)}$ is defined as $$\left\{\frac{\partial V_{2\omega}}{\partial H}\bigg/\frac{\partial^2 V_\omega}{\partial H^2}\right\}_{L(T)}.$$

$\xi$~0.07 is me ratio of planar Hall voltage to anomalous Hall voltage.

Figure 19A:
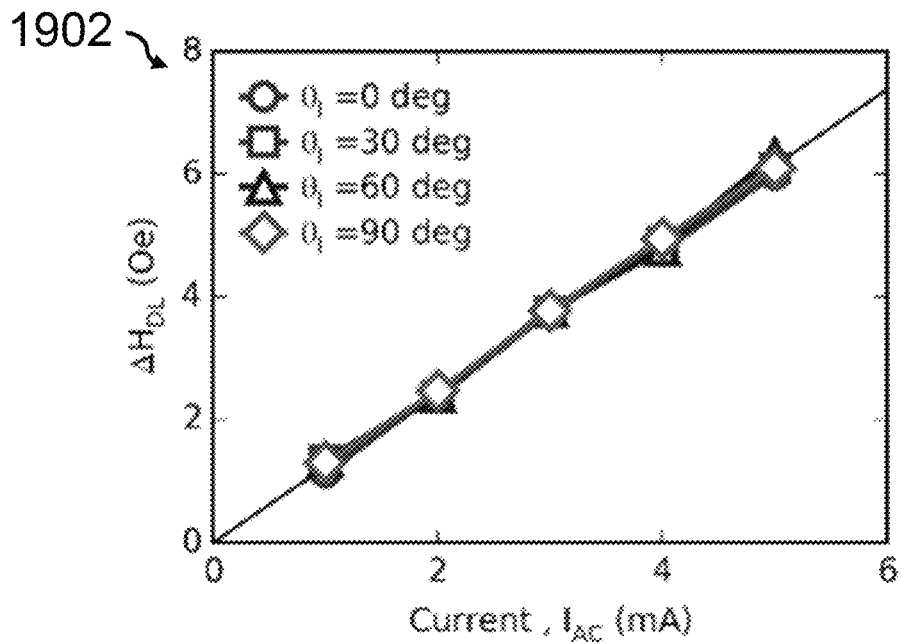
FIGS. 19A and 19B show plots in relation to the damping-like effective field in accordance with an embodiment, where
Figure 19B:
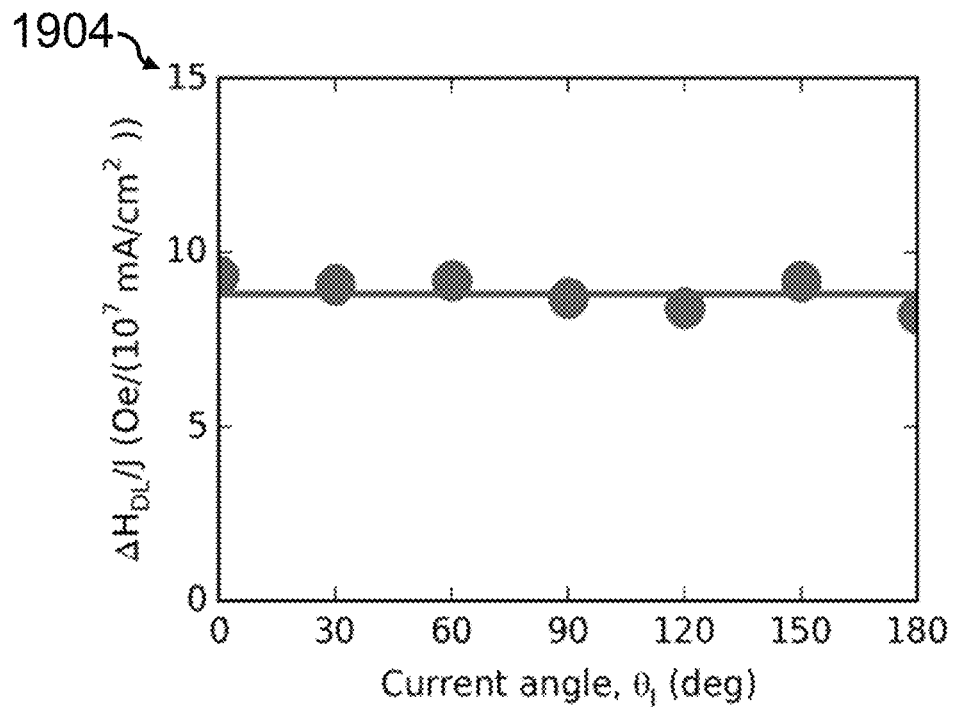

FIGS. 19A and 19B show plots 1902, 1904 in relation to the damping-like effective field. FIG. 19A shows plots 1902 of $\Delta H_{DL}$ versus a.c. excitation current $I_{AC}$ (mA) for $\theta_I$=0 degree (circle), $\theta_I$=30 degree (square), $\theta_I$=60 degree (triangle) and $\theta_I$=90 degree (diamond). As shown in FIG. 19A, the results for 0 degree and 60 degree (low-symmetry axes) are almost the same as that for 30 and 90 degree (high-symmetry axes).

FIG. 19B shows a plot 1904 of damping-like effective fields obtained for varying $\theta_I$ with a solid guiding line. According to the linear fit, the spin torque efficiency ($\Delta H_{DL}/J_{ac}$) is calculated to be around 9 Oe/(1×10$^7$ A/cm$^2$) and remains almost constant when varying $\theta_I$. In general, the in-plane damping-like torque in the HM/FM bilayer was considered to mainly originate from the spin Hall effect of the HM layer. The result as shown in FIG. 19B indicates an isotropic spin Hall angle along different crystalline directions, consistent with a previous report for the Pt/Fe bilayer, although anisotropic spin Hall conductivity was theoretically suggested in nonmagnetic metals.

Besides the in-plane SOT effective field, the out-of-plane SOT effective field ($\Delta H_{OOP}$) is also characterized by measuring the anomalous Hall loop by applying different d.c. currents. FIGS. 20A to 20F show plots 2002, 2004, 2006, 2008, 2010, 2012 of data in relation to this out-of-plane SOT effective field ($\Delta H_{OOP}$).

Figure 20A:
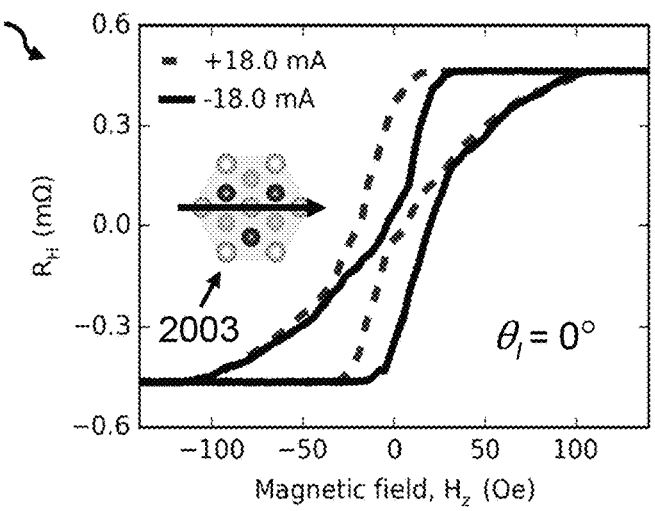
FIGS. 20A to 20F show plots of data in relation to the out-of-plane SOT effective field ($\Delta H_{OOP}$) in accordance with an embodiment, where
Figure 20B:
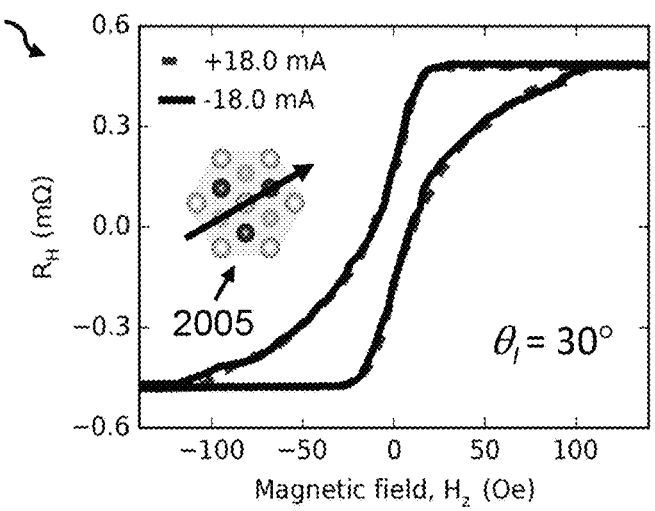
Figure 20C:
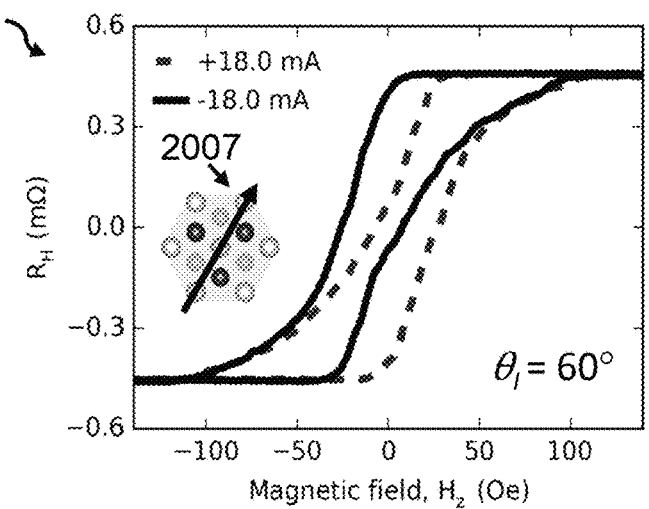
Figure 20D:
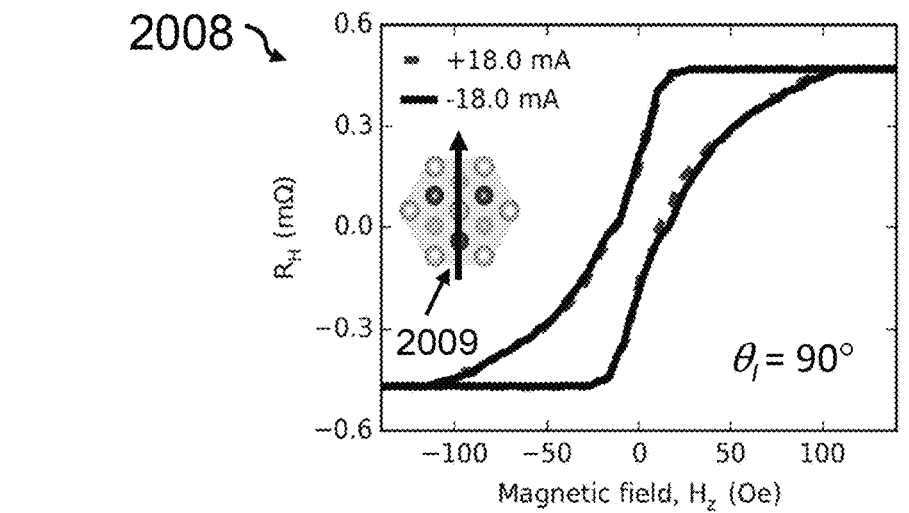

FIGS. 20A to 20D show plots 2002, 2004, 2006, 2008 of anomalous Hall loops under +18 mA and −18 mA pulsed d.c. current for $\theta_I=0°$, $\theta_I=30°$, $\theta_I=60°$ and $\theta_I=90°$, respectively. The inset 2003, 2005, 2007, 2009 in each of the FIGS. 20A to 20D indicates the current direction. As shown by the plots 2002 of FIG. 20A, when a positive (+18 mA) and a negative (−18 mA) electric current (pulse mode) is applied into the Hall bar with $\theta_I=0'$, the two corresponding anomalous Hall loops give a negative horizontal shift ($H_{shift}$) of −16 Oe. The out-of-plane effective field ($\Delta H_{OOP}$) is given by $\Delta H_{OOP}=-\frac{1}{2}H_{shift}$, which corresponds to a positive $\Delta H_{OOP}$ of 8 Oe. When $\theta_I=60°$ as shown in FIG. 20C, the horizontal shift has a positive value of +16 Oe. This corresponds to a negative $\Delta H_{OOP}$ of −8 Oe. However, when the electric current with the same amplitude was applied along the Hall bars with $\theta_I=30°$ and $\theta_I=90°$ as shown in FIGS. 20B and 20D respectively, the horizontal shift nearly disappears, which gives a $\Delta H_{OOP}$ of around 0 Oe.

Figure 20E:
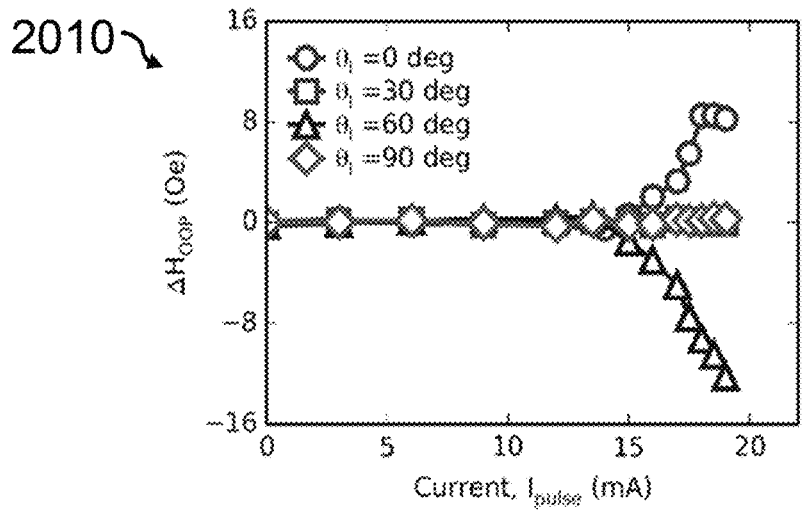

FIG. 20E shows a plot 2010 of out-of-plane effective field $\Delta H_{OOP}$ versus pulsed current for $\theta_I=0°$ (circle), $\theta_I=30°$ (square), $\theta_I=60°$ (triangle) and $\theta_I=90°$ (diamond). As shown in FIG. 20E, for high-symmetry axes where $\theta_I=30°$ and $\theta_I=90°$, $\Delta H_{OOP}$ almost remains at 0 Oe for all current values. In contrast, for the low-symmetry axis where $\theta_I=0°$ ($\theta_I=60°$), $\Delta H_{OOP}$ is close to 0 when the current is below 15 mA, and then abruptly increases (decreases) with the current. From the above, it is therefore clear that a polarity and an amplitude of the out-of-plane effective field $\Delta H_{OOP}$ (and therefore the "3m" torque) is associated with a flow direction (i.e.$\theta_I$) of the electric current. This threshold behavior is quite similar to that observed in magnetic trilayers, where the threshold current was attributed to the energy barrier for overcoming the intrinsic damping.

FIGS. 21A to 21L shows plots 2102, 2104, 2106, 2108, 2110, 2112, 2114, 2116, 2118, 2120, 2122, 2124 of the angle-dependent out-of-plane effective field under +18 mA and −18 mA pulsed d.c. current for varying $\theta_I$ (where $\theta_I=0°$, 15°, 30°, 45°, 60°, 75°, 90°, 105°, 120°, 135°, 150° and 165°, respectively). The inset in each of the FIGS. 21A to 21L indicates the current direction. The out-of-plane spin-torque efficiency ($\Delta H_{OOP}/J_{pulse}$) can be estimated by using $\Delta H_{OOP}$ measured at 18 mA current for different $\theta_I$ ranging from 0 degree to 165 degree as shown in FIGS. 21A to 21L.

Figure 20F:
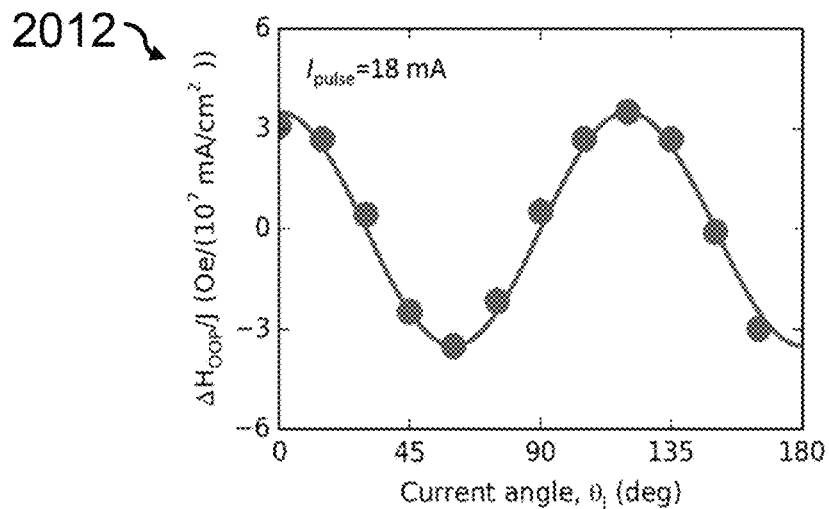
Figure 21A:
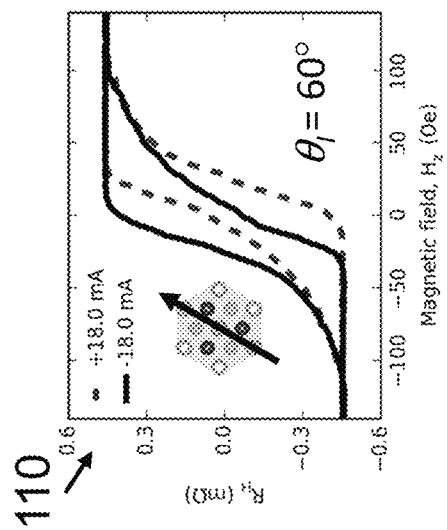
Figure 21C:
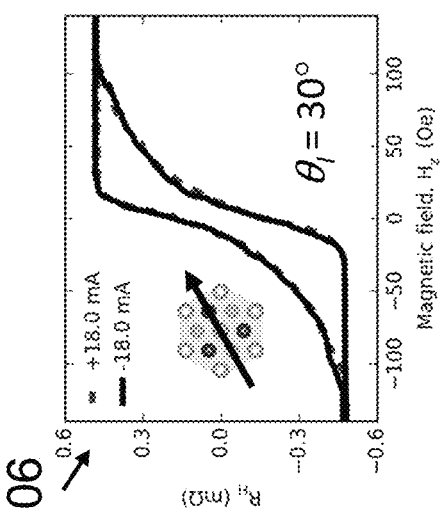
Figure 21E:
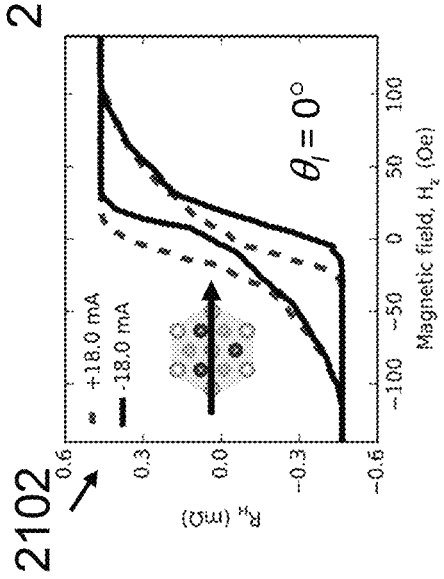
Figure 21B:
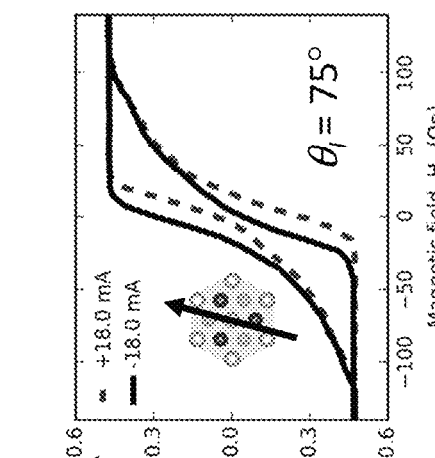
Figure 21D:
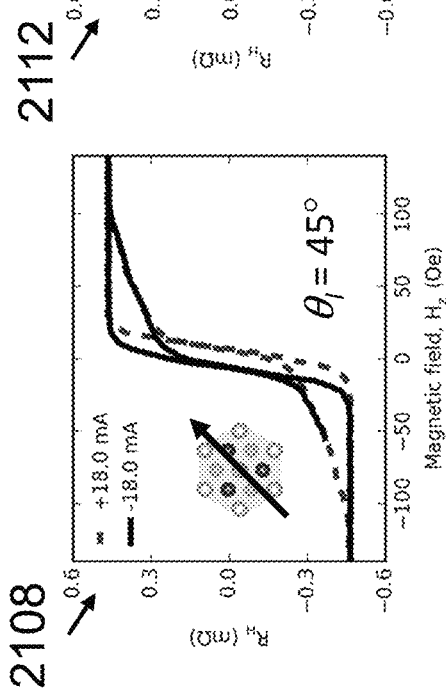
Figure 21F:
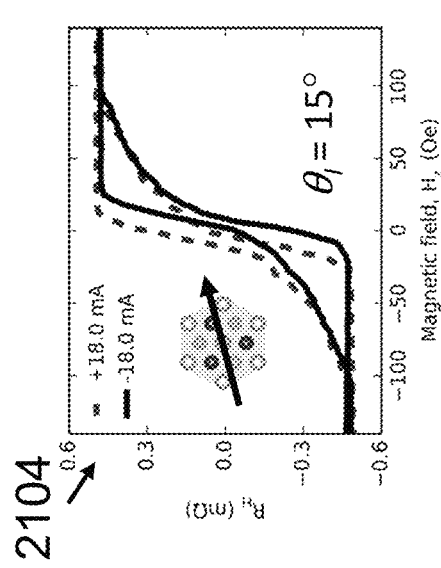
Figure 22:
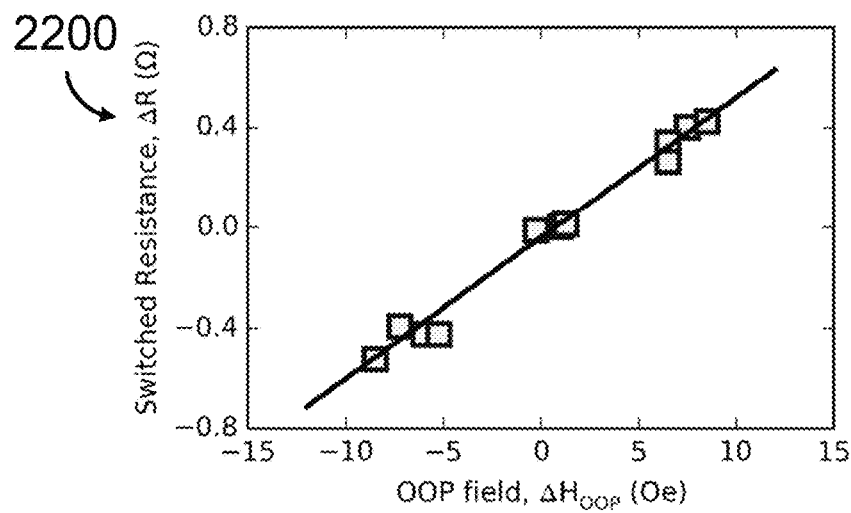
FIG. 22 shows a plot of switched resistance $\Delta R$ (Ω) versus out-of-plane effective field $\Delta H_{OOP}$ (Oe) in accordance with an embodiment, where the solid line is a linear fit to the data.

Referring back to FIG. 20F, using the data from FIGS. 21A to 21L, a plot 2012 of $\Delta H_{OOP}/J_{pulse}$ for different current angles $\theta_I$ can be plotted. The solid line in FIG. 20F is a cosine fit to the data. The plot in FIG. 20F shows a 3-fold angular dependence of $\Delta H_{OOP}/J_{pulse}$ for $\theta_I$, with an amplitude of 3.7 Oe/(1×10$^7$ A/cm$^2$). Both current-induced Hall resistance and current-induced out-of-plane effective field show a 3-fold symmetry with respect to the current direction $\theta_I$. FIG. 22 shows a plot 2200 of switched resistance $\Delta R$ (Ω) versus out-of-plane effective field $\Delta H_{OOP}$ (Oe), and demonstrates a linear correlation between them, where the solid line is a linear fit to the data.

In previous reports, the out-of-plane SOT effective field could be obtained by inducing an in-plane magnetization component ($M_x$), through applying an in-plane external magnetic field or by introducing an exchange bias from antiferromagnetic coupling in an antiferromagnet/ferromagnet (AFM/FM) system. These unidirectional controls of the magnetization should give a 1-fold angular dependent field-free switching. In contrast, the 3-fold angular dependent field-free switching in $L1_1$ CuPt/CoPt bilayer should have an origin closely related to the crystal structure.

Compared with the AFM/FM bilayer whose field-free switching performance is strongly affected by the training effect, the "3m" torque gives rise to a switching arising from a material/crystal property that has less dependence on the switching cycles. As proof, an endurance test by measuring the field-free switching loops repeatedly has been performed.

Figure 23A:
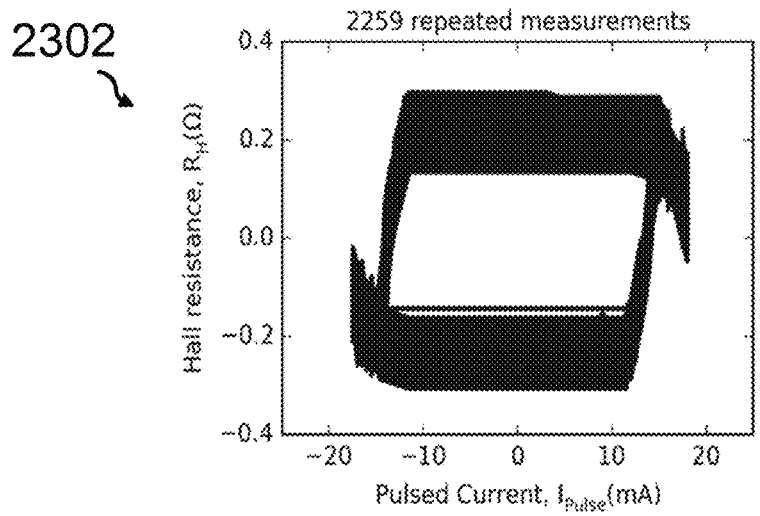
FIGS. 23A and 23B show plots demonstrating an endurance of SOT switching in $L1_1$ CuPt/CoPt bilayer in accordance with an embodiment, where
Figure 23B:
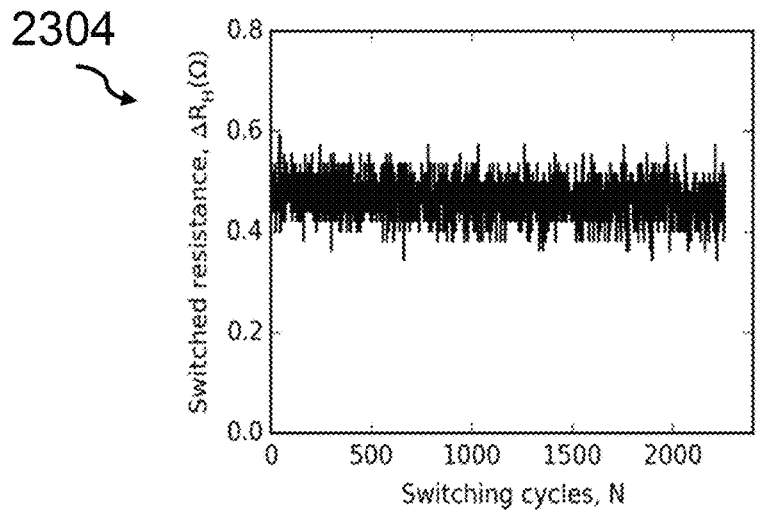

FIGS. 23A and 23B show plots 2302, 2304 demonstrating an endurance of SOT switching in a $L1_1$ CuPt/CoPt bilayer in accordance with an embodiment, where FIG. 23A shows plots 2302 of Hall resistance $R_H$ (Ω) versus pulsed current for 2259 repeated measurements and FIG. 23B shows a plot 2304 of switched resistance $\Delta R$ (Ω) versus a number of switching cycles, N. As shown in the plots 2302 of FIG. 23A, under 2259 of repeated switching events in a 26-days period (about 17 minutes for one loop), the switching behavior remains stable. As shown in the plot of 2304 of FIG. 23B, $\Delta R_H$ is almost kept unchanged with switching cycles N, indicating an excellent switching performance. This is in contrast to AFM/FM bilayers used in existing art, where the field-free switching was reported to degrade after tens of switching cycles because the in-plane exchange bias field is strongly affected by the Joule heating and training effect.

Field-Free Switching of CoPt Single Layer

Besides the embodiments in relation to a CuPt/CoPt bilayer structure as described above, current-induced field-free switching (i.e. in the absence of a magnetic field) can be realized in a $Co_xPt_{100-x}$ single material layer by using a combination of an out-of-plane (OOP) torque originated from the 3m1 crystallographic point group symmetry and an in-plane spin torque generated as a result of composition gradient along a film normal direction (i.e. perpendicular to a plane of the film/layer) in the $Co_xPt_{100-x}$ layer.

As shown in relation to the experimental results below, it was observed that perpendicular magnetization of $Co_xPt_{100-x}$ single layers within a special composition range (20<x<50) can be deterministically switched by an applied pulsed current in the absence of external magnetic field. As will be appreciated by a skilled person in the art, although exemplary $Co_xPt_{100-x}$ single layers are described, other suitable single layers of crystalline magnetic materials may also be used to demonstrate current-induced field-free switching.

Methodology and Results

In the below experiments, the $Co_{30}Pt_{70}$ film used was deposited on single crystalline MgO (111) substrate at 300° C. by sputtering. The composition ratio of Co to Pt is characterized to be 29.8%:70.2% by energy-dispersive X-ray spectroscopy (EDS). The single layer structure simplifies design and processing requirements when it is used in applications such as the devices described in relation to FIG. 1A to FIG. 3 above.

Figure 24:
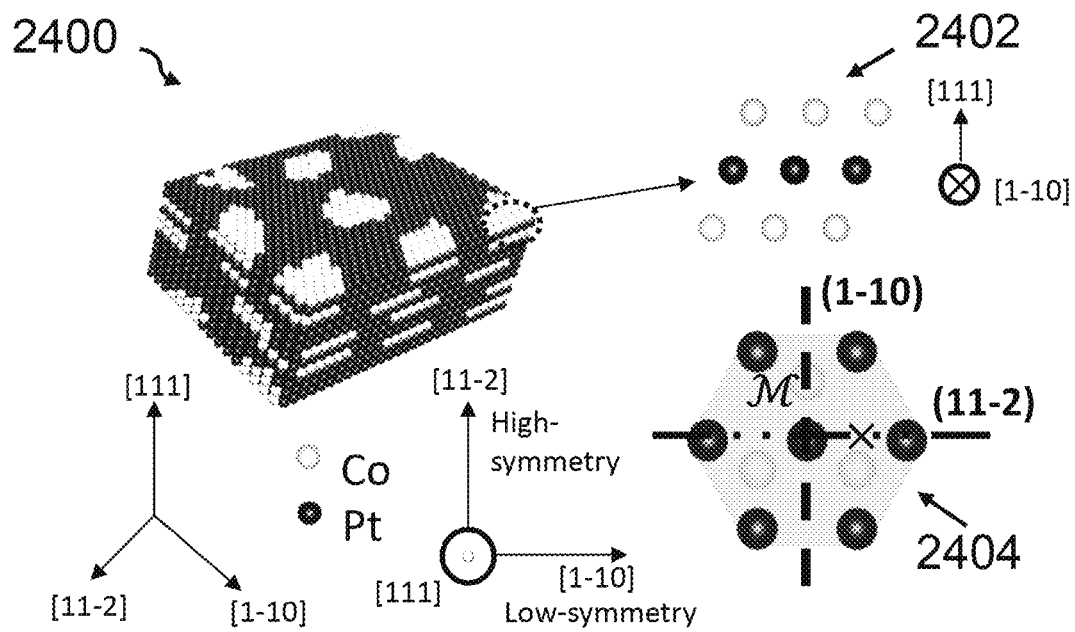
FIG. 24 shows a schematic structure of $Co_{30}Pt_{70}$ with randomly located Co platelets (labelled with white circle) in accordance with an embodiment, which includes a first inset at a top right showing a side view of the Co platelets in a Pt-rich layer and a second inset at a bottom right showing crystal symmetry of Co platelets/Pt with respect to a low symmetry axis of [1-10] and a high symmetry axis of [11-2]

FIG. 24 shows a schematic structure 2400 of $Co_{30}Pt_{70}$ with randomly located Co segregates which form Co platelets (labelled with light-coloured circle) during growth of the $Co_{30}Pt_{70}$ in accordance with an embodiment. A first inset 2402 at a top right of FIG. 24 shows a side view of the Co platelets in a Pt-rich layer or a Pt matrix which resembles a Co/Pt superlattice. A second inset 2404 at a bottom right of FIG. 24 shows crystal symmetry of Co platelets/Pt with respect to a low symmetry axis of [1-10] and a high symmetry axis of [11-2]. The second inset 2404 shows that an in-plane mirror symmetry was broken with respect to a plane (11-2) defined by the axes [1-10] and [111], while the symmetry is preserved with respect to a plane (1-10) defined by the axes [11-2] and [111]. This is similar to the symmetries of the crystal structures as shown in relation to FIGS. 5A to 5C.

Figure 25:
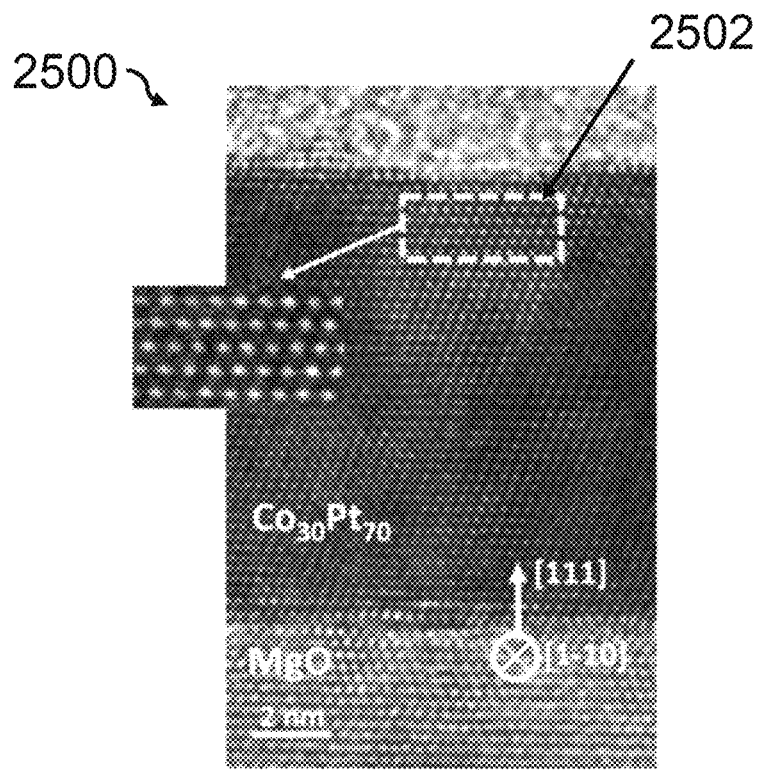
FIG. 25 shows a high resolution-transmission electron microscopy (HRTEM) image of $Co_{30}Pt_{70}$ with a zone-in axis of [1-10] in accordance with an embodiment.

FIG. 25 shows a high resolution-transmission electron microscopy (HRTEM) image 2500 of $Co_{30}Pt_{70}$ with a zone-in axis of [1-10] in accordance with an embodiment. The area 2502 as marked by the dotted white line is magnified to show a stacking sequence of $Co_{30}Pt_{70}$. As shown in FIG. 25, $Co_{30}Pt_{70}$ shows a stacking sequence of ABCABC . . . , which is consistent with the face-center cubic (fcc) structure of $Co_{30}Pt_{70}$.

Figure 26:
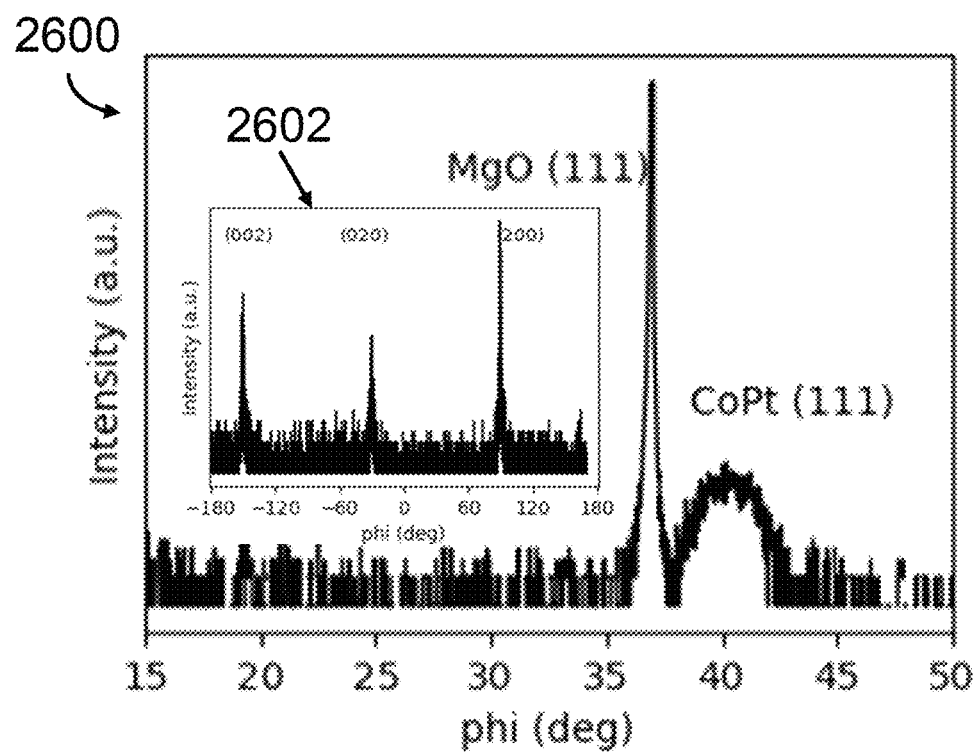
FIG. 26 shows a plot of a high-resolution X-ray diffraction (HRXRD) pattern of $Co_{30}Pt_{70}$ with an inset showing a phi-scan pattern with $Co_{30}Pt_{70}$ (002) plane being rotated along [111] axis in accordance with an embodiment.

FIG. 26 shows a plot 2600 of a high-resolution X-ray diffraction (HRXRD) pattern of a 6 nm $Co_{30}Pt_{70}$ un-patterned thin film in accordance with an embodiment. The inset 2602 of FIG. 26 shows a phi-scan pattern with the $Co_{30}Pt_{70}$ (002) plane being rotated along [111] axis. FIG. 26 shows that the 6 nm $Co_{30}Pt_{70}$ un-patterned thin film has a (111) peak which appears at 40.6 degree. This indicates an epitaxial growth of $Co_{30}Pt_{70}$ thin film. The inset 2602 shows three peaks which correspond to a three-fold rotation symmetry of the $Co_{30}Pt_{70}$ film. The peaks are shown at CoPt (002), CoPt (020), and CoPt (200) at about −150°, −30°, and 90°, respectively. This further confirms that the $Co_{30}Pt_{70}$ layer has a typical fcc $Co_{30}Pt_{70}$ structure.

Figure 27:
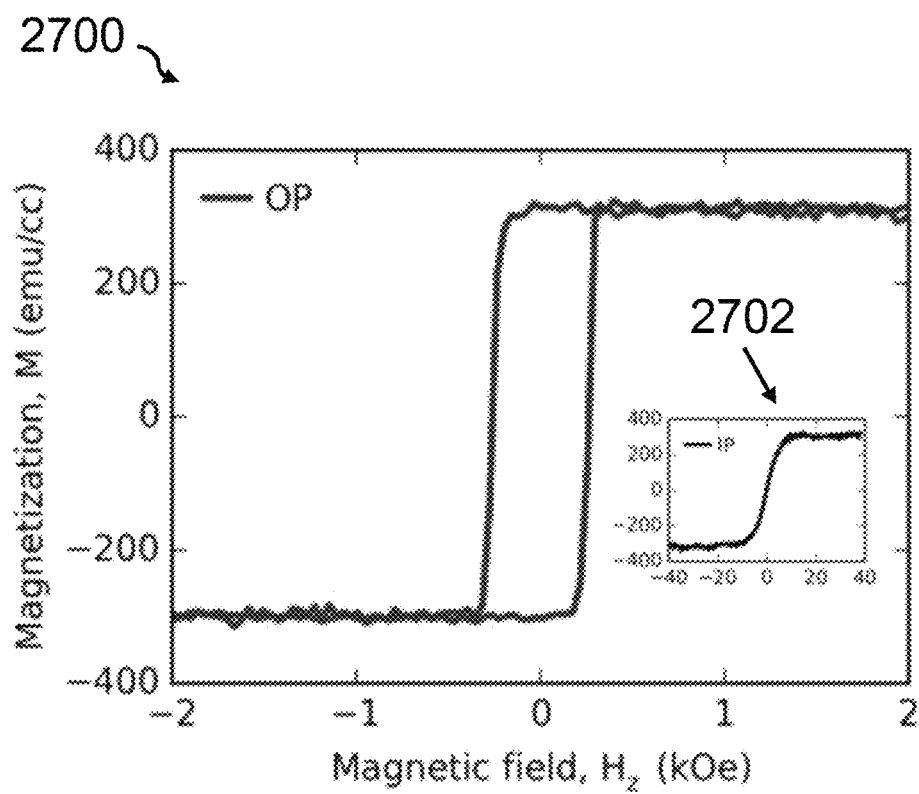
FIG. 27 shows a plot of an out-of-plane (OP) magnetic hysteresis loop of an unpatterned $Co_{30}Pt_{70}$ thin film with an inset showing a plot of an in-plane (IP) magnetic hysteresis loop in accordance with an embodiment.

FIG. 27 shows a plot 2700 of an out-of-plane (OP) magnetic hysteresis loop of the 6 nm-thick un-patterned $Co_{30}Pt_{70}$ thin film in accordance with an embodiment. An inset 2702 is provided in FIG. 27 which shows a plot of an in-plane (IP) magnetic hysteresis loop for the same $Co_{30}Pt_{70}$ thin film. The squared out-of-plane (OP) magnetic hysteresis loop and the linear relationship of the in-plane (IP) magnetization-magnetic field (M-H) loop of the inset 2702 indicates a good perpendicular magnetic anisotropy (PMA) of the 6 nm-thick un-patterned $Co_{30}Pt_{70}$ thin film.

Figure 28:
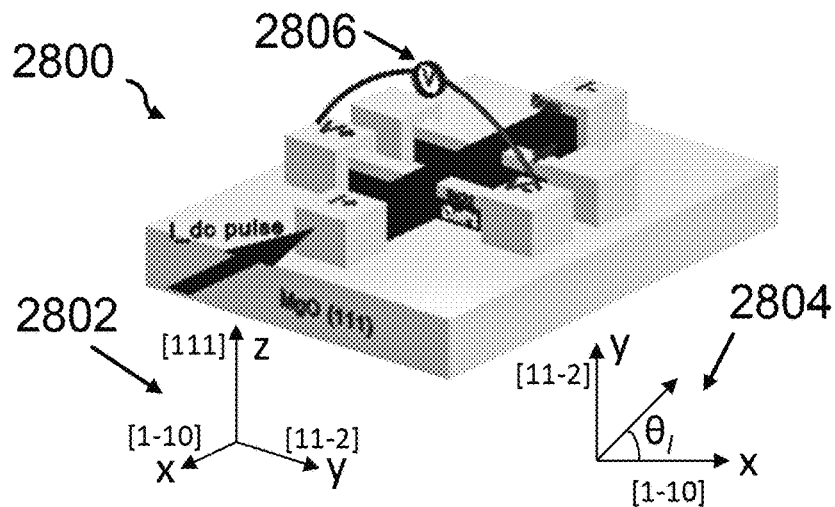
FIG. 28 shows a schematic diagram of a $MgO/Co_{30}Pt_{70}$ Hall bar device used for electrical transport measurement in accordance with an embodiment.

The 6 nm $Co_{30}Pt_{70}$ single layer is fabricated into a Hall-bar structure with a 5-μm-wide channel along the x axis for electrical transport measurements. FIG. 28 shows a schematic diagram 2800 of a MgO/$Co_{30}Pt_{70}$ Hall bar device used for electrical transport measurement in accordance with an embodiment. The $Co_{30}Pt_{70}$ layer was deposited on the magnesium oxide (MgO) substrate, for example by sputtering. The MgO/$Co_{30}Pt_{70}$ Hall bar device was setup for anomalous Hall effect (AHE) measurement and current-induced switching measurement. The Cartesian coordinates 2802 show an orientation of the crystal axes for the MgO/$Co_{30}Pt_{70}$ Hall bar device. Particularly, the x-axis is defined as the [1-10] direction, the y-axis is defined as the [11-2] direction and the z-axis is defined as the [111] direction. As shown in FIG. 28, an applied dc current pulse IPuse was applied along a longitudinal axis of the Hall bar device. In the present case as shown in FIG. 28, the dc current pulse is along the x-axis (i.e. the [1-10] direction). In embodiments, various Hall bars are fabricated such that a current path of each of the Hall bars has an azimuthal current angle $\theta_I$ which varies with respect to the direction of [1-10] crystal axis. The azimuthal current angle $\theta_I$ is defined as shown in the inset 2804 of FIG. 28. Further, FIG. 28 also shows a voltmeter 2806 connected to electrical contacts of the Hall bar device, which can be used to measure a Hall voltage across the V+ and V− electrodes of the Hall bar.

Figure 29:
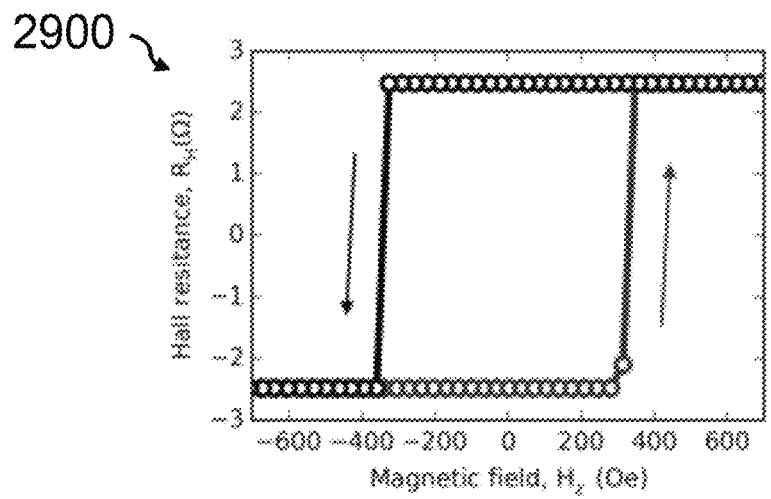
FIG. 29 shows a plot of anomalous Hall resistance $R_H$ as a function of an out-of-plane magnetic field (i.e. along the z-axis) $H_z$ for the $Co_{30}Pt_{70}$ Hall bar of FIG. 28 in accordance with an embodiment.

FIG. 29 shows a plot 2900 of anomalous Hall resistance $R_H$ as a function of an out-of-plane magnetic field (i.e. along the z-axis) $H_z$ for the $Co_{30}Pt_{70}$ Hall bar of FIG. 28 in accordance with an embodiment. The squared anomalous Hall resistance $R_H$ loop together with the 100% remanence as shown in FIG. 29 indicates that the $Co_{30}Pt_{70}$ Hall bar exhibits a well-defined and sizable perpendicular magnetic anisotropy (PMA).

Figure 30:
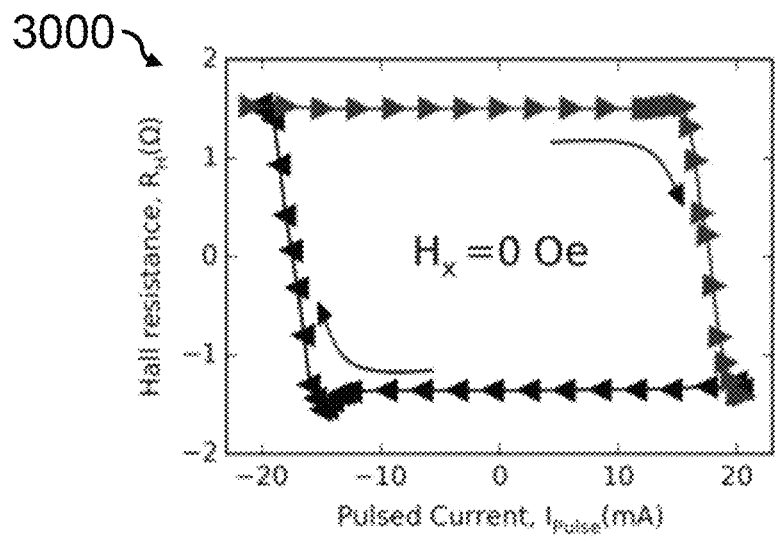
FIG. 30 shows a plot of anomalous Hall resistance $R_H$ as a function of pulsed current $I_{Pulse}$ for the $Co_{30}Pt_{70}$ Hall bar of FIG. 28 to illustrate current induced zero-field magnetization switching in the $Co_{30}Pt_{70}$ using a current flowing along a low symmetry axis direction in accordance with an embodiment.

Current-induced magnetization switching measurements were performed by sweeping a pulsed d.c. current with varying current angle $\theta_I$. FIG. 30 shows a plot 3000 of anomalous Hall resistance $R_H$ as a function of pulsed current $I_{Pulse}$ for the $Co_{30}Pt_{70}$ Hall bar of FIG. 28 in accordance with an embodiment. The plot 3000 shows deterministic switching of the perpendicular magnetization of the $Co_{30}Pt_{70}$ layer of the Hall bar using a pulsed current $I_{pulse}$ flowing along a low symmetry axis (i.e. along the [1-10] direction with $\theta_I=0°$), without any assistance from an external in-plane magnetic field. The critical switching current in this case was 18 mA, which corresponds to a current density of around $6.1 \times 10^7$ A cm$^{-2}$.

Figure 31:
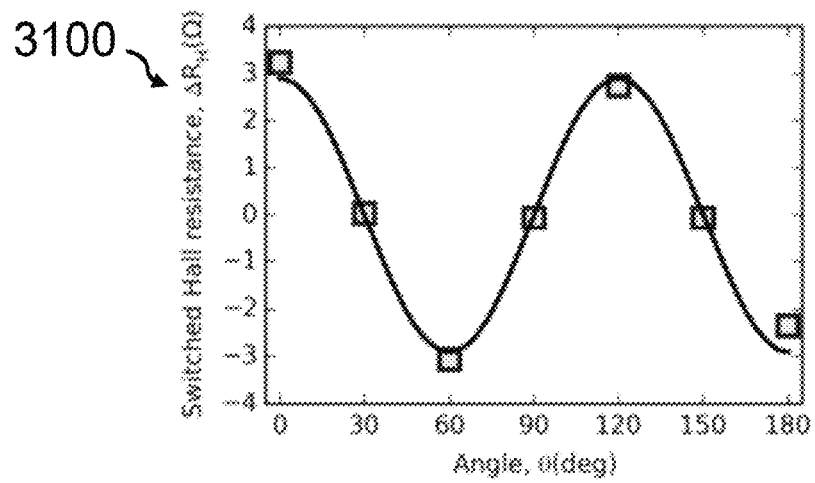
FIG. 31 shows a plot of switched Hall resistance $\Delta R_H$ as a function of current angle $\theta_I$ for different $Co_{30}Pt_{70}$ Hall bars in accordance with an embodiment.

FIG. 31 shows a plot 3100 of switched Hall resistance $\Delta R_H$ as a function of current angle $\theta_I$ for different $Co_{30}Pt_{70}$ Hall bars in accordance with an embodiment. Similar to the definition of switched resistance used in relation to FIG. 15, $\Delta R_H$ can be defined as a difference between the Hall resistance when the current pulse is swept from 21 mA to 0 mA and that when the current pulse is swept from −21 mA to 0 mA. For example, using the plot 3000 of FIG. 30, a switched Hall resistance $\Delta R_H$ of about 3Ω can be observed for $\theta_I=0°$. Other data points for different current angle $\theta_I$ are also included in this plot 3100. The plot 3100 shows a threefold symmetry. The field-free switching appears and disappears with current flowing along the low-symmetry axis (e.g. $\theta_I=0°$) and the high-symmetry axis ($\theta_I=90°$), respectively.

Figure 32:
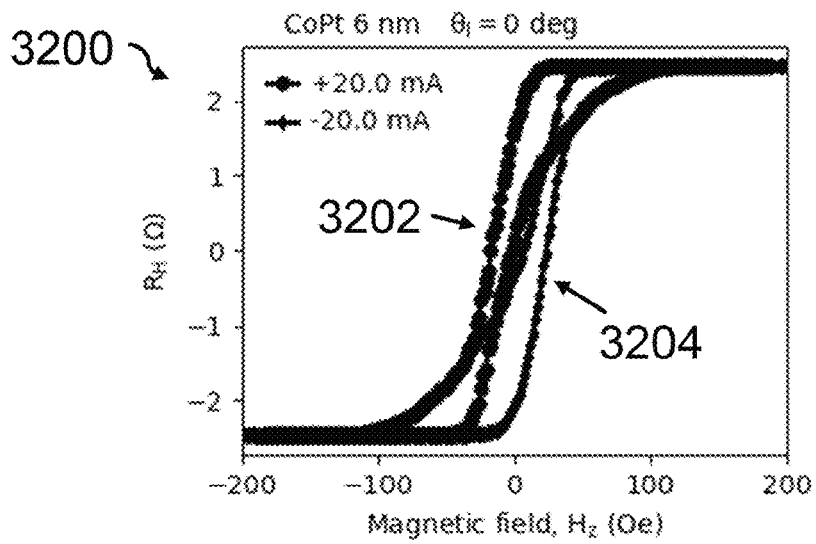
FIG. 32 shows a plot of anomalous Hall resistance $R_H$ as a function of an out-of-plane magnetic field (i.e. along the z-axis) $H_z$ for the $Co_{30}Pt_{70}$ Hall bar of FIG. 28 for pulsed dc current of +20 mA and −20 mA with a current angle $\theta_I$ of 0° in accordance with an embodiment.

FIG. 32 shows a plot 3200 of anomalous Hall resistance $R_H$ as a function of an out-of-plane magnetic field (i.e. along the z-axis) $H_z$ for the $Co_{30}Pt_{70}$ Hall bar of FIG. 28 for pulsed dc current of +20 mA and −20 mA with a current angle $\theta_I$ of 0° in accordance with an embodiment. FIG. 32 shows the anomalous Hall resistance $R_H$ loop 3202 for the pulsed dc current of +20 mA and the anomalous Hall resistance $R_H$ loop 3204 for the pulsed dc current of −20 mA. The plot 3200 is useful for evaluating an out-of-plane effective field ($\Delta H_{OOP}$) of the $Co_{30}Pt_{70}$ Hall bar, in a similar manner as the analysis performed for FIGS. 20A to 20F. The leftwards (rightwards) loop shift corresponds to a positive (negative) out-of-plane effective field ($\Delta H_{OOP}$), which can be extracted from the positive and negative switching fields using the plot 3200 (see e.g. as discussed in relation to FIGS. 20A to 20C). As shown in FIG. 32, for $\theta_I=0°$, the switching field difference between the two loops, is −49.5 Oe, which gives an $\Delta H_{OOP}$ of 29.7 Oe.

Figure 33:
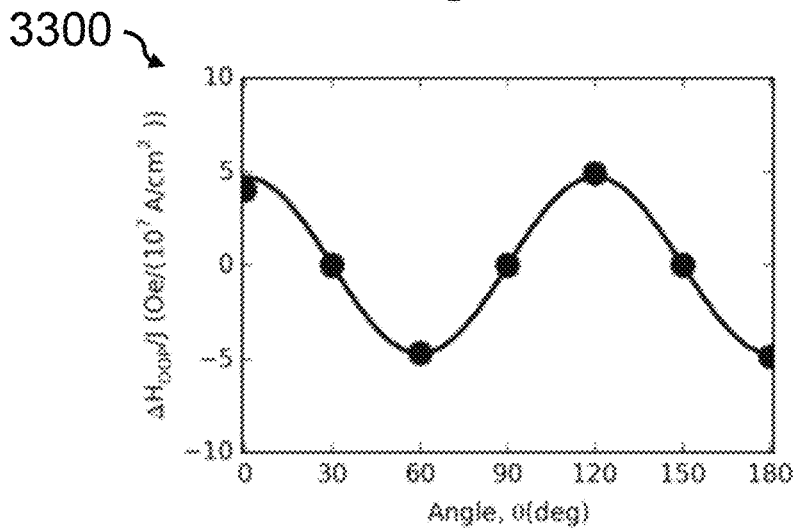
FIG. 33 shows a plot of an out-of-plane (OOP) effective field efficiency ($\Delta H_{OOP}/J_{sw}$) as a function of current angle $\theta_I$ in accordance with an embodiment.

FIG. 33 shows a plot 3300 of an out-of-plane (OOP) effective field efficiency ($\Delta H_{OOP}/J_{sw}$) as a function of current angle $\theta_I$ in accordance with an embodiment. Here, the out-of-plane effective field efficiency is defined as $\Delta H_{OOP}/J_{sw}$, where $J_{sw}$ is the SOT switching current density. The plot 3300 shows the $\theta_I$ dependence of $\Delta H_{OOP}/J_{sw}$, where a threefold symmetry was obtained. This is consistent with the $\theta_I$ dependence of switched Hall resistance $\Delta R_H$ for field-free switching as shown in FIG. 31, where the OOP field was present in the low-symmetry axis of the Co platelets on Pt-rich layer that resembled a short-range order Co/Pt superlattice.

Apart from the field-free switching behavior in $Co_{30}Pt_{70}$, the switching behavior in $Co_xPt_{100-x}$ devices with varied composition was investigated by performing current-induced switching experiments and pulsed AHE experiments.

Figure 34:
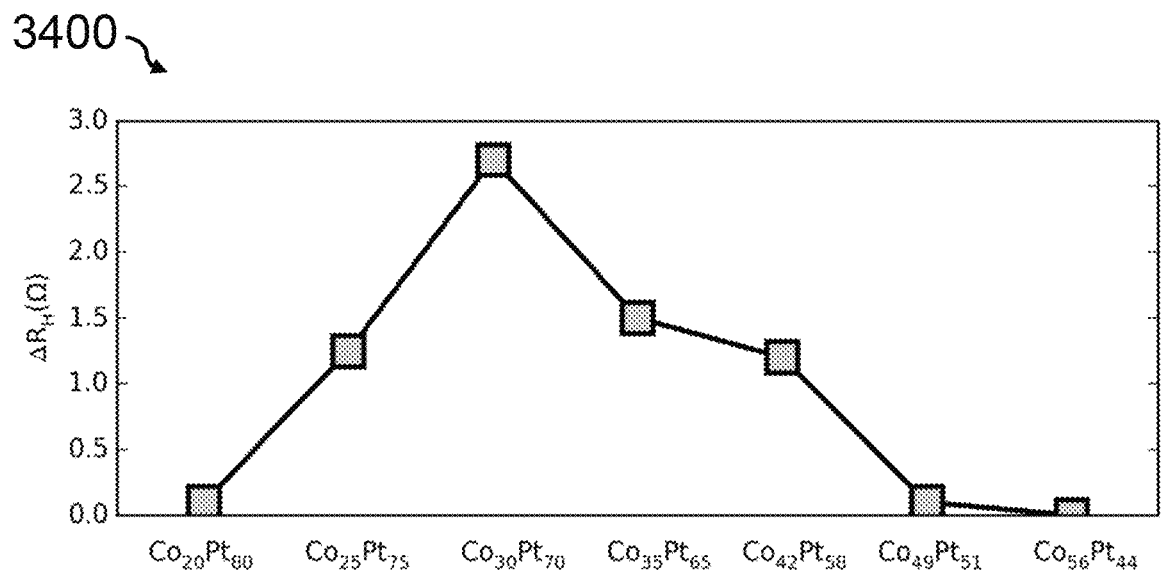
FIG. 34 shows a plot of switched Hall resistance $\Delta R_H$ for different $Co_xPt_{100-x}$ compositions in accordance with an embodiment.

FIG. 34 shows a plot 3400 of switched Hall resistance $\Delta R_H$ for different $Co_xPt_{100-x}$ compositions in accordance with an embodiment. As shown in the plot 3400, the switched Hall resistance is largest for $Co_{30}Pt_{70}$ (i.e. a CoPt composition with 30% Co and 70% Pt). Also can be observed from the plot 3400 is that decreasing or increasing Co composition from the composition of $Co_{30}Pt_{70}$ appears to reduce the switched Hall resistance. The field-free switching performance can be influenced by the magnetic anisotropy of the magnetic layer and the out-of-plane (OOP) spin torque. For example, in L1 CuPt, the OOP spin torque is associated with the presence of 3-fold rotation symmetry about [001] combined with the mirror symmetry normal to [100].

Figure 35:
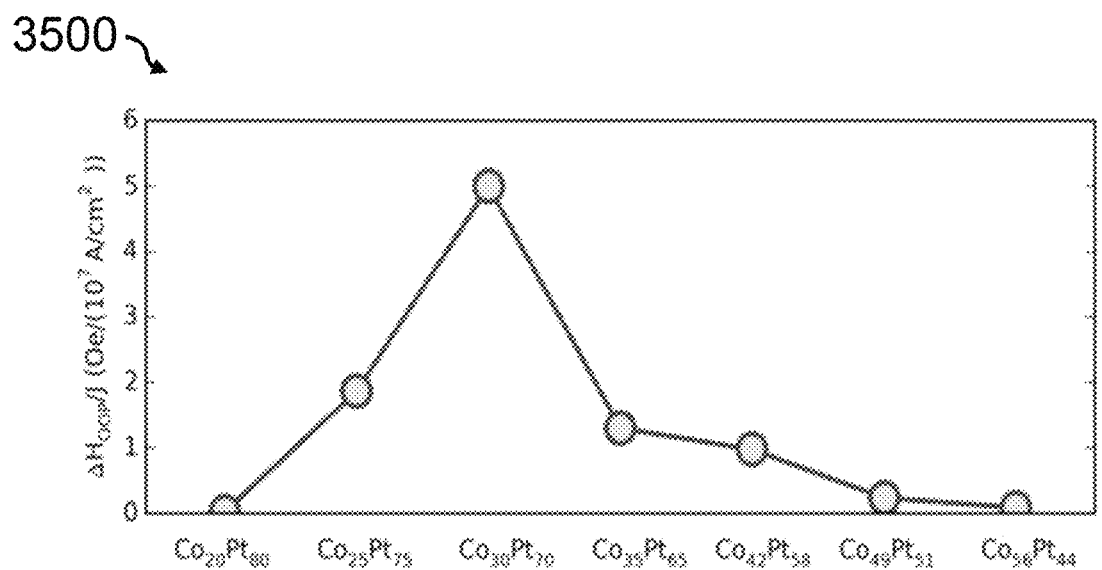
FIG. 35 shows a plot of an out-of-plane (OOP) effective field efficiency ($\Delta H_{OOP}/J_{sw}$) for different $Co_xPt_{100-x}$ compositions in accordance with an embodiment.

FIG. 35 shows a plot 3500 of an out-of-plane (OOP) effective field efficiency ($L1H_{OOP}/J_{sw}$) for different CoPt compositions in accordance with an embodiment. The plot 3500 shows that the largest OOP field again appears for a composition of $Co_{30}Pt_{70}$, which is consistent with the highest switched Hall resistance as shown in FIG. 34. The reduced magnitude of the OOP field with decreasing or increasing Co composition with respect to the composition of $Co_{30}Pt_{70}$ may be due to the breaking of the short-range ordered Co platelets, which accounts for the low symmetry allowed OOP torque. This can be explained as follows. The alternative stacking of Co and Pt with a long range order (similar to the $L1_1$ ordered CoPt) adopts the point group R $\bar{3}$m, which does not favor the existence of an out-of-plane effective field $\Delta H_{OOP}$. In contrast, for the Co platelets/Pt, the point group of the interface reduces to 3m1 and $\Delta H_{OOP}$ is allowed by symmetry. With a small concentration of Co atoms, the formation of Co platelets may induce the perpendicular magnetic anisotropy of $Co_{20}Pt_{80}$. However, the Co platelets may be too small and randomly distributed in the Pt matrix in this case, and do not provide for the out-of-plane spin torque because of an absence of a lateral mirror symmetry breaking for these small Co platelets. On the other hand, for $Co_{56}Pt_{44}$, the crystal structure tends towards an atomically layered structure $[Co/Pt]_N$ (e.g. close to that of $L1_1$ CoPt), and there is no inversion symmetry breaking in these films. However, with a moderate concentration of Co atoms, such as $Co_{30}Pt_{70}$, the Co platelets are not enough to form a long-range atomically ordered [Co/Pt]$_N$ structure, but can create a relatively large portion of Co platelets/Pt structure. The Co platelets/Pt structure has a 3m1 point group, which allows for the generation of the "3m" torque. The composition dependent field-free switching behaviors shows that the $Co_{30}Pt_{70}$ is the optimal concentration with the largest switching ratio and the largest OOP field.

Considering the 3m1 interface symmetry as discussed above, a 3m torque is generated upon the application of an in-plane electrical current, and it is given by: $T_{3m}=\chi_{3m}m \times [(m_yE_x+m_xE_y)x+(m_xE_x-m_yE_y)y]$, where $\chi_{3m}$ is associated with a response tensor, m is magnetic moment with $m_x$ and $m_y$ being components of the magnetic moment, $E_x$ and $E_y$ are components of an electric field, x and y are unit direction vectors for the x- and y-axis, respectively. From the above expression, it is clear that the 3m torque is equal to 0 when the magnetization is ideally aligned along the z axis, where $m_x$ and $m_y$ are equal to 0. With the existence of the damping-like torque, the magnetization (m) would be forced to the in-plane direction and aligned with the spin-polarization direction. Consequently, an out-of-plane 3m torque $T_{3m} \sim \chi_{3m}$ m×E (where E is the electric field) is generated and its sign is determined by the direction of m after the exertion of the damping-like torque. The in-plane damping-like torque may therefore be considered as a prerequisite for generating the 3m torque. Here, the origin of the in-plane damping-like torque in $Co_{30}Pt_{70}$ single layer is explored, where a composition distribution of Co and Pt in the $Co_{30}Pt_{70}$ film is investigated along the normal direction.

Figure 36:
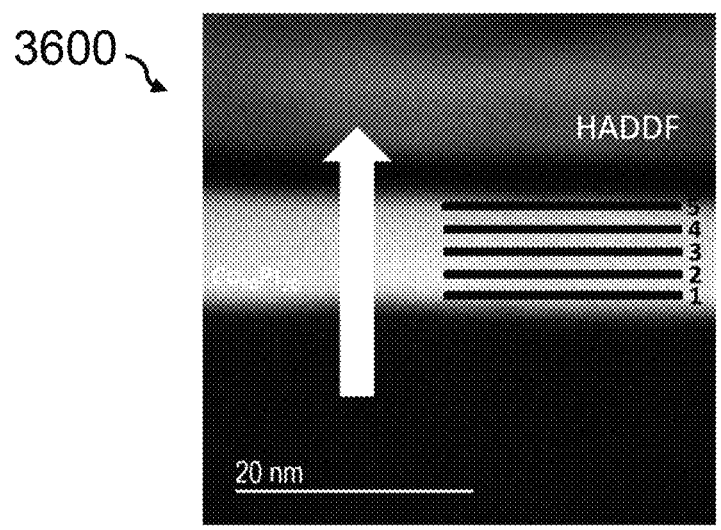
FIG. 36 shows a cross-sectional high-angle annular dark-field-scanning transmission electron microscopy (HADDF-STEM) image of a 12 nm-thick $Co_{30}Pt_{70}$ layer deposited on a MgO substrate in accordance with an embodiment.
Figure 37A:
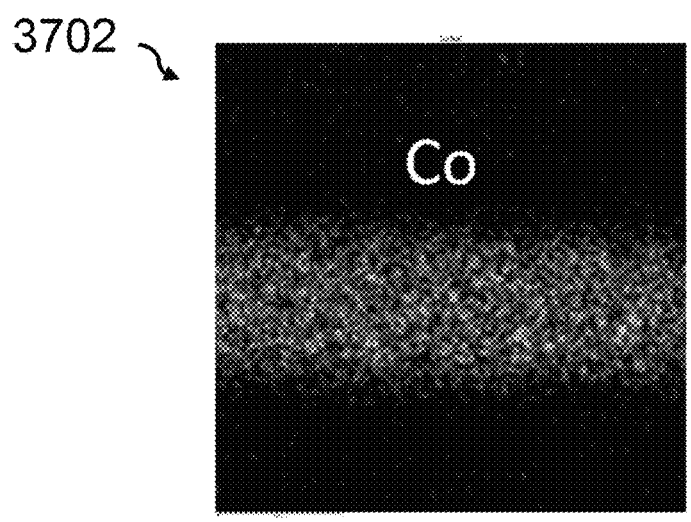
FIG. 37A and FIG. 37B show EDS mapping of the 12 nm-thick $Co_{30}Pt_{70}$ layer of FIG. 36 in accordance with an embodiment, where
Figure 37B:
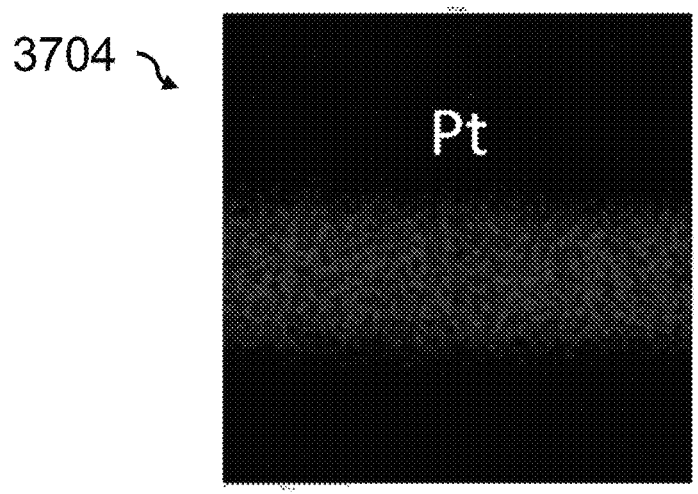

The composition distribution of Co and Pt in the $Co_{30}Pt_{70}$ film is investigated along the normal direction by using High-angle angular dark-field scanning transmission electron microscopy (HADDF-STEM). FIG. 36 shows a cross-sectional (HADDF-STEM) image 3600 of a 12 nm-thick $Co_{30}Pt_{70}$ layer deposited on a MgO (111) substrate in accordance with an embodiment. FIG. 37A and FIG. 37B show EDS mapping of the 12 nm-thick $Co_{30}Pt_{70}$ layer of FIG. 36 in accordance with an embodiment, where FIG. 37A shows a Co Kα EDS mapping 3702 and FIG. 37B shows a Pt Lα edge EDS mapping 3704. The mappings 3702, 3704 show an overall ratio of around 30% Co:70% Pt as expected for this $Co_{30}Pt_{70}$ layer.

Figure 38A:
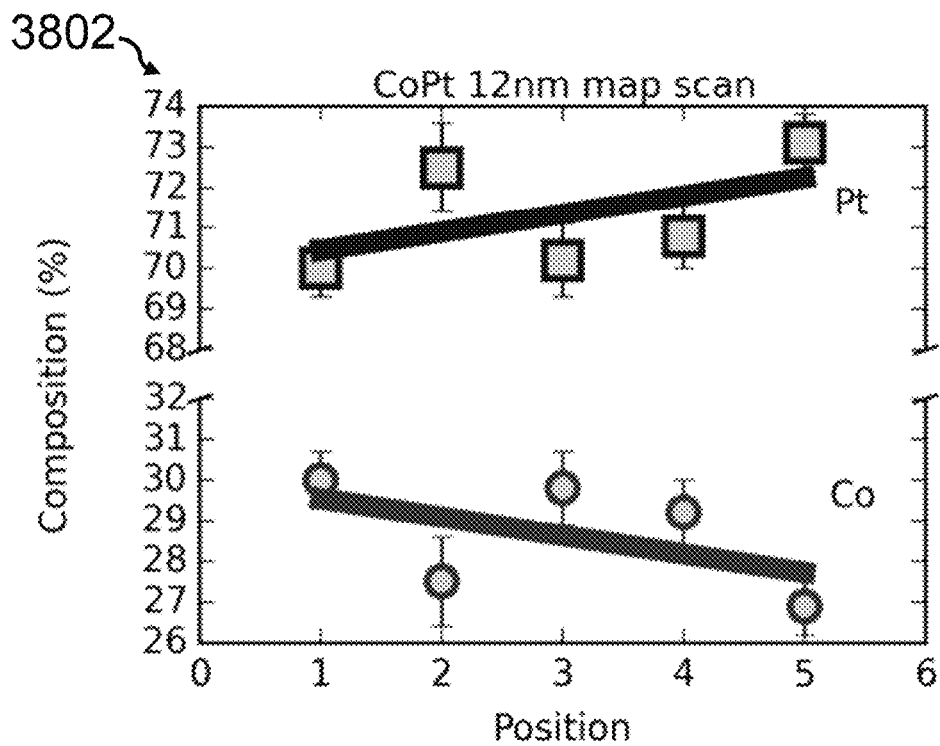
FIGS. 38A and 38B show plots of composition as a function of a position in two $Co_{30}Pt_{70}$ layers of varying thicknesses in accordance with an embodiment, where
Figure 38B:
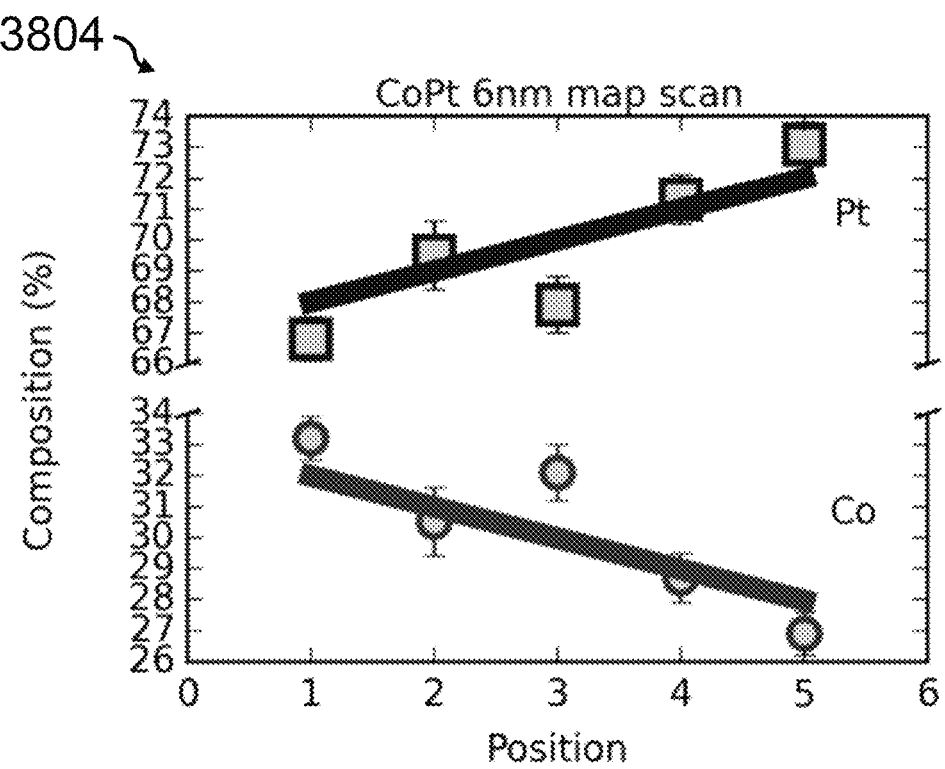

A mapping scan were performed at selected areas along the film normal direction as shown in FIG. 36. FIGS. 38A and 38B show plots of composition as a function of a position in two $Co_{30}Pt_{70}$ layers of varying thicknesses in accordance with an embodiment, where FIG. 38A shows a plot 3802 of composition of Co and Pt as a function of a position for the 12 nm-thick $Co_{30}Pt_{70}$ layer of FIG. 36, and FIG. 38B shows a plot 3804 of composition of Co and Pt as a function of a position for a 6 nm-thick $Co_{30}Pt_{70}$ layer (not shown). The positions 1 to 5 as shown in the plot 3802 are with reference to the positions 1 to 5 as marked on the HADDF-STEM image 3600 of FIG. 36. As shown in the plot 3802, the Co/Pt ratio changes from 43.06% at the bottom of the $Co_{30}Pt_{70}$ layer (c.f. position 1) to 38.89% at the top surface of the $Co_{30}Pt_{70}$ layer (c.f. position 5). The composition gradient is estimated as 0.5% for this case. On the other hand, using the plot 3804, a composition gradient of the 6 nm thick $Co_{30}Pt_{70}$ layer is 1.85%. Therefore, the composition gradient of the 6 nm thick $Co_{30}Pt_{70}$ layer is larger than that of the 12 nm thick $Co_{30}Pt_{70}$ layer.

Figure 39A:
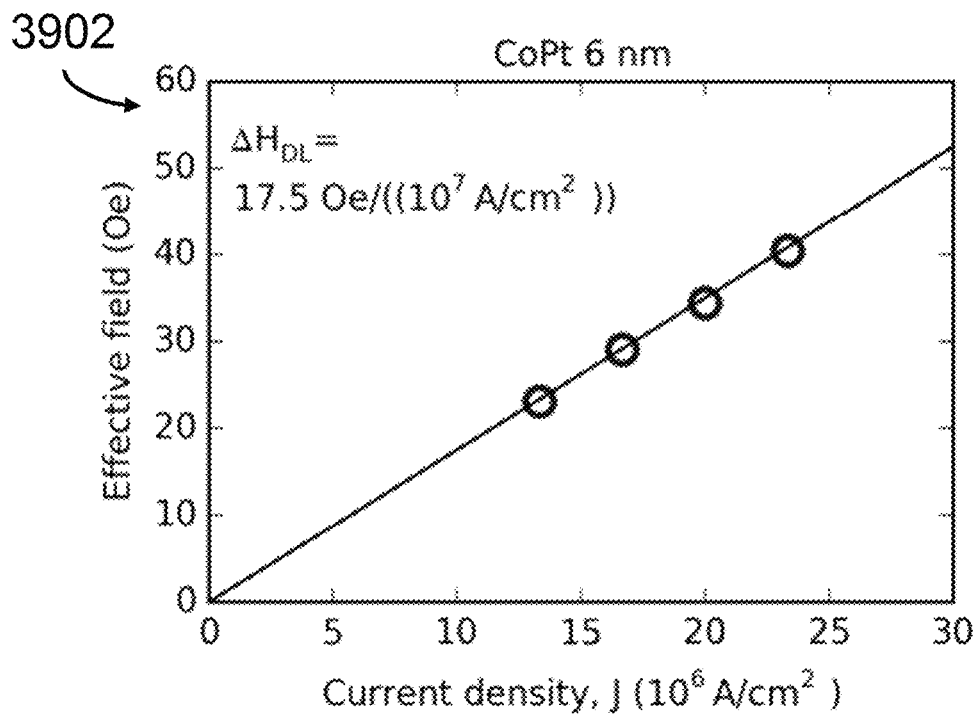
FIGS. 39A, 39B, 39C and 39D show plots of damping-like effective field as a function of current density J for $Co_{30}Pt_{70}$ layers of different thicknesses in accordance with an embodiment, where
Figure 39B:
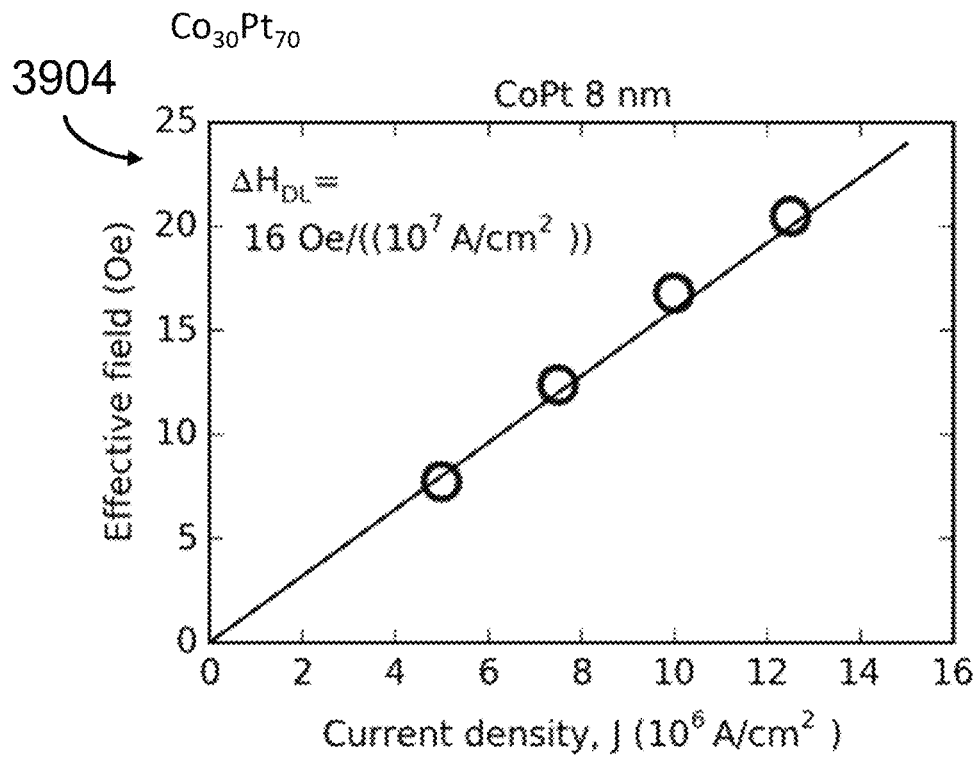
Figure 39C:
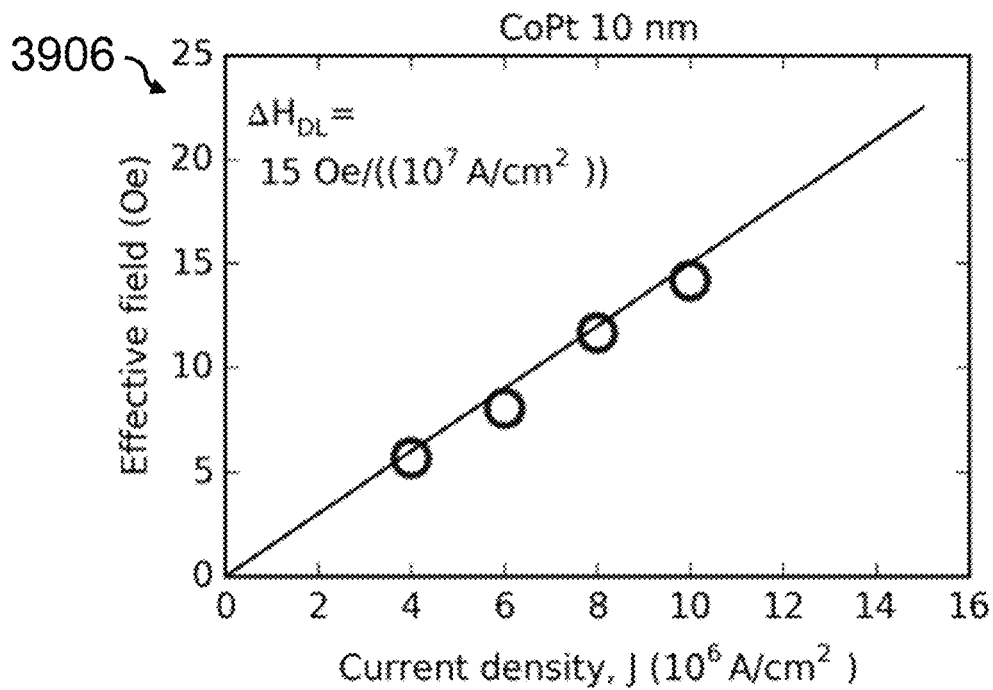
Figure 39D:
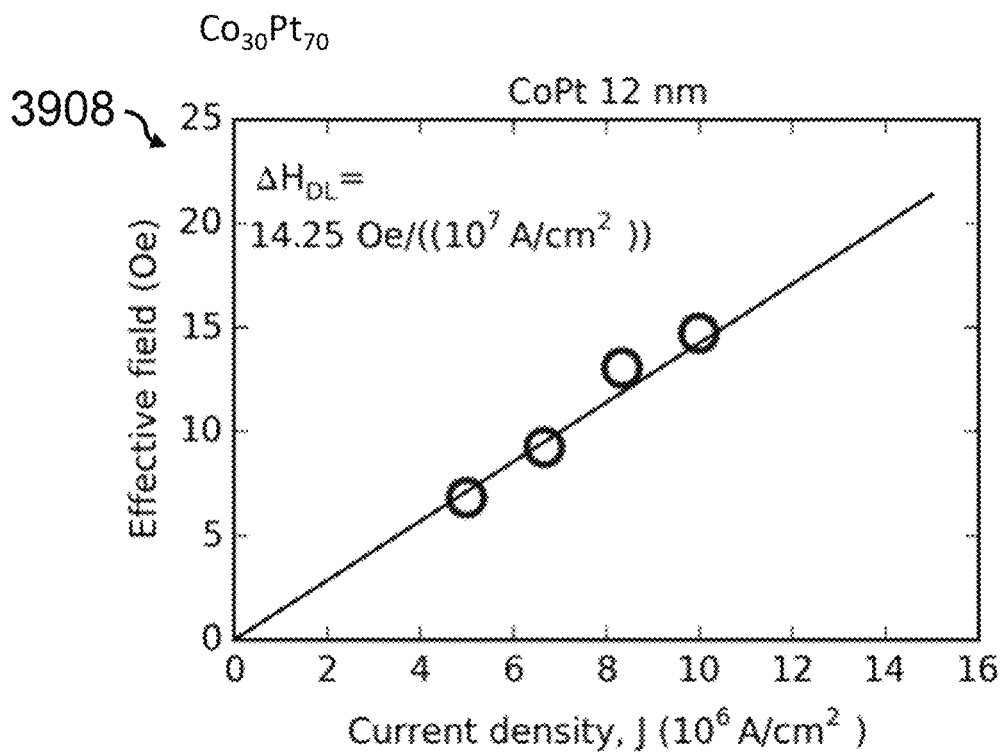

FIGS. 39A, 39B, 39C and 39D show plots of damping-like effective field as a function of current density J for $Co_{30}Pt_{70}$ layers of different thicknesses in accordance with an embodiment. FIG. 39A shows a plot 3902 of damping-like effective field as a function of J for a 6 nm thick $Co_{30}Pt_{70}$ layer, FIG. 39B shows a plot 3904 of damping-like effective field as a function of J for a 8 nm thick $Co_{30}Pt_{70}$ layer, FIG. 39C shows a plot 3906 of damping-like effective field as a function of J for a 10 nm thick $Co_{30}Pt_{70}$ layer and FIG. 39D shows a plot 3908 of damping-like effective field as a function of J for a 12 nm thick $Co_{30}Pt_{70}$ layer. As shown in plots 3902, 3904, 3906, 3908, the damping-like effective fields appears to increase with decreasing thickness of the $Co_{30}Pt_{70}$ layer. For example, the damping-like effective fields of the 6 nm thick $Co_{30}Pt_{70}$ layer is 17.5 Oe/$10^7$ A/cm² and is larger than that of the 12 nm thick $Co_{30}Pt_{70}$ layer which is 14.25 Oe/$10^7$ A/cm². Comparing the trend shown in relation to FIGS. 39A to 39D with that observed in relation to FIGS. 38A and 38B, it appears to suggest that the composition gradient in the $Co_{30}Pt_{70}$ single layer plays an important role in the damping-like effective field observed in FIGS. 39A to 39D.

A switching loop test was performed by measuring the field-free switching with positive and negative pulse current repeatedly. To do so, two successive positive pulses with 30 μs pulse width were applied, and the Hall resistance ($R_H$) was recorded with a small ac current ($I_{ac}$=50 μA) after a stabilization time of $\Delta t_{stabilization}$=8 s. Next, two successive negative pulses were applied, in a similar manner as the positive pulses. Therefore, one cycle contains two positive and negative pulses, respectively.

Figure 40:
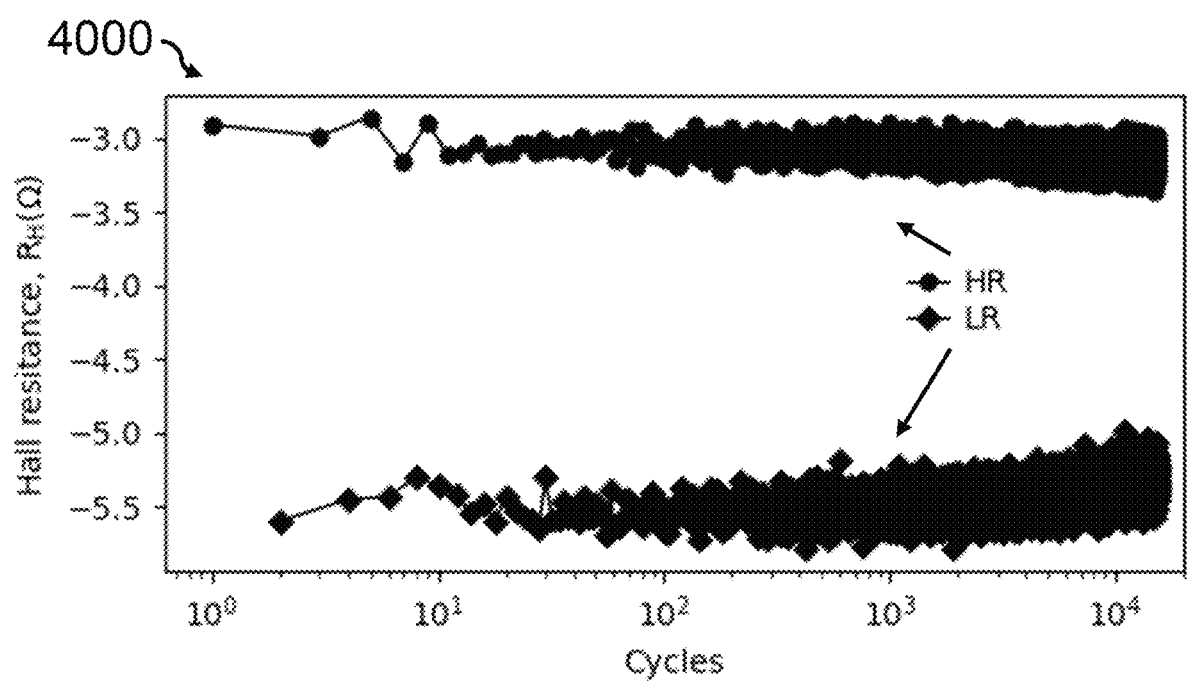
FIG. 40 shows anomalous Hall resistance $R_H$ as a function of a number of successive pulsed current cycles in accordance with an embodiment.

FIG. 40 shows a plot 4000 of anomalous Hall resistance $R_H$ as a function of a number of successive pulsed current cycles in accordance with an embodiment. Under 15000 repeated switching cycles, it is observed that $\Delta R_H$ was almost kept unchanged with increasing number of cycles. This indicates that the state of high resistance and the state of low resistance are stable. The repeated cycles implied the good endurance of switching behavior of $Co_{30}Pt_{70}$.

It is clear that in the present embodiment, the single layer of $Co_xPt_{100-x}$ can be applied in device structures as exemplified in relation to FIGS. 1B and 2B, where a single magnetic layer (in this case a single ferromagnetic layer) is employed and the "3m1" symmetry at the magnetic layer/substrate interface allows for the out-of-plane type "3m" torque, which can induce the field-free magnetization switching of the magnetic layer under the application of the in-plane electrical current.

As illustrated in the above embodiments, a skilled person will therefore appreciate that a method for switching a switchable magnetization direction of a spin-orbit torque device is also described. Particularly, in an embodiment, the spin-orbit torque device comprises an interfacing layer and a magnetic layer having a switchable magnetization direction, where an interface is formed between the interfacing layer and the magnetic layer, and that the interface includes a 3m1 crystallographic point group symmetry. The different forms of spin-orbit torque devices have been illustrated in relation to FIGS. 1A to 3. Further, as shown above, the method for switching a switchable magnetization direction of a spin-orbit torque device may comprise providing an electric current in the interfacing layer or the magnetic layer in an absence of a magnetic field, where the electric current is adapted to flow in a direction along a low-symmetry axis of the magnetic layer to generate a spin torque for switching the magnetization direction of the magnetic layer. As illustrated in relation to FIGS. 5A to 5C and FIG. 24, the low-symmetry axis includes an axis which resides in a crystal plane of the magnetic layer, where the crystal plane is not a mirror symmetry plane with respect to a crystalline structure of the magnetic layer. In an embodiment, the applied current has a magnitude greater than a critical switching current of the magnetic layer.

Although only certain embodiments of the present invention have been described in detail, many variations are possible in accordance with the appended claims. For example, features described in relation to one embodiment may be incorporated into one or more other embodiments and vice versa.

The invention claimed is:

1. A spin-orbit torque device comprising:
an interfacing layer comprising a spin source layer arranged to receive an electric current; and
a magnetic layer having a switchable magnetization direction,
wherein an interface is formed between the interfacing layer and the magnetic layer, the interface having a 3m1 crystallographic point group symmetry adapted to interact with the electric current to generate a spin torque for switching the switchable magnetization direction of the magnetic layer, and wherein the spin source layer comprises copper-platinum (CuPt) and the magnetic layer comprises cobalt-platinum (CoPt).

2. The spin-orbit torque device of claim 1, wherein the magnetization direction of the magnetic layer is perpendicular to a planar surface of the magnetic layer.

3. The spin-orbit torque device of claim 1, wherein a polarity and an amplitude of the spin torque is associated with a flow direction of the electric current with respect to a crystalline structure of the magnetic layer.

4. The spin-orbit torque device of claim 1, wherein the electric current is adapted to flow in a direction along a low-symmetry axis of the magnetic layer, the low-symmetry axis being an axis which resides in a crystal plane of the magnetic layer, wherein the crystal plane is not a mirror symmetry plane with respect to a crystalline structure of the magnetic layer.

5. The spin-orbit torque device of claim 1, wherein the spin-orbit torque device is arranged to provide a plurality of resistance states associated with a magnitude of the electric current.

6. The spin-orbit torque device of claim 1, wherein the spin-orbit torque device further comprises:
an insulating tunneling layer formed on the magnetic layer; and
a magnetic pinned layer formed on the insulating tunneling layer, the magnetic pinned layer having a fixed magnetization direction,
wherein the magnetization direction of the magnetic layer is switched by the spin torque to provide two different resistance states of the spin-orbit torque device.

7. The spin-orbit torque device of claim 1, wherein the magnetic layer comprises a magnetization region sandwiched between two domain walls, the interface is arranged to interact with the electric current to generate the spin torque for propagating the two domain walls in opposite directions along the magnetic layer to shrink or expand the magnetization region.

8. A spin-orbit torque device comprising:
an interfacing layer comprising a substrate layer; and
a magnetic layer having a switchable magnetization direction and is arranged to receive an electric current, the magnetic layer comprises a functionally graded magnetic layer having a composition gradient adapted to create a broken inversion symmetry to interact with the electric current to generate a damping-like torque in the magnetic layer,
wherein an interface is formed between the interfacing layer and the magnetic layer, the interface having a 3m1 crystallographic point group symmetry adapted to interact with the electric current to generate a spin torque in a presence of the damping-like torque for switching the magnetization direction of the magnetic layer.

9. The spin-orbit torque device of claim 8, wherein the substrate layer comprises (111)-oriented strontium titanate ($SrTiO_3$) and the magnetic layer comprises cobalt-platinum (CoPt).

10. The spin-orbit torque device of claim 8, wherein the magnetic layer comprises cobalt-platinum $Co_xPt_{100-x}$, where x is between 20 and 50.

11. The spin-orbit torque device of claim 10, wherein the magnetic layer comprises cobalt-platinum with a composition of $Co_{30}Pt_{70}$.

12. The spin-orbit torque device of claim 8, wherein the substrate layer comprises (111)-oriented magnesium oxide (MgO) and the magnetic layer comprises cobalt-platinum with a composition of $Co_{30}Pt_{70}$.

13. A method for fabricating a spin-orbit torque device, the method comprising:
providing an interfacing layer comprising a spin source layer arranged to receive an electric current; and forming a magnetic layer having a switchable magnetization direction on the interfacing layer, wherein an interface is formed between the interfacing layer and the magnetic layer, the interface having a 3m1 crystallographic point group symmetry adapted to interact with the electric current to generate a spin torque for switching the switchable magnetization direction of the magnetic layer, and wherein the spin source layer comprises copper-platinum (CuPt) and the magnetic layer comprises cobalt-platinum (CoPt).

14. The method of claim 13, wherein the magnetization direction of the magnetic layer is perpendicular to a planar surface of the magnetic layer.

15. The method of claim 13, further comprising:
forming an insulating tunneling layer on the magnetic layer; and
forming a magnetic pinned layer on the insulating tunneling layer, the magnetic pinned layer having a fixed magnetization direction,
wherein the magnetization direction of the magnetic layer is switched by the spin torque to provide two different resistance states of the spin-orbit torque device.

16. The method of claim 13, wherein the magnetic layer comprises a magnetization region sandwiched between two domain walls, the interface is arranged to interact with the electric current to generate the spin torque for propagating the two domain walls in opposite directions along the magnetic layer to shrink or expand the magnetization region.

* * * * *